US006090332A

United States Patent [19]
Marder et al.

[11] Patent Number: 6,090,332
[45] Date of Patent: Jul. 18, 2000

[54] PROCESS OF CHANGING THE REFRACTIVE INDEX OF A COMPOSITE CONTAINING A POLYMER AND A COMPOUND HAVING LARGE DIPOLE MOMENT AND POLARIZABILITY AND APPLICATIONS THEREOF

[75] Inventors: Seth R. Marder, Pasadena, Calif.; Nasser Peyghambarian; Bernard Kippelen, both of Tucson, Ariz.; Boris Volodin, Los Angeles, Calif.; Eric Hendrickx, Glabbeek, Belgium

[73] Assignee: California Institute of Technology, Pasadena, Calif.

[21] Appl. No.: 09/078,211

[22] Filed: May 13, 1998

Related U.S. Application Data
[60] Provisional application No. 60/046,734, May 16, 1997.

[51] Int. Cl.⁷ .................................................... B29C 35/00
[52] U.S. Cl. ................................................................ 264/435
[58] Field of Search ............................................. 264/435

[56] References Cited

U.S. PATENT DOCUMENTS

| | | | |
|---|---|---|---|
| 4,999,809 | 3/1991 | Schildkraut et al. | 365/106 |
| 5,064,264 | 11/1991 | Ducharme et al. | 385/130 |
| 5,115,336 | 5/1992 | Schildkraut et al. | 359/263 |
| 5,184,323 | 2/1993 | Schildkraut et al. | 365/124 |
| 5,501,821 | 3/1996 | Willand et al. | 252/582 |
| 5,552,915 | 9/1996 | Khoo | 359/94 |

OTHER PUBLICATIONS

B. Kippelen, et al., Infrared Photorefractive Polymers and Their Applications for Imaging, Science, vol. 279, Jan. 2, 1998, pp. 54–57.
D.D. Steele, et al. Transillumination Imaging Through Scattering Media by Use of Photorefractive Polymers, Optics Letters, vol. 23, No. 3, Feb. 1, 1998, pp. 153–155.
E. Hendrickx, et al., Phase Stability of Guest/Host Photorefractive Polymers Studied by Light Scattering Experiments, Appl. Phys. Lett. 71 (9), Sep. 1, 1997, pp. 1159–1161.
E. Hendrickx, et al., Synthesis and Characterization of Highly Efficient Photorefractive Polymer Composites with Long Phase Stability, Macromolecules, Reprinted from vol. 31, No. 3, (1998), pp. 734–739.
Sandalphon, et al., Optical Dispersion of the Refractive Index Modulation in Low $T_g$ Photorefractive Polymers, Appl. Phys. Lett 71 (7), Aug. 18, 1997, pp. 873–875.
K. Meerholz, et al., Stability Improvement of High–Performance Photorefractive Polymers Containing Eutectic Mixtures of Electro–optic Chromophores, Adv. Matter, (1997), 9, No. 13, pp. 1043–1046.
M. Liphardt, et al., High–Performance Photorefractive Polymers, Science, vol. 263, Jan. 21, 1994, pp. 367–369.
S.M. Silence, et al. Electric Field–Dependent Nonphotorefractive Gratings in a Nonlinear Photoconducting Polymer, Appl. Phys. Lett., vol. 64, No. 6, Feb. 7, 1994, pp. 712–714.
C.A. Walsh & W. E. Moerner, Two–Beam Coupling Measurements of Grating Phase in a Photorefractive Polymer, J. Opt. Soc. Am. B/vol. 9, No. 9, Sep., 1992, pp. 1642–1647.

K. Sutter and P. Günter, Photorefractive Gratings in the Organic Crystal 2–cyclooctylamino–5–nitropyridine Doped with 7,7,8,8–tetracyanoquinodimethane, J. Opt. Soc. Am, B/vol. 7, No. 12, Dec., 1990, pp. 2274–2278.
G.G. Malliaras, et al., The Influence of Disorder on the Space Charge Field Formation in Photorefractive Polymers, J. Phys. D:Appl. Phys. 29 (1996), pp. 2045–2048.
G.G. Malliaras, et al., Control of Charge Trapping in a Photorefractive Polymer, Appl. Phys. Lett. 66 (9), Feb. 27, 1995, pp. 1038–1040.
G.G. Malliaras, et al., Transient Behavior of Photorefractive Gratings in a Polymer, Appl. Phys. Lett. 67 (4), Jul. 24, 1995, pp. 455–457.
G.G. Malliaras, Holographic Time–of–Flight Measurements of the Hole–drift Mobility in a Photorefractive Polymer, Physical Review B, vol. 52, No. 20, Nov. 15, 1995–II, pp. R14 324–R14 327.
B.E. Jones, et al., Photoconductivity and Grating Response Time of a Photorefractive Polymer, J. Opt. Soc. Am. B/vol. 11, No. 6, Jun., 1994, pp. 1064–1072.
G.G. Malliaras, et al., Photorefractive Polymer Composite with net Gain and Subsecond Response at 633 nm, Appl. Phys. Lett. 65 (3), Jul. 18, 1994, pp. 262–264.
M. Orczyk, et al., Enhanced Photorefractive Performance in a Photorefractive Polymeric Composite, J. Appl. Phys. 76 (9), Nov. 1, 1994, pp. 4995–4998.
M. Orczyk, et al., Nonelectrooptic Nonlocal Photorefractive Effect in a Polymer Composite, Appl. Phys. Lett. vol. 67, No. 3, Jul. 17, 1995, pp. 311–313.
M. Orczyk, et al., Photorefractive Effect in Fullerene–Doped Polymer Composite, CLEO '93 (Thursday afternoon), pp. 518–519, (1993).
W.K. Chan, et al., Thermally Cross–Linkable Second Order Nonlinear Optical Polymers, __ pp. 432–433, (Undated).
Y.M. Chen, et al. Stable Second–Order Nonlinear Optical Epoxy–Based Polymer, Mol. Cryst. Liq. Cryst. Sci. Technol.—Sec. B, Nonlinear Optics, 1993, vol. 4, pp. 71–79.
M.C.J.M. Donckers, et al, Net Two–Beam Coupling in a Polymeric Photorefractive Material, Optics Letters, vol. 18, No. 13, Jul. 1, 1993, pp. 1044–1046.

(List continued on next page.)

*Primary Examiner*—Leo B. Tentoni
*Attorney, Agent, or Firm*—Limbach & Limbach LLP

[57] ABSTRACT

Fused ring bridge, ring locked dyes that form thermally stable photorfractive compositions. The fused ring bridge structures are π-conjugated bonds in benzene-, naphthalene- or anthracene-derived fused ring systems that connect donor and acceptor groups. The donor and acceptor groups contribute to a high molecular dipole moment and linear polarizability anisotropy. The polarization characteristics of the dye molecules are stabilized since the bonds in the fused ring bridge are not susceptible to rotation, reducing the opportunity for photoisomerization. The dyes are compatible with polymeric compositions, including thermoplastics. The dyes are electrically neutral but have charge transport, electronic and orientational properties such that upon illumination of a composition containing the dye, the dye facilitates refractive index modulation and a photorefractive effect that can be utilized advantageously in numerous applications such as in optical quality devices and biological imaging.

5 Claims, 20 Drawing Sheets

OTHER PUBLICATIONS

J.C. Scott, et al, Photoconduction and Photorefraction in Molecularly Doped Polymers, Synthetic Metals, 54 (1993) 9 No. 19, pp. 9–19.

A. Grunnet–Jepsen and C.L. Thompson, High Performance Photorefractive Polymer with Improved Stability, Appl. Phys. Lett. 70 (12) Mar. 24, 1997, pp. 1515–1517.

Y. Zhang, Monolithic Carbazole Oligomer Exhibiting Efficient Photorefractivity, Appl. Phys. Lett. 70 (22), Jun. 2, 1997, pp. 2949–2951.

T. Wada, et al., Novel Molecules for Photorefractive Application, Mol. Cryst. Liq. Cryst., 1996, vol. 280, pp. 71–78.

T. Aoyama, et al., Electro–Optic Effects in Mono and Di–Substituted Carbazoles, Nonlinear Optics, vol. 15, (1996) pp. 403–406.

T. Wada, et al., Multifunctional Chromophores for Monolithic Photorefractive Materials, Nonlinear Optics, vol. 15, (1996) pp. 103–110.

Y. Zhang, et al., A Novel Approach to the Synthesis of Conjugated Carbazole Trimers as Multifunctional Chromophores for Photorefractive Materials, Tetrahedron Letters, vol. 38, No. 10, (1997), pp. 1785–1788.

L. Wang, et al., Photorefractive Effect in Photoconductive Electro–optic Carbazole Trimer, Appl. Phys, Lett. 69 (6), Aug. 5, 1996, pp. 728–730.

Y. Zhang, et al., Photorefractive Polymers Containing a Single Multifunctional Chromophore, Chem. Commun., 1996, pp. 2325–2326.

T. Aoyama, et al., Xerographic and Electro–Optic Studies of a Photorefractive Polymer, Mol. Cryst Liq. Cryst. 1997, vol, 295, pp. 63–66.

P.M. Lundquist, et al, Holographic Digital Data Storage in a Photorefractive Polymer, Optics Letters, vol. 21, No. 12, Jun. 15, 1996, pp. 890–892.

Y. Zhang, et al., Molecular Design of Carbazole Polymers for Photorefractive Applications, Mol. Cryst. Liq. Cryst. 1997, vol. 295, pp. 51–54.

S. Ducharme, et al., Observation of the Photorefractive Effect in a Polymer, Phys. Review Letters, vol., 66, No. 14, Apr. 8, 1991, pp. 1846–1849.

J.J. Stankus, et al., Electric–field–switchable Strafified Bolume Holograms in Photorefractive Polymers, Optics Letters, vol. 19, No. 18, Sep. 15, 1994, pp. 1480–1482.

J. Schildkraut, Photoconducting Electro–optic Polymer Films, Appl. Phys. Lett. vol. 58, No, 4, Jan. 28, 1991, pp. 340–342.

R. Wortmann, et al., A Novel Sensitized Photochromic Organic Glass for Holographic Optical Storage, Appl. Phys. Lett. 69 (12), Sep. 16, 1996, pp. 1657–1659.

Y. Zhang, et al., Photorefractive Properties of a Thiapyrylium Dye Sensitized Polymer Composite: The Dynamics of Holographic Grating Formation and Erasure, Proc. SPIE 2285 (1994).

S.M. Silence, et al., Optical Trap Activation in a Photorefractive Polymer, Optics Letters, vol. 19, No. 22, Nov. 15, 1994, pp. 1822–1824.

W.E. Moerner and S.M. Silence, Polymeric Photorefractive Materials, Chem. Rev. 1994, 94, pp. 127–155.

Z. Peng, et al., Large Photorefractivity in an Exceptionally Thermostable Multifunctional Polyimide, J. Am. Chem. Soc. 1994, 116, pp. 6003–6004.

S.M. Silence, et al., Subsecond Grating Growth in a Photorefractive Polymer, Optics Letters, vol. 17, No. 16, Aug. 15, 1992, pp. 1107–1109.

S.M. Silence, et al., $C_{60}$ Sensitization of a Photorefractive Polymer, Appl. Phys. Lett. 61 (25), Dec. 21, 1992, pp. 2967–2969.

T. Kawakami and N. Sonoda, Photoinduced Refractive Index Change in a Photoconductive Electro–optic Polymer, Appl. Phys. Lett. 62, 2167 (1993).

K. Sutter, et al., Photorefractive Properties of 4'–nitrobenzylidene–3–acetamino–4–methoxyaniline, Optics Letters, vol. 18, No. 10, May 15, 1993, pp. 778–780.

B. Kippelen, et al., Photorefractivity in a Functional Side–Chain Polymer, Physical Review B, vol. 48, No. 15, Oct. 15, 1993–I, pp. 10710–10718.

M.J. Sansone, et al., Observation of the Photorefractive Effect in a Dialkylaminonitrostilbene Copolymer, Optics Letters, vol. 18, No. 17, Sep. 1, 1993, pp. 1400–1402.

B. Kippelen, et al., New Highly Efficient Photorefractive Polymer Composite for Optical–Storage and Image–Processing Applications, IEE, No. 19931190, Aug. 9, 1993.

Luping Yu, et al., Photorefractive Polymers. 2. Structure Design and Property Characterization, Macromolecules, 26, 1993, pp. 2216–2221.

S.M. Silence, et al., Poly(silane)–based High–Mobility Photorefractive Polymers, J. Opt. Soc. Am. B/vol. 10, No. 12, Dec. 1993, pp. 2306–2312.

Y.M. Chen, et al., New Photorefractive Polymer Based on Multifunctional Polyurethane, Appl. Phys. Lett. 64 (10), Mar. 7, 1994, pp. 1195–1197.

Kenji Yokoyama, et al., Photorefractive Effect in a Polymer Molecularly Doped with Low–Molecular–Weight Compounds, Jpn. J. Appl. Phys., vol. 33 (1994), pp. 1029–1033.

S.M. Silence, et al., Optical Properties of Poly (N–vinylcarbazole)–based Guest–Host Photorefractive Polymer Systems, Applied Optics, vol. 33, No. 11, Apr. 10, 1994, pp. 2218–2222.

Y. Zhang, et al., Thiapyrylium Dye Sensitization of Photorefractivity in a Polymer Composite, Appl. Phys. Lett. vol. 64, No. 15, Apr. 11, 1994, pp. 1908–1910.

Luping Yu, et al., Conjugated Photorefractive Polymer, Appl. Phys. Lett. 64(19), May 9, 1994, pp. 2489–2491.

Technical Digest Series, vol. 8, Technical Digest Series vol. 9, IQEC '94 (May 10, 1994), pp 64–65.

H. J. Bolink, et al., The Role of Absorbing Nonlinear Optical Chromophores in Photorefractive Polymers, Adv. Mater. 6 No. 7.8, 1994, pp. 574–577.

W.E. Moerner, et al., Photorefractive Polymers, Annu. Rev. Mater. Sci. 1997, 27, pp. 585–623.

F. Würthner, et al., Merocyanine Dyes in the Cyanine Limit: A New Class of Chromophores for Photorefractive Materials, Angew. Chem. Int. Ed. Engl. 1997, 36, No. 24, pp. 2765–2768.

A. Grunnet–Jepsen, et al., Optical Limiting in a Photorefractive Polymer, Mat. Res. Soc. Symp. Proc., vol. 479, 1997, pp. 199–207.

A. Grunnet–Jepsen & C.L. Thompson, Amplified Scattering in a High–gain Photorefractive Polymer, J. Opt. Soc. Am. B, vol. 15, No. 2, Feb. 1998, pp. 901–904.

A. Grunnet–Jepson, et al., Measurement of the Spatial Phase Shift in High–Gain Photorefractive Materials, Optics Letters, vol. 22, No. 12, Jun. 15, 1997, pp. 874–876.

A. Grunnet–Jepsen, et al., High Performance Photorefractive Polymer with Improved Stability, Appl. Phys. Lett. 70(12), Mar. 24, 1997, pp. 1515–1517.

A. Grunnet–Jepsen, et al., Spontaneous Oscillation & Self–Pumped Phase Conjugation in a Photorefractive Polymer Optical Amplifier, Science, 277, Jul. 25, 1997, pp. 549–552.

A. Grunnet–Jepsen, et al., Gain Enhancement by Moving Gratings in a Photorefractive Polymer, Optics Communications, 145, Jan. 1, 1998, pp. 145–149.

A. Grunnet–Jepsen, et al., Systematics of Two–Wave Mixing in a Photorefractive Polymer, J. Opt. Soc. Am. B. vol. 15, No. 2, Feb. 1998, pp. 905–913.

L. Mager, et al., High Net Gain at 514 nm in a Photorefractive Polymer Doped with a Chalcone Derivative, Appl. Phys. Lett. 71 (16), Oct. 20, 1997, pp. 2248–2250.

B. Darracq, et al., Stable Photorefractive Memory Effect in Sol–Gel Materials, Appl. Phys. Lett. 70 (3), Jan. 20, 1997, pp. 292–294.

N. Cheng, et al., Thermal Fixing of Refractive Gratings in a Photorefractive Polymer, Appl. Phys. Lett. 71 (13), Sep. 29, 1997, pp. 1828–1830.

Luping Yu, et al., Detailed Studies on a New Conjugated Photorefractive Polymer, J. Phys. Chem. vol. 99, No. 9, 1995, pp. 2797–2802.

C. Zhao, et al., Photorefractive Polymer with Side–Chain Second Order Nonlinear Optical & Charge–Transporting Groups, Chem. Mater. 1995, 7, pp. 1237–1242.

Lian Li, et al., Photorefractive Effect in a Conjugated Polymer Base Material, Optics Communications 125 (1996), pp. 257–261.

R. Wortmann, et al., Design of Optimized Photorefractive Polymers: A Novel Class of Chromophores, J. Chem. Phys, 105, (23), Dec. 15, 1996, pp. 10637–10647.

P.M. Lundquist, et al., Organic Glasses: A New Class of Photorefractive Materials, Science, vol. 274, Nov. 15, 1996, pp. 1182–1185.

L. Wang, et al., Photorefractive Effect in a Photoconductive Electro–Optic Carbazole Trimer, Appl. Phys. Lett. 69, (6), Aug. 5, 1996, pp. 728–730.

Y. Zhang, et al., Photorefractive Composite Materials with Bi–functional Charge Transporting Second–order Nonlinear Optical Chromophores, J. Appl. Phys. 79(12) Jun. 15, 1996, pp. 8920–8929.

Y. Zhang, et al., Bifunctional Chromophore for Photorefractive Applications, Appl. Phys. Lett. 66 (3), Jan. 16, 1995, pp. 256–258.

A. Grunnet–Jepsen, et al., Spontaneous Oscillation & Self–Pumped Phase Conjugation in a Photorefractive Polymer Optical Amplifier, Science, vol. 277, Jul. 25, 1997, pp. 549–552.

B. Kippelen, et al., Chromophore Design for Photorefractive Applications, J. Am. Chem. Soc. 1997, 119, pp. 4559–4560.

W.E. Moerner, et al., Orientationally Enhanced Photorefractive Effect in Polymers, J. Opt. Soc. Am. B/vol. 11, No. 2, Feb. 1994, pp. 320–330.

K. Meerholz, et al., A Photorefractive Polymer with High Optical Gain & Diffraction Efficiency Near 100%, Nature vol. 371, Oct. 6, 1994, pp. 497–500.

F. Chaput, et al., New Nonlinear Sol–Gel Films Exhibiting Photorefractivity, Chem. Mater. 1996, 8, pp. 312–314.

R. Burzynski, et al., Novel Optical Composites: Second–Order Nonlinear Optical and Polymeric Photorefractive Materials for Optical Information Storage & Processing Applications, Opt. Eng. 35(2), Feb. 1996, pp. 443–451.

A.M. Cox, et al., Crystallization–Resistant Photorefractive Polymer Composite with High Diffraction Efficiency & Reproducibility, Appl. Phys. Lett. 68 (20), May 13, 1996, pp. 2801–2803.

G.G. Malliaras, et al., Photorefractive Polymer Composite With Net Gain & Subsecond Response at 633 nm, Appl. Phys. Lett. vol. 65, No. 3, Jul. 18, 1994, pp. 262–264.

M. E. Orczyk, et al., Enhanced Photorefractive Performance in a Photorefractive Polymeric Composite, J. Appl. Phys. 76 (9), Nov. 1, 1994, pp. 4995–4998.

D. Kokron, et al., Launching of Guided Waves in a Photorefractive Polymer by Two–Beam Coupling, Optics Letters, vol. 20, No. 22, Nov. 15, 1995, pp. 2297–2299.

Y. Zhang, et al., Photorefractive Polymers and Composites, Adv. Mater. 1996, 8, No. 2, pp. 111–125.

S.M. Silence, et al., Photorefractive Polymers Based on Dual–Function Dopants, J. Phys. Chem. 1995, 99, pp. 4096–4105.

S.M. Silence, et al., Quasinodestructive Readout in a Photorefractive Polymer, Phys. Rev. Letters, vol. 73, No. 15, Oct. 10, 1994, pp. 2047–2050.

K. Yokoyama, et al., Photorefractive Effect in a Polymer Molecularly Doped with Low–Molecular–Weight Compounds, Jpn. J. Appl. Phys., vol. 33 (1994), pp. 1029–1033.

K. Yokoyama, et al., Large Photorefractive Effect in a Thermally Decomposed Polymer Compared with that in Molecularly Doped Systems, Appl. Phys. Lett. 65 (2), Jul. 11, 1994, pp. 132–134.

O. Zobel, et al., Polysiloxane Based Photorefractive with High Optical Gain and Diffraction Efficiency (Undated).

C. Poga, et al., Polysiloxane–Based Photorefractive Polymers for digital Holographic Data Storage, Appl. Phys. Lett. 69 (8), Aug. 19, 1996, pp. 1047–1049.

C. Poga, et al., Photorefractivity in New Organic Polymeric Materials, SPIE, 1995.

B.L. Volodin, et al., A Polymeric Optical Pattern–Recognition System for Security Verification, Nature, vol. 383, Sep. 5, 1996, pp. 58–60.

G.G. Malliaras, et al., Rapid Communication: The Influence of Disorder on the Space Charge Field Formation in Photorefractive Polymers, J. Phys. D: Appl. Phys. 29 (1996), pp. 2045–2048.

L. Yu, et al., Detailed Studies on a New Conjugated Photoreactive Polymer, J. Phys. Chem, 1995, 99, pp. 2797–2802.

K. Meerholz, Amorphous Plastics Pave the Way to Widespread Holographic Applications, Angew. Chem. Int. Ed. Engl. 1997, 36, No. 9, pp. 945–948.

E. Hendrickx, et al., High–Gain Photorefractive Polymers, SPIE, vol. 3281, pp. 268–276 (Undated).

H. J. Bolink, et al., Photorefractive Polymers with Low Intrinsic Trap Density, SPIE, Jul. 1997.

R. Burzynski, et al., Photorefractive Composites with High–Band–Gap Second–Order Nonlinear Optical Chromophores, J. Appl. Phys. 78 (12), Dec. 15, 1995, pp. 6903–6907.

R₁ = Me, R₂ = phenyl, 67%

R₁ = R₂ = Hexyl, 62%

R₁ = R₂ = Me, 62%

R₁ = R₂ = Hexyl, 62%

R₁= H, R₂= CH₃,
R₁= C₄H₉, R₂= CH₃,
R₁= H, R₂= C₆H₁₃,

R₁= Me, R₂= phenyl
R₁= R₂= C₆H₁₃

R₁= R₂= C₄H₉

-215+/-20

-50+/-10

-120+/-10

-1830+/-200

-950+/-160

PROCESS OF CHANGING THE REFRACTIVE INDEX OF A COMPOSITE CONTAINING A POLYMER AND A COMPOUND HAVING LARGE DIPOLE MOMENT AND POLARIZABILITY AND APPLICATIONS THEREOF

CROSS REFERENCE TO RELATED APPLICATIONS

This application claims the benefit of U.S. Provisional Patent Application No. 60/046,734, entitled "Photorefractive Materials with Enhanced Performance in Near Infrared and Visible Regions of the Electromagnetic Spectrum" filed May 16, 1997, the disclosure of which is incorporated herein by reference.

ORIGIN OF INVENTION

The invention described herein was made in the performance of work under a NASA contract and is subject to the provisions of Public Law 96-517 (35 U.S.C. 202) in which the Contractor has elected to retain title. The invention was also partially supported by the United States Government through the Office of Naval Research (ONR Grant Nos. N00014-95-1-1319), Air Force Office of Scientific Research (AFSOR Grant No. AFS5 F49620-97-1-0200) and the National Science Foundation (NSF Grant No. CHE 94-08701, Amendment 001).

BACKGROUND OF THE INVENTION

1. Field of the Invention

The invention relates to fused ring bridge, ring-locked molecules featuring various donor and acceptor groups or donor- and acceptor-like heterocycles and a stable benzene-, naphthalene- or anthracene-derived polyene bridge, i.e., fused ring bridge, ring-locked compounds, as exemplified below, and methods of their use.

2. Description of the Related Art

The basic elements of photorefractivity include photosensitivity, photoconductivity and electrooptical activity. As an example, the photorefractive (PR) effect enables the recording of optical information in three-dimensional solids through the optical generation of an internal space-charge field and refractive index changes in the solid, as described in P. Günter and J. -P. Huignard, *Photorefractive Materials and Their Applications*, Vol. 1 and 2 (Springer, Berlin, 1988 and 1989), incorporated herein by reference. Due to high optical sensitivity and the ability to erase and rewrite information optically in real-time, photorefractive materials are expected to play a major role in photonic technologies. One special aspect of the PR recording mechanism is the non-zero phase shift that can exist between the optical intensity pattern and the stored phase replica. This so-called nonlocal response can be used to transfer energy between two interacting beams. For some applications, such as image amplification, a strong energy transfer is desired, as described in A. Grunnet-Jepsen, C. L. Thomson, W. E. Moerner, *Science* 277, 549 (1997). However, for other applications based on the recording and retrieval of stored holograms, the important material parameter is the dynamic range or index modulation $\Delta\eta$, and one of the current challenges is to increase it.

The photorefractive effect in inorganic crystals has been studied. The mechanism of the refractive index modulation by the internal space-charge field was based on the linear electro-optic effect (i.e., the Pockels effect), as described in A. Ashkin, G. D. Boyd, J. M. Dziedic, R. G. Smith, A. A. Ballmann, and K. Nassau, *Appl. Phys. Lett.* 9, 72 (1966). More recently, polymers have emerged as new photorefractive materials as described in S. Ducharme, J. C. Scott, R. J. Twieg, and W. E. Moerner, *Phys. Rev. Lett.* 66, 1846 (1991), W. E. Moemner and S. M. Silence, *Chem. Rev.* 94, 127 (1994), Y. Zhang, R. Burzynski, S. Ghosal and M. K. Casstevens, *Adv. Mater.* 8, 111 (1996), B. Kippelen, K. Meerholz, and N. Peyghambarian in *Nonlinear Optics of Organic Molecules and Polymers*, edited by H. S. Nalwa and S. Miyata (CRC, Boca Raton, 1997), p. 465, all of which are incorporated herein by reference.

Active organic polymers are emerging as key materials for advanced information and telecommunication technology. Owing to their outstanding performance, structural flexibility, and lightweight, polymers are expected to play a major role in optical technology, especially when large-scale manufacturing of devices at low cost is crucial. Other important characteristics that may be desirable depending on the application include sufficiently long shelf life, optical quality, thermal stability and processing ease. Multifunctional nonlinear optical polymers and molecular assemblies are intensively investigated for electrooptic and photorefractive applications.

In addition, with the rapid improvement of the performance of guest/host PR polymer composites, as described in M. C. J. M. Donckers, S. M. Silence, C. A. Walsh, F. Hache, D. M. Burland, and W. E. Moerner, *Opt. Lett.* 18, 1044 (1993), M. Liphard, A. Goonesekera, B. E. Jones, S. Ducharme, J. M. Takacs, and L. Zhang, *Science* 263, 367 (1994) and the report of near 100% diffraction efficiency in 105 μm thick samples containing a photoconducting sensitizer by K. Meerholz, B. L. Volodin, Sandalphon, B. Kippelen, and N. Peyghambarian, *Nature* 371, 497 (1994), it became apparent that the Pockels effect alone could not account for the origin of the high refractive index changes. A detailed explanation of this effect was provided with the orientational enhancement model proposed by W. E. Moerner, S. M. Silence, F. Hache, and G. C. Bjorklund, *J. Opt. Soc. Am. B* 11, 320 (1994) in which both the birefringence induced by the orientation of the dopant molecules [M. G. Kuzyk, J. E. Sohn, C. W. Dirk, *J. Opt. Soc. Am. B* 7, 842 (1990), J. W. Wu, *J. Opt. Soc. Am. B* 8, 142 (1991)] and the molecules electrooptic properties were reported to contribute to the refractive index modulation changes.

Thus, on a molecular level, according to the oriented gas model [D. J. Williams in *Nonlinear Optical Properties of Organic Molecules and Crystals; Vol.* 1, edited by D. S. Chemla and J. Zyss (Academic Press, Inc., Orlando, 1987), K. D. Singer, M. G. Kuzyk, and J. E. Sohn, *J. Opt. Soc. Am. B* 4, 968 (1987), molecular figure of merit F may be defined for the optimization of the PR effect:

$$F = A(T)\mu^2 \Delta\alpha + \mu\beta \tag{1}$$

where $\Delta\alpha$ is the polarizability anisotropy of the chromophore, $\mu$ is its dipole moment, $\beta$ is its first hyperpolarizability, and $A(T) = 2/(9\ kT)$ is a scaling factor (kT is thermal energy).

Early PR polymeric compositions were based on dopant molecules (i.e., chromophores) such as 3-fluoro-4-N,N-diethylamino-nitrostyrene (FDEANST) and 2,5-dimethyl-4-p-nitrophenylazoanisole (DMNPAA) because of these dopants' electro-optic properties. More recent PR polymeric compositions, described in P. M. Lundquist, R. Wortmann, C. Geletneky, R. J. Twieg, M. Jurich, V. Y. Lee, C. R. Moylan, D. M. Burland, *Science* 274, 1182 (1996) (In this reference, the value for refractive index η reported in the Table 2 for a sample with composition 2BNCM:PM-MA:TNF 90:10:0.3 wt. % for which four-wave mixing results are presented in FIG. 1, should read $1.5 \times 10^{-3}$ instead of $10 \times 10^{-3}$) were based on dopants such as N-2-butyl-2,6-dimethyl-4H-pyridone-4-ylidenecyanomethylacetate (2BNCM) with large polarizability anisotropy, improving the dynamic range by a factor of 1.5 over the best previous PR polymeric compositions doped with DMNPAA.

Using model calculations and bond order alternation theory, we have shown recently in B. Kippelen, F. Meyers, N. Peyghambarian, and S. R. Marder, *J. Am. Chem. Soc.* 119, 4559 (1997) that the orientational birefringence contribution is enhanced for chromophores that are polarized beyond the cyanine limit, i.e., for chromophores that feature both high $\Delta\alpha$ and high $\mu$.

In order to explore this molecular design rationale, the present invention focuses on linear molecules such as polyenes, as opposed to chromophores that contain benzene rings in the bridge. These polyenes exhibit a considerable charge transfer that is confined along the quasi one-dimensional π-conjugated bridge providing a large $\Delta\alpha$ and can lead to an important charge separation in the ground-state that provides large molecular dipole moment and polarizability anisotropy, as predicted in B. Kippelen, F. Meyers, N. Peyghambarian, and S. R. Marder, *J. Am. Chem. Soc.* 119, 4559 (1997). Furthermore, given the known thermal instability of donor-acceptor substituted polymethine bridged chromophore dyes (where the polymethine bridge is formed from CH groups joined by single or double bonds) at elevated temperatures, described below, we discovered the importance of the structure of fused ring bridge, ring-locked dyes according to the invention described herein and exemplified below where the donors and the acceptors induce a large molecular dipole moment and also increase polarizability anisotropy.

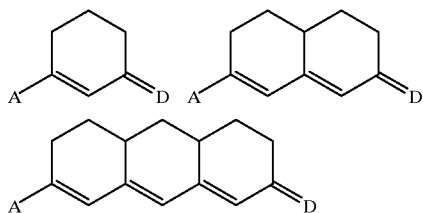

Preliminary work in synthesis of charged fused ring bridge, ring-locked ionic cyanine-like compounds was reported in Y. L. Slominskii, L. M. Shulezho, *Ukr. Khim. Zhu.*, 40, 625–629 (1974); F. S. Babichev, N. N. Romanov, Y. L. Slominskii, A. I. Tolmachev, *Ukr. Khim. Zhu.*, 40, 1165–1170 (1975); Y. L. Slominskii, A. V. Kuleshin, A. I. Tolmachev, *Zhu. Org. Khim.*, 6, 1936–1940 (1970); Y. L. Slominskii, A. L. Skul'bidenko, A. I. Tolmachev *Ukr. Khim. Zhu.*, 40, 1166–1173 (1974), which are incorporated herein by reference. Work on the synthesis of anthracene-like fused ring bridge, ring-locked cyanines has also been reported by Y. L. Slominskii, A. L. Skul'bidenko, A. I. Tolmachev, *Zhu. Org. Khim.*, 11, 392–397 (1975); G. Heilig, W. Lüttke *Chem. Ber.*, 119, 3102–3108 (1986); G. Heilig, W. Lüttke, *Chem. Ber.*, 120, 1863–1866 (1987); G. Heilig, W. Lüttke, *Chem. Ber.*, 121, 407–410 (1988), all of which are incorporated herein by reference.

In contrast, this invention teaches how to synthesize fused ring bridge, ring-locked dyes of the type shown in the General Structures 1, 2 and 3 below, by adapting the chemistry used to synthesize unbridged compounds. Exemplary synthetic routes are described in L. G. S. Brooker (1939), U.S. Pat. No. 2,161,331; L. G. S. Brooker (1939), U.S. Pat. No. 2,170,804; L. G. S. Brooker (1939), U.S. Pat. No. 2,170,807; L. G. S. Brooker (1940), U.S. Pat. No. 2,185,182; L. G. S. Brooker, F. L. White, (1941) U.S. Pat. No. 2,231,659; L. G. S. Brooker, F. L. White (1944), U.S. Pat. No. 2,341,357; L. G. S. Brooker, H. W. J. Cressman (1946), U.S. Pat. No. 2,409,189; L. G. S. Brooker, G. H. Keyes (1948), U.S. Pat. No. 2,441,530; L. G. S. Brooker, G. H. Keyes (1950), U.S. Pat. No. 2,493,748; L. G. S. Brooker, F. L. White (1950), U.S. Pat. No. 2,494,031; L. G. S. Brooker, et al., *J. Am. Chem. Soc.* 73, 5332–5350 (1951); and L. G. S. Brooker, et al., *J. Am. Chem. Soc.* 73, 5326–5332 (1951) which are incorporated herein by reference.

The present invention also teaches how the linear polarizability anisotropy and large dipole moment of chromophores according to the invention are particularly useful components in photorefractive compositions operating in the electromagnetic spectrum between 500 and 1600 nm.

Previous work reports on the theory and synthesis of dyes and their second-order nonlinear optical properties, including C. B. Gorman, S. R. Marder, *Proc. Natl. Acad. Sci., USA* 90, 11297–11301 (1993); H. Ikeda, Y. Kawabe, T. Sakai, K. Kawasaki, *Chem. Lett.*, 1803–1806 (1989); S. R. Marder, D. N. Beratan, L. -T. Cheng, *Science* 252, 103–106 (1991); F. Meyers, S. R. Marder, B. M. Pierce, J. L. Brédas, *J. Am. Chem. Soc.* 116, 10703 (1994), each of which is incorporated herein by reference. However, in contrast to this previous work, this invention focuses on the photorefractive efficacy of fused ring bridge, ring-locked compounds, whereas the previous papers described dyes having a simple polymethine bridge. More importantly, the effect that leads to the large photorefractive effect in chromophores according to the present invention is not based upon the chromophores' first hyperpolarizability, but rather on a strategy which we have implemented successfully. As described herein, we have been able to optimize an orientational contribution to the refractive index based upon optimizing the molecular polarizability anisotropy and molecular dipole moment.

SUMMARY OF THE INVENTION

Many of the chromophores useful according to the invention can be described by a structural motif where fused ring bridge, ring-locked structures of the form described herein are substituted with donors and acceptors (wherein either the donor or the acceptor or both have a dipole moment greater than 2 Debye) to induce a large molecular dipole moment, and also to increase the molecular polarizability anisotropy. It is a further feature of the invention that the fused ring bridge, ring-locked structure imparts a unusually high thermal stability to the molecules and that also prevents rotation around bonds (e.g., photoisomerization) in the bridge to prohibit changing of the dipole moment or polarizability anisotropy due to the rotation.

Chromophores according to the invention are electrically neutral molecules with desirable orientational and transport properties such that upon illumination of a composition containing the chromophore, the chromophore facilitates charge transport and refractive index modulation.

We have found that molecules which take these forms can be designed to operate in methods wherein the chromophores, alone or as part of a polymeric composition, upon application of a field (either externally applied or internally created in the presence of light) induce or change the angular distribution of the chromophores, resulting in a change in the composition's refractive index. In particular, chromophores in this invention can be used, even at relatively high loadings, to impart photorefractivity (e.g., to a polymeric composition) without adversely affecting other important properties, such as thermoplasticity or optical transparency. These compositions can be particularly advantageous for fabricating thermally stable, optical quality devices, e.g., by injection molding techniques, since heating of the composition to melt the chromophore followed by quenching to stabilize the chromophore in solution can be avoided. Phase separations observed with other chromophores can be avoided. Thus, photorefractive compositions according to the invention have great utility in a variety of applications, including optical recording and imaging of biological tissues.

BRIEF DESCRIPTION OF THE DRAWINGS

The invention will be better understood by reference to the following drawings, in which.

DETAILED DESCRIPTION OF THE PREFERRED EMBODIMENTS

Figure 1:
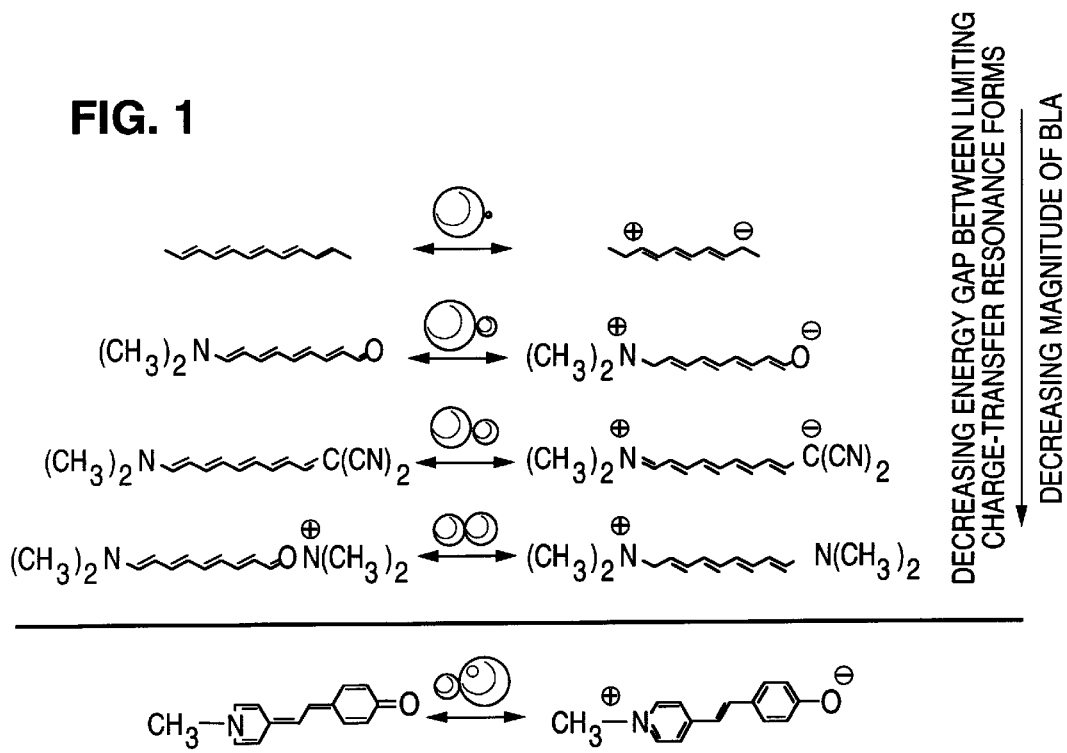
FIGS. 1a–1e schematically illustrate the effect of donor and acceptor strength and polyene bridge structure on bond length alternation in prior art molecules and those according to the invention as exemplified by the contribution of the two limiting resonance forms (electrically neutral and charge separated forms) to the ground-state structure of the molecule.

To ensure a complete understanding of the invention, the following definitions are provided:

By the term "acceptor", it is meant an atom or group of atoms with a high electron affinity that can be bonded to a $\pi$ (pi)-conjugated bridge. Exemplary acceptors, in order of increasing strength, are:

$C(O)NR_2 < C(O)NHR < C(O)NH_2 < C(O)OR < C(O)OH < C(O)R < C(O)H < CN < S(O_2)R < NO_2$

Other acceptors that have accepting strength greater than C(O)R include:

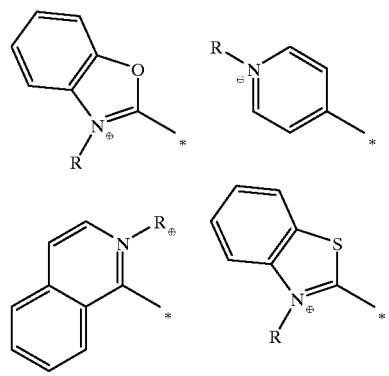

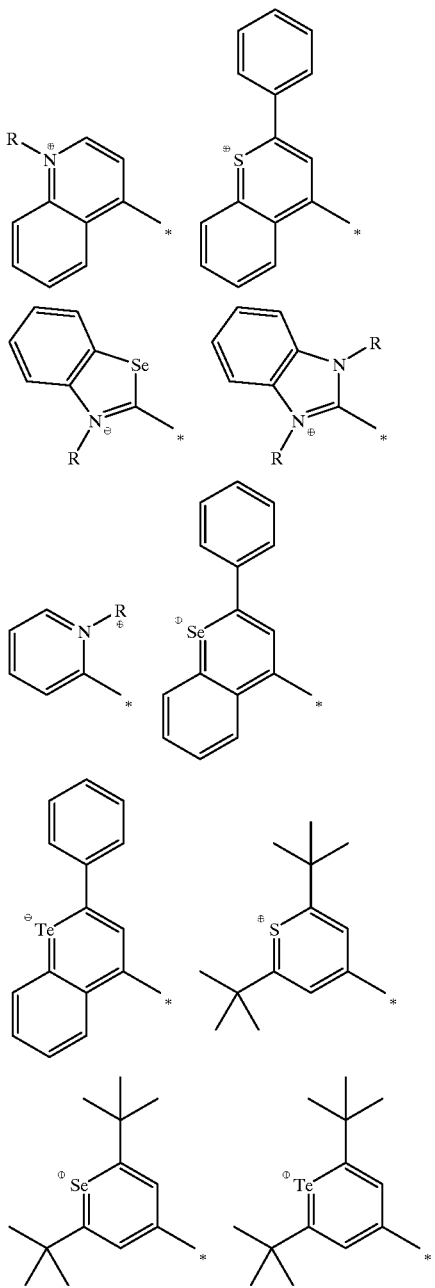

Where R is as defined below as for $R_a$, and X(O) indicates that the element oxygen is double bonded to the element X and * indicates the point of attachment to the π-conjugated bridge.

A more complete description of what is meant by electron donors or donating groups and electron acceptors or electron accepting groups can be found in J. March, *Advanced Organic Chemistry: Reactions, Mechanisms and Structure, Fourth edition*, Wiley-Interscience, New York, 1992, Chapter 9, which is incorporated herein by reference.

By the phrase "aromatic group", it is meant a carbocyclic group that contains 4n+2 π electrons where n is an integer.

By the term "birefringence", it is meant that a material exhibits at least two distinct indices of refraction.

By the term "bridge", it is meant that a molecular fragment that connects two or more chemical groups.

The term "chromophore" is used herein to be synonymous to dye, i.e., a chromophore is a molecule or aggregate of molecules that can absorb electromagnetic radiation or be polarized by the field associated with the electromagnetic spectrum.

By the phrase "cyclic voltammetry (CV)", it is meant a process in which the potential of an electrode is varied relative to a well-characterized oxidation-reduction couple and the current flow between said electrode and a counter electrode is measured. A plot is usually made of the current on the y axis versus potential on the x axis. A more complete description of CV can be found in A. J. Bard and L. R. Faulkner, *Electrocheinical Methods*, Wiley-Interscience, New York, 1980, Chapter 6, which is incorporated herein by reference.

By the phrase "dipole moment", it is meant the product of the charge separation in molecule times the distance over which the charge is separated.

By the term "donor", it is meant an atom or group of atoms with a low ionization potential that can be bonded to a π (pi)-conjugated bridge. Exemplary donors, in order of increasing strength, are:

I<Br<Cl<F<OC(O)R<SH<OH<SR<OR<NHC(O)R<$NH_2$<NHR <$NR_2$<$S^-$<$O^-$

Other donors that have donating strength greater than SR include:

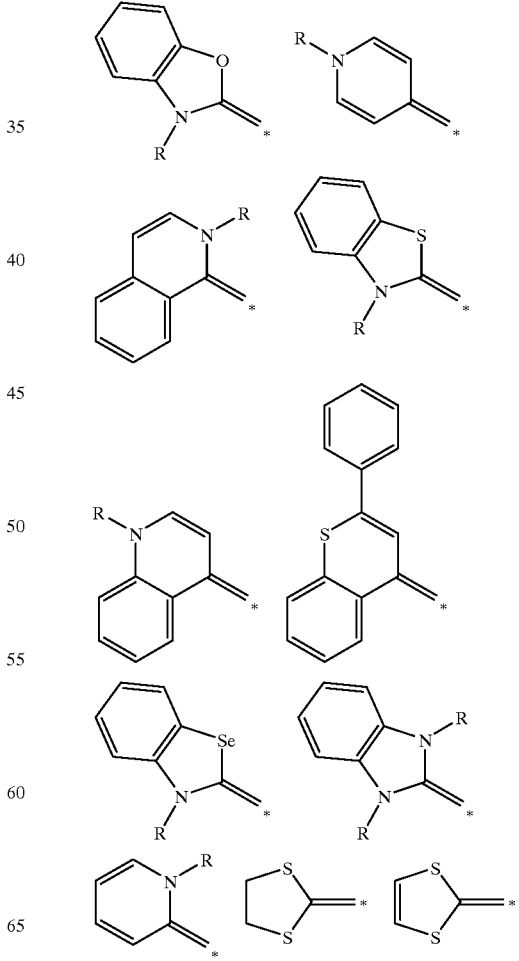

-continued

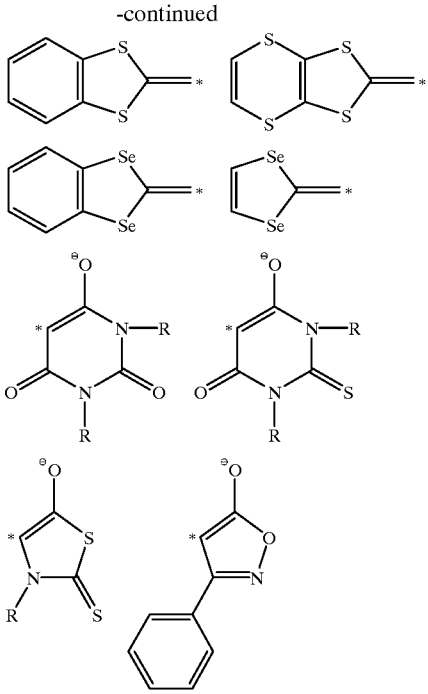

By the phrase "electro-optic activity, it is meant the change in optical properties of a material in response to a an electric field.

By the phrase "extinction coefficient", it is meant the absorbance of a solution containing a dye divided by the product of the pathlength times the concentration in moles of dye molecules per liter of solution (or molarity, M).

By the phrase "fused ring bridge, ring-locked structure", it is meant the benzene-, naphthalene- or anthracene-based structures shown below wherein polymethine bonds join a donor group D and an acceptor group A and wherein rotation about atoms bonded together is prevented. Rotation is considered to be prevented if the dipole moment of the acceptor group adds vectorially in substantially the same direction as the dipole moment of the donor group or the charge transfer vector. In this context, "substantially in the same direction" means that the angle between the vectorial sum of the dipole moments of the donor and acceptor and the vector representing the molecular dipole moment is within 0±60 degrees and also that the vectorial sum of the dipole moments of the donor and the acceptor is within 0±60 degrees of the charge transfer vector. More preferably, these angles are within 0±20 degrees; even smaller angles are most preferred. Under these conditions, the bonds in the fused ring bridge are considered to be "ring-locked". Exemplary structures include

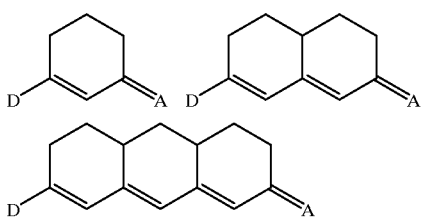

By the phrase "glass transition temperature", it is meant the temperature above which a glassy polymer becomes rubbery. The glass transition temperature, $T_g$, is associated with a significantly higher degree of freedom for motion of polymer chains. A more complete description of glass transition temperature can be found in G. Odian, *Principles of Polymerization, Second Edition*, John Wiley and Son, New York, 1981, which is incorporated herein by reference.

By the phrase "ground state polarization", it is meant the fractional amount of charge transferred from a donor group to an acceptor group in the ground state of a molecule.

By the phrase "heteroaromatic group", it is meant a cyclic group of atoms, with at least one atom within the ring being an element other than carbon, that contains 4n+2 π-electrons where n is an integer. A more complete description of aromaticity and heteroaromaticity can be found in J. March, *Advanced Organic Chemistry: Reactions, Mechanisms and Structure, Fourth edition*, Wiley-Interscience, New York, 1992, Chapter 2.

By the term "hologram", it is meant a refractive modulation recorded in a material by the interference pattern of an optical wave containing the phase and amplitude modulation information of an object with a reference optical wave.

By the term "index of refraction", it is meant the ratio of the speed of light in vacuum to the speed of light in a medium, such as a gas, liquid or solid.

By the phrase "infrared wavelengths", it is meant electromagnetic radiation having a wavelength longer than that that can be perceived by the human eye.

By the phrase "molecular figure of merit", it is meant a formula containing several variables that can be utilized to evaluate the overall performance of a material for a particular application.

By the phrase "near infrared", it is meant the region of the electromagnetic spectrum where light has a wavelength of 700–2500 nm.

By the term "photoconductivity", it is meant a process by which the conductivity of a material changes from that of an insulator wherein the conductivity σ changes from $\sigma<10^{-14}$ $ohm^{-1} cm^{-1}$ to $\sigma>10^{-14} ohm^{-1} cm^{-1}$ upon exposure to light.

By the term "photoisomerization", it is meant the change in the geometrical orientation of bond in a molecule as a result of the interaction of the molecule with light (e.g., visible or near infrared).

By the term "photorefractivity", it is meant an effect based on both photoconducting and electro-optic properties of a material that can lead to high refractive index variations upon illumination by low-power lasers. Two laser beams intersecting in a photorefractive material create an interference pattern with a strongly heterogeneous distribution of light intensity. Excess charges generated through optical absorption in the high intensity regions migrate to the regions of low intensity, leading to charge separation and the build-up of an internal electric field. Because the material is electro-optic, the internal electric field changes the refractive index of the material. As a result, the initial light distribution is optically encrypted in the form of a refractive index pattern in the material. Due to trapping of charge carriers, the internal space-charge field and the corresponding refractive index grating have a lifetime ranging from nanoseconds to several years depending on the composition of the photorefractive material.

By the term "photosensitivity", it is meant the ability of a molecule or material to change one or more of its properties either transiently or permanently in response to application of light (e.g., visible or near infrared). A photosensitive process could be used to transfer an electron from one molecule to another molecule upon application of visible or near infrared light.

By the phrase "polarizability anisotropy", it is meant the difference in the polarizability of a molecule along one axis and the polarizability of the molecule on a second axis.

By the term "polyene", it is meant a π-conjugated material comprising a series of alternating single and double bonds. More generally, as used herein, this term defines a linear sequence of methine (CH) units linked by a alternating sigma bond and between 0 and 1 π bonds.

By the phrase "reduction peak", in the context of a cyclic voltamogram, it is meant the potential at which the flow of current from the electrode to the molecule that is accepting electrons is maximized.

By the phrase "refractive index modulation amplitude", it is meant the amount the magnitude of the refractive index in a material can be varied tunably by an external stimulus.

By the phrase "reversibility of an oxidation process", it is meant that current flow measured by cyclic voltammetry for re-oxidation of an electrochemically reduced species is the same as that observed upon the initial oxidation, the oxidation process is said to be reversible. Similarly, when current flow measured by cyclic voltammetry for re-reduction of an electrochemically oxidized species is the same as that observed upon the initial reduction, the reduction process is said to be reversible. The significance of such a situation is the molecule does not decompose rapidly after the initial oxidation or reduction event. Reversibility could impact a molecule's efficacy in transporting charges.

By the phrase "semiconductor quantum well", it is meant a thin semiconductor of sufficient thinness that the energy levels for an electron or hole are quantized.

By the term "transilluminating", it is meant that imaging through a scattering medium is carried out by isolating the nonscattering photons and filtering out the scattering light.

By the phrase "visible wavelengths", it is meant wavelengths of light perceivable by the human eye (typically between 400 and 700 nm).

Other terms used herein are explained below.

Introduction

The present invention generally relates to molecules having transport, electronic and orientational properties that can be modified upon photoexcitation such that charge transfer can be induced which in turn enhances birefringence in a composition containing the molecules. For example, when a thermoplastic polymeric matrix is doped with a molecule according to the invention, optically clear, thermally stable photorefractive materials can be produced which are suitable for injection molding processes and capable of relatively long term storage.

The molecules have structures according to the following general formulas, wherein an asterisk (*) in a given structure identifies the point of attachment to the functional group and that the atom adjacent to the asterisk is missing one hydrogen that would normally be implied by the structure in the absence of the asterisk):

"—" in the following explication indicates a single bond between 2 atoms

"=" in the following explication indicates a double bond between 2 atoms

General Structure 1

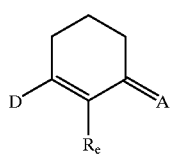

General Structure 2

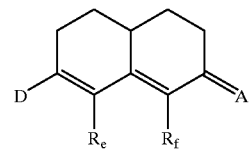

General Structure 3

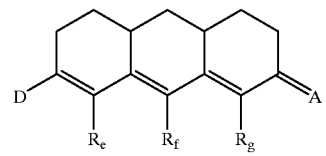

where D can be: $NR_aR_b$, $OR_a$, $SR_a$, $PR_aR_b$ or (D1)

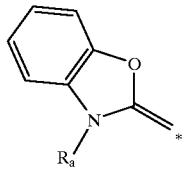

(D2)

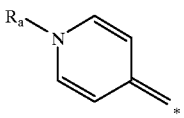

(D3)

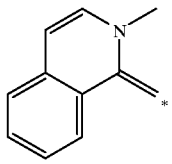

(D4)

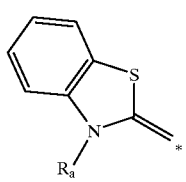

(D5)

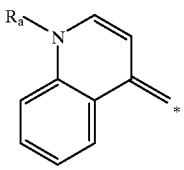

(D6)

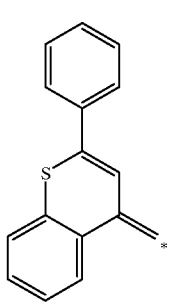

(D7) 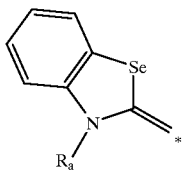

(D8) 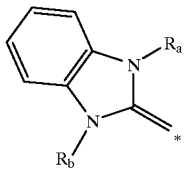

(D9) 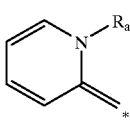

And A can be:

(A1) 

(A2) 

(A3) 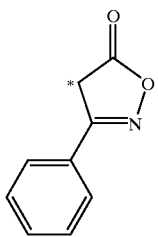

(A4) 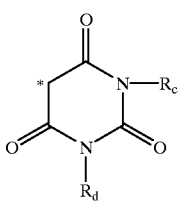

(A-5) 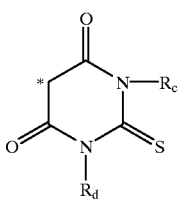

(A-6) 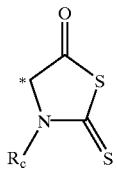

$R_a$, $R_b$, $R_c$, $R_d$, $R_e$, $R_f$, $R_g$ are independently selected from: H; a linear or branched alkyl group (see Note 1) with up to 25 carbons;

—$(CH_2CH_2O)_x(CH)_yOR_{a1}$; —$(CH_2CH_2O)_x(CH)_yNR_{a2}R_{a3}$; —$(CH_2CH_2O)_x(CH)_yCONR_{a2}R_{a3}$; —$(CH_2CH_2O)_x(CH)_yCN$; —$(CH_2CH_2O)_x(CH)_yCl$; —$(CH_2CH_2O)_x(CH)_yBr$; —$(CH_2CH_2O)_x(CH)_yI$; —$(CH_2CH_2O)_x(CH)_yPhenyl$; —$(CH_2CH_2O)_x(CH)_yBenzyl$; various aryl or carbazole groups (see NOTE 2); various fused aromatic rings (see NOTE 3); and nothing thing if the combinations of general structure, D or A does not include one of the subscripted R groups listed above (see NOTE 4).

$R_{a1}$, $R_{a2}$, and $R_{a3}$ are independently selected from: H; a linear or branched alkyl group with up to 25 carbons; and nothing where A is a divalent element;

$R_{a1}$, $R_{a2}$, and $R_{a3}$ may also be carbazole attached to through the nitrogen of the heterocyclic ring; and where x is 0–10 and y is 1–25.

NOTE 1: In general, alkyl groups set forth in the above formulas include those groups having up to 25 carbon atoms and includes both branched and straight chain alkyl groups. Exemplary alkyl groups include methyl, ethyl, propyl, butyl, pentyl, hexyl, heptyl, octyl, nonyl, in the normal, secondary, iso and neo attachment isomers.

NOTE 2: Aryl and carbazole groups of $R_a$, $R_b$, $R_c$, $R_d$:

$R_a$ $R_b$, $R_c$, $R_d$ can be an aryl group of up to 20 carbon (excluding substituents) aromatic ring systems where aryl includes:

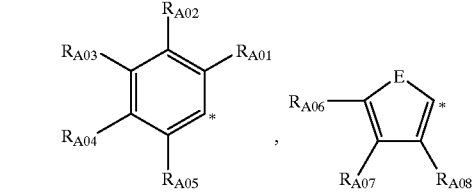

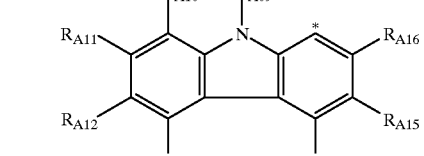

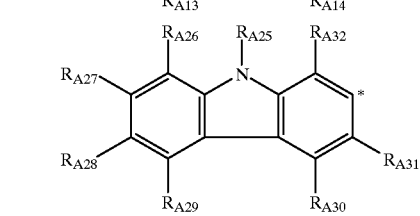

-continued

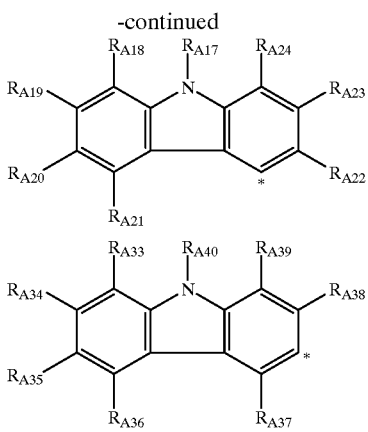

E can be: S; O where A# corresponds to a three digit symbol in the subscript of $R_{A\#}$ in which $R_{A01} \leq R_{A\#} \leq R_{A40}$, $1 \leq \# \leq 40$ but for $1 \leq \# \leq 9$, # is preceded by the digit 0 and $R_{A\#}$ are independently selected from: H; a linear or branched alkyl group with up to 25 carbons; $NR_{A\#1} R_{A\#2}$, $OR_{A\#3}$; and phenyl where $R_{A\#1}$, $R_{A\#2}$, $R_{A\#3}$ are independently selected from: H; a linear or branched alkyl group with up to 25 carbons; phenyl and an aryl as defined in note 5.

NOTE 3: Fused tiromatic rings of $R_a$, $R_b$, $R_c$, $R_d$:

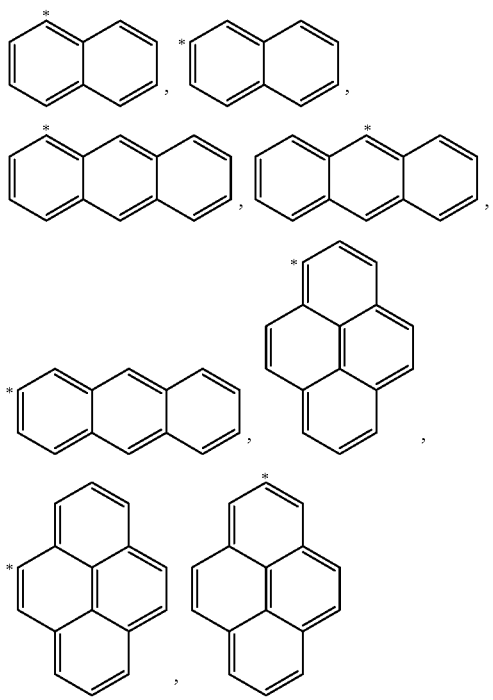

NOTE 4:

Explanation of definition of R groups for $R_a$–$R_g$

For example, for general 1 structure when D=D6 and A=A1 then, $R_a$, $R_b$, $R_c$, $R_d$, $R_f$, $R_g$ is nothing.

For example, for general structure 3 when D=$NR_aR_b$, and A=A3, then $R_c$, $R_d$, is nothing.

NOTE 5: Aryl and carbazole groups of $R_{A\#1}$, $R_{A\#2}$, $R_{A\#3}$: $R_{A\#1}$, $R_{A\#2}$, $R_{A\#3}$ can be an aryl or carbazole group of up to 20 carbon (excluding substituents) aromatic ring systems where aryl includes:

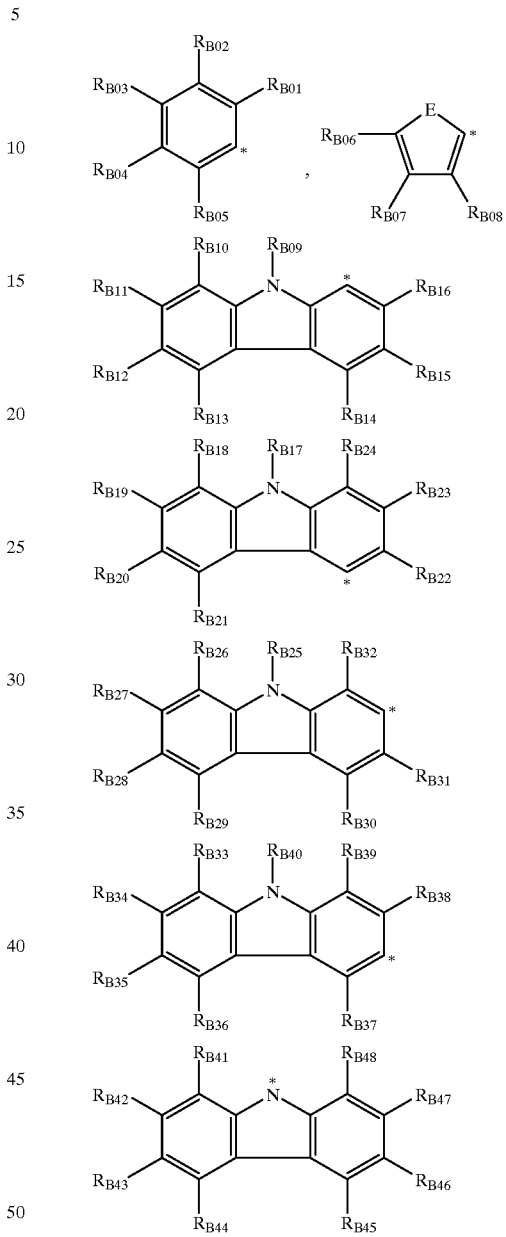

E can be: S; O; and B# corresponds to a three digit symbol in the subscript of $R_{B\#}$, $1 \leq \# \leq 49$ but for $1 \leq \# \leq 9$, # is preceded by the digit 0 and $R_{B\#}$ are independently selected from H; a linear or branched alkyl group with up to 25 carbons; and phenyl.

Examples of polymers suitable for photorefractive polymeric compositions according to the invention include polymers having low glass transition temperatures (i.e., within about 10 degrees C of room temperature) such as polysiloxane or mixtures such as those of poly(N-vinylcarbazole) and a plasticizer such as ethylcarbazole. Inert polymers, (i.e., those that are not photoconductive in and of themselves) are also suitable. For example, PTCB is a thermoplastic copolymer (commercially available from Hitachi) suitable for injection molding techniques. The four different monomeric units of PTCB create a polarizability along the polymer backbone. Thus, the polymer is birefringence-free and suitable for fabricating optical elements with high optical quality. Given the thermoplastic properties of PTCB, its good optical quality, and its compatibility with the thermally stable dopant molecules of the present invention, it is a further object of this invention to fabricate optical elements from these photorefractive composites using injection molding or extrusion.

To the extent that physicochemical (e.g., electronic, optical, thermal stability) properties are not adversely affected, additional ingredients may be utilized in photorefractive compositions according to the invention where desired to enhance mechanical or other properties of the composite. These ingredients may be antioxidants, release agents, ultraviolet light "blockers", plasticizers, sensitizers and lubricants, as may be useful in mass production using injection molding techniques.

Correlation of Structure and Function: Polarization

In low intensity light, the induced polarization of a molecule is linearly proportional to the electric field strength of the light. However, in the presence of high intensity light, the polarization of the molecule is no longer linear in the field. The induced polarization of the molecule is thus a nonlinear function of the field strength E, and can be approximated by a Taylor series expansion in Equation 2:

$$P = \alpha E + \tfrac{1}{2!}\beta E^2 + \tfrac{1}{3!}\gamma E^3 + \ldots \quad (2)$$

where P is the induced polarization, $\alpha$ is the linear polarizability, $\beta$ and $\gamma$ are the first and second hyperpolarizabilities, respectively. Second-order nonlinear optical effects referred to above are a direct manifestation of nonlinear polarization arising through the $\tfrac{1}{2!}\beta E^2$ term of the Taylor series and only occur in molecules that do not have a center of symmetry.

The degree of ground-state polarization, i.e., the degree of charge separation in the ground state, depends primarily on the chemical structure (e.g., the structure of the π-conjugated system, the strength of the donor and acceptor substituents), but also on its surroundings (e.g., the polarity of the medium). In donor-acceptor substituted polyene dyes, ground-state polarization is related to bond length alternation (BLA), a geometrical parameter defined as the average of the difference in the length between adjacent carbon-carbon bonds in a polymethine chain of π-conjugated bonds between the donor and the acceptor. Polyenes generally have alternating double and single bonds (bond lengths equal to 1.34 Å and 1.45 Å, respectively) and thus show a high degree of BLA (+0.11 Å). To better understand this correlation, it is illustrative to discuss the wave function of the ground-state in terms of a linear combination of the two limiting resonance structures: 1) an electrically neutral form (structures on left side of FIG. 1) characterized by a positive BLA; and 2) a charge-separated form (structures on right side of FIG. 1) characterized by a negative BLA since the double and single bond pattern is now reversed relative to the neutral form. The relative contribution of the resonances is schematically represented by the sizes of the "balloons" over the arrows.

Thus, for unsubstituted polyenes or polyenes with weak donors and acceptors, the neutral resonance form dominates the ground-state wavefunction and the molecule has a high degree of BLA, as illustrated in FIG. 1a. With stronger donors and acceptors, the contribution of the charge-separated resonance form to the ground-state increases and simultaneously, BLA decreases, as shown in FIGS. 1b and 1c.

When the two resonance forms contribute equally to the ground-state structure, the molecule exhibits essentially no BLA. This zero BLA limit is the so-called cyanine limit and refers to the common structure of a cyanine molecule in which the molecule is charged and the charge-limiting charge transfer resonance forms are degenerate in both energy and structure. Thus, such cyanine molecules are correctly represented by two degenerate resonance forms, resulting in structures with virtually no BLA, as shown in FIG. 1d. Finally, if the charge-separated form dominates the ground-state wave function, the molecule acquires a reversed BLA pattern, as shown in FIG. 1e.

Figure 2:
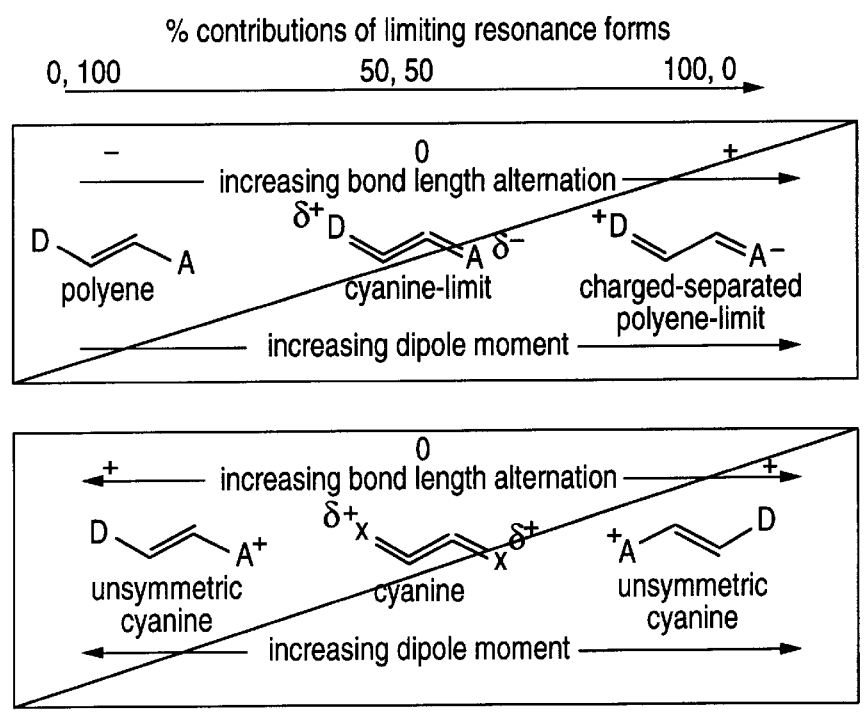
FIG. 2 illustrates the contribution of the neutral and charge separated resonance forms to molecular structure as a function of the extent of ground-state polarization of the molecule.

In a similar manner, the n-bond order is also a measure of the double-bond character of a given carbon-carbon bond and the difference in the π-bond order between adjacent carbon-carbon bonds is the Bond Order Alternation (BOA). A BOA of about −0.55 is calculated for a donor-acceptor substituted polyene with alternating double and single bonds. Thus, BOA and BLA are parameters that describe the mixing of the two resonance forms in the actual ground-state structure of the molecule. These concepts are summarized in FIG. 2.

Figure 3:
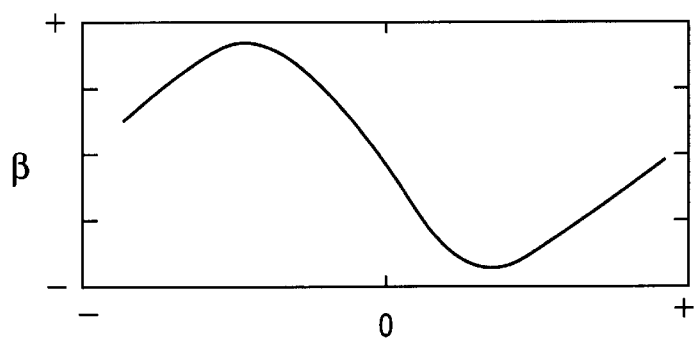
FIG. 3 graphically illustrates the correlation of $\beta$ with bond length alternation for a donor-acceptor substituted chromophore.

In order to correlate the first molecular hyperpolarizability $\beta$ with the ground-state polarization and consequently with BLA, the molecule $(CH_3)_2N\text{-}(CH=CH)_4CHO$ was examined in the presence of an external static electric field of varying strength, first using an AM1 Hamiltonian. Subsequently, the molecule was examined at the semiempirical Intermediate Neglect of Differential Overlap-Configuration Interaction (INDO-CI) level, with the evaluation of the molecular polarizabilities through the Sum-Over-States formulation at the correlated level. In the INDO-CI study, the ground-state polarization was tuned by applying an external static electric field of varying strength. FIG. 3 illustrates how $\beta$ correlates with the average value of BOA. Upon going from the neutral polyene limit to the cyanine limit, $\beta$ first increases, peaks in a positive sense for an intermediate structure, decreases and passes through zero at the cyanine limit. From that limit and going to the charge-separated resonance structure, $\beta$ continues to decrease and thus becomes negative, peaks in a negative sense, and then decreases again (in absolute value) to become smaller in the charge-separated structure.

A. Fused Ring Bridge, Ring-locked Dyes

Figure 4:
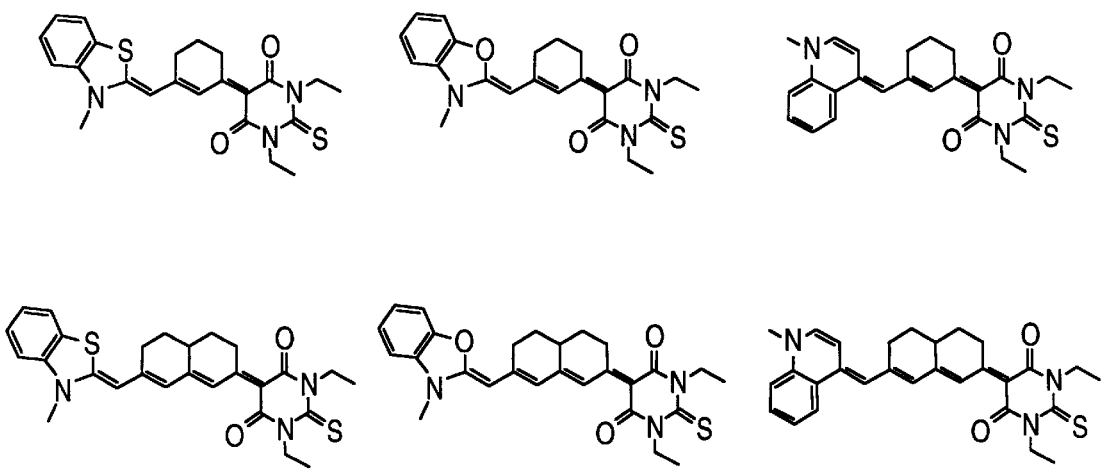
FIG. 4 illustrates examples of fused ring bridge, ring-locked dyes with heterocyclic donors and diethylthiobarbituric acid acceptors according to the invention.
Figure 5:
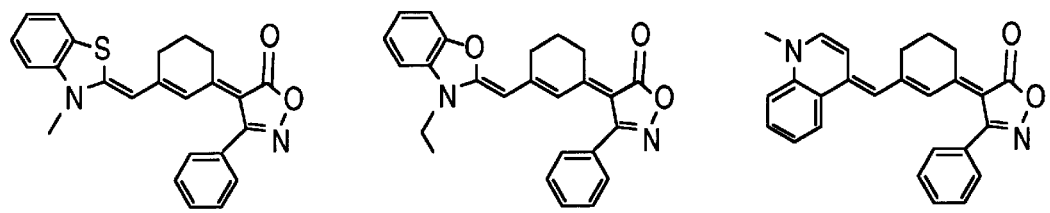
FIG. 5 illustrates examples of fused ring bridge, ring-locked dyes with heterocyclic donors and phenylisoxozolone acceptors according to the invention.

We have synthesized fused ring, ring-locked bridge dyes containing dicyanomethylidene, diethylthiobarbituric acid and phenylisoxazolone acceptors as examples of dyes having at least the following useful characteristics: 1) a large molecular dipole moment which is facilitated by having end groups that themselves have significant dipole moments and enhance the molecular dipole moment by virtue of significant charge transfer from the donor to the acceptor in the ground state of the molecule (i.e., charge-transfer dipole contribution) and by having the orientation of the vectorial components of the donor dipole charge-transfer dipole contribution and the acceptor dipole charge-transfer dipole contribution largely aligned in the same direction such that the molecular dipole moment is greater than about 7 Debye; 2) a large polarizability anisotropy, $\Delta\alpha$; 3) improved thermal stability of the fused ring bridge, ring-locked dye relative to analogous simple polyene bridged dyes; 4) no possibility for thermal or photochemical isomerization within the fused ring bridge connecting the donor and acceptor, thereby decreasing the possibility of a variety of geometric isomers of the compound being present in a material and decreasing the possible distribution of polarizability anisoptropies and dipole moments that the dye could have, leading to a photorefractive device whose properties vary less with respect to environmental changes including polarity and thermal fluctuations; and 5) greater electrochemical stability of the fused ring bridge, ring-locked dye relative to analogous simple polyene bridge dyes, enhancing the lifetime of the materials in the presence of ionic species which may reduce the dye or initiate chemical degradation of the dye. Exemplary compounds according to the invention exhibiting these characteristics according the above general description are shown in FIGS. 4 (heterocyclic donors and diethylthiobarbituric acid acceptors) and 5 (heterocyclic donors and phenylisoxozolone acceptors).

Figure 6A:
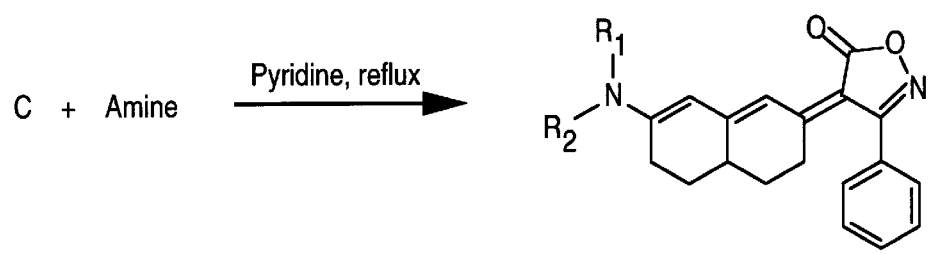
FIGS. 6a and 6b respectively illustrate a reaction scheme to form polarized fused ring bridge, ring-locked dyes and examples of fused ring bridge, ring-locked dyes with amine or carbazole donors and dicyanomethylidene and phenylisoxazolone acceptors according to the invention.
Figure 6A:
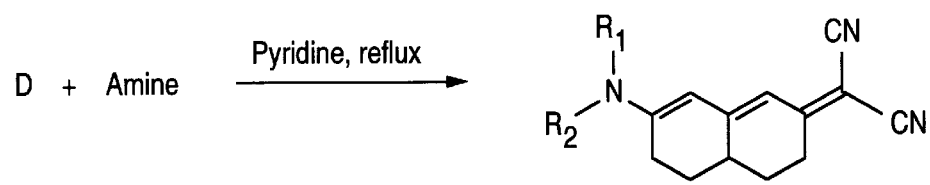
Figure 6B:
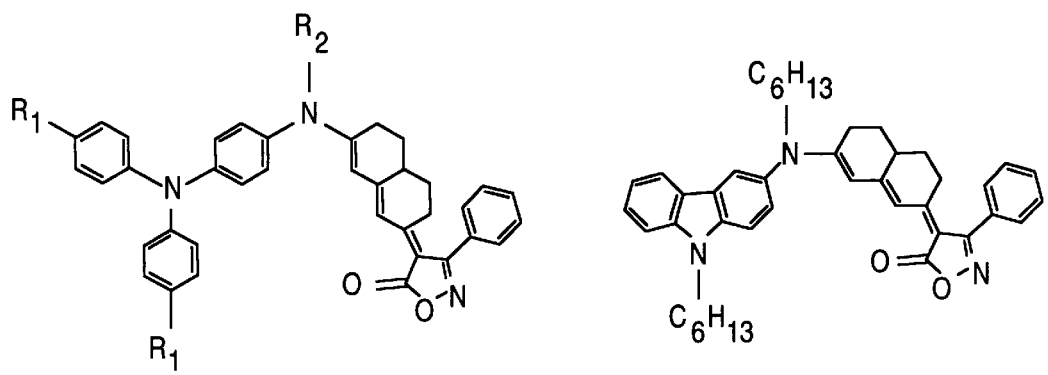
Figure 6B:
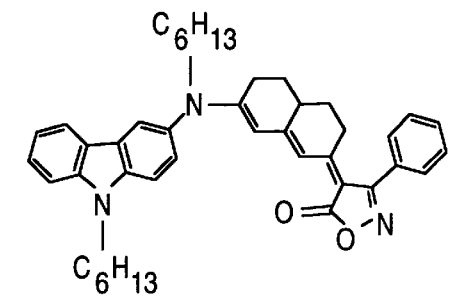
Figure 6B:
Figure 6B:
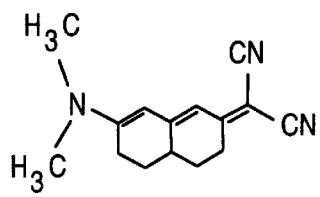
Figure 6B:
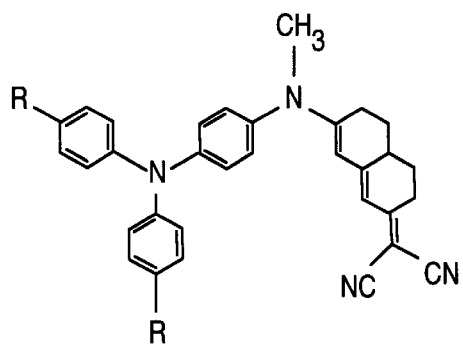
Figure 6B:
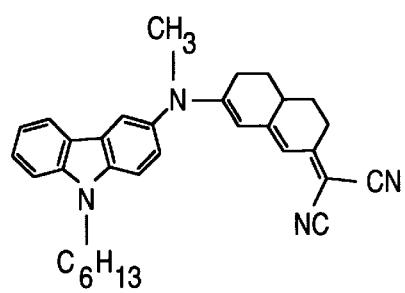
Figure 6B:
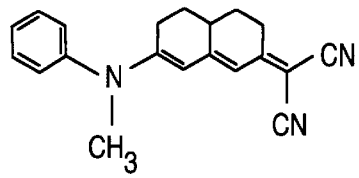
Figure 6B:
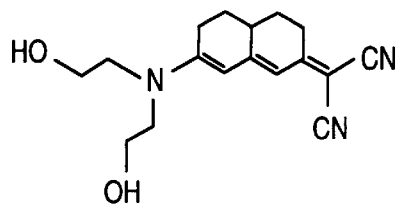

It is advantageous to have a composition in which the dye (i.e., chromophore) acts as both a moiety that induces a change in the index of refraction and as a hole transport material. In that regard, we teach that triarylamine and carbazole groups, known hole transport materials, can be incorporated into fused ring bridge, ring-locked dyes having an acceptor such as the dicyanomethylidene or phenylisoxazolone, as shown in FIGS. 6a and 6b.

Figure 7:
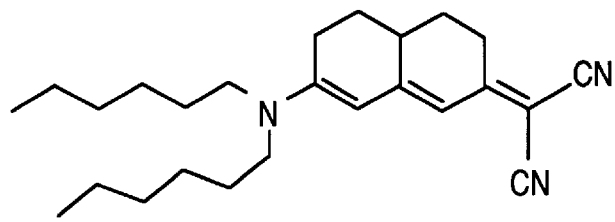
FIG. 7 illustrates a fused bridge, ring-locked dye with a di-n-hexylamino donor and a dicyanomethylidene acceptor according to the invention.

One particularly useful embodiment of the invention is the dye (with di-n-hexylamino donor and dicyanomethylidene acceptor) shown in FIG. 7, described in more detail below.

B. Ultra-violet/visible Spectra of Fused Ring Bridge, Ring Locked Dyes

Since the preferred donors and acceptors in the dyes according to the invention are strong donors and strong acceptors, the dyes are expected to be close to the cyanine limit or even polarized beyond this point. This expectation is supported by the narrow UV-Visible spectra of those compounds. In the benzene-type fused ring bridge, ring-locked dye series, the compound

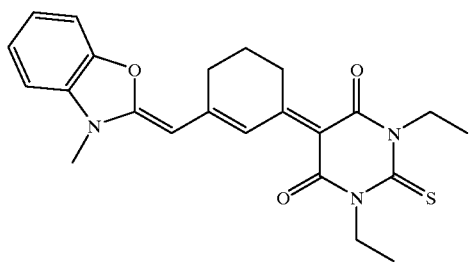

is closest to the cyanine limit, indicating substantial charge transfer from donor to acceptor and implying a large molecular dipole moment and polarizability anisotropy. This molecule has the sharpest absorption band with the highest extinction coefficient.

The compounds

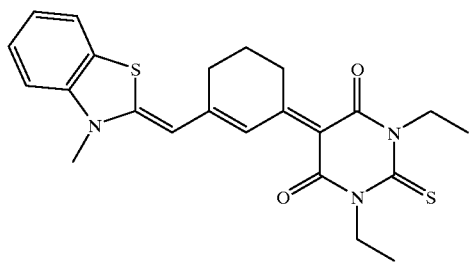

and

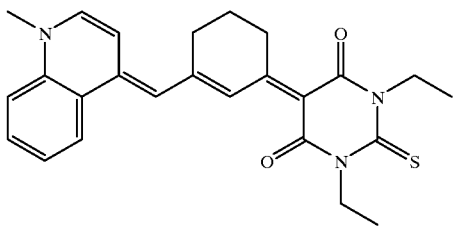

having even stronger donors, have broader bands with smaller extinction coefficients. The UV-visible spectra of these compounds also, in particular, exhibit the relatively narrow peak widths. Therefore, in keeping with the design strategy described herein, it is expected that these compounds would also be at or slightly beyond the cyanine limit in the regions where the orientational contribution to the index change will be largest. This is in agreement with the expected donor strength of the donor in the molecule. As alluded to above, the quinoline donor is stronger than the benzthiazole and the donors, which are roughly comparable in strength.

Figure 8:
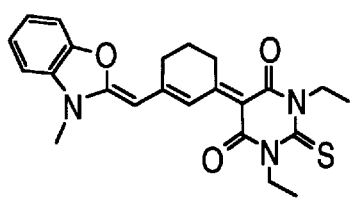
FIG. 8 presents EFISH generation data (shown directly below the chemical structure of selected compounds according to the invention) giving values of $\mu\beta$ in units of $10^{-48}$ esu.
Figure 8:
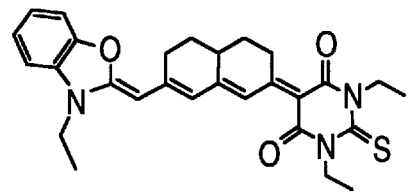
Figure 8:
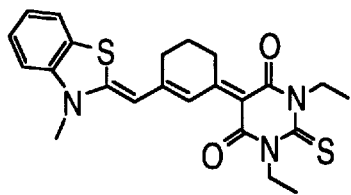
Figure 8:
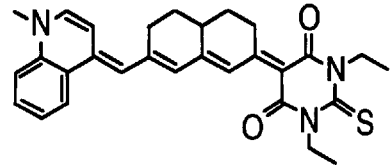
Figure 8:
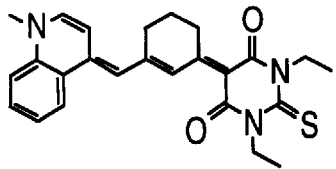
Figure 9A:
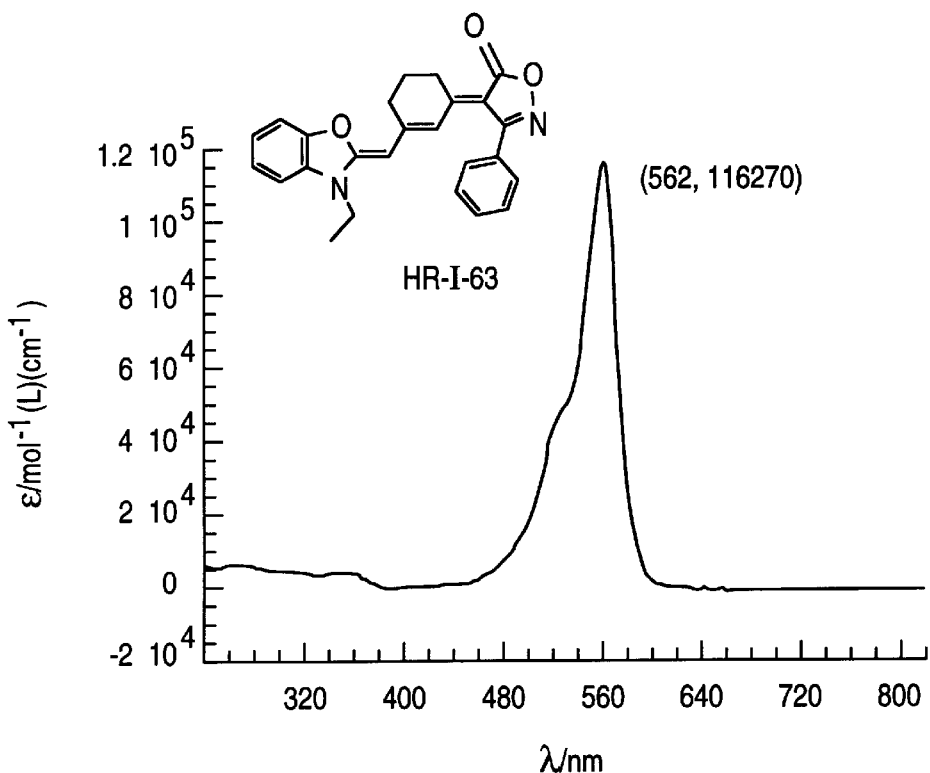
FIGS. 9a–9f are UV-visible spectra of selected fused ring bridge, ring-locked dyes according to the invention that are near the cyanine limit or slightly beyond.
Figure 9B:
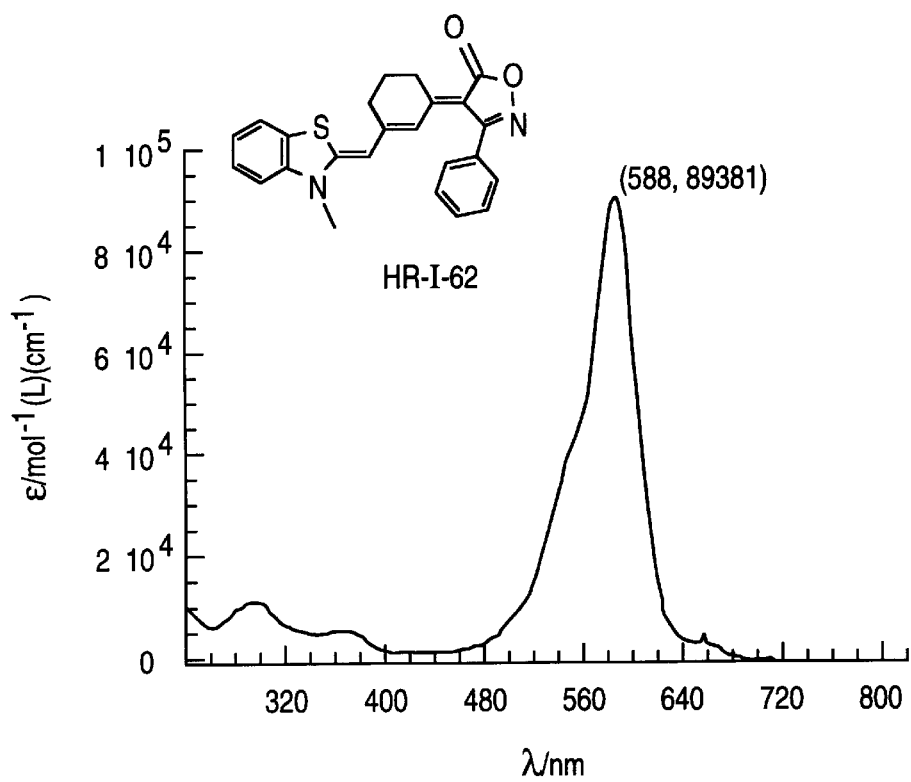
Figure 9C:
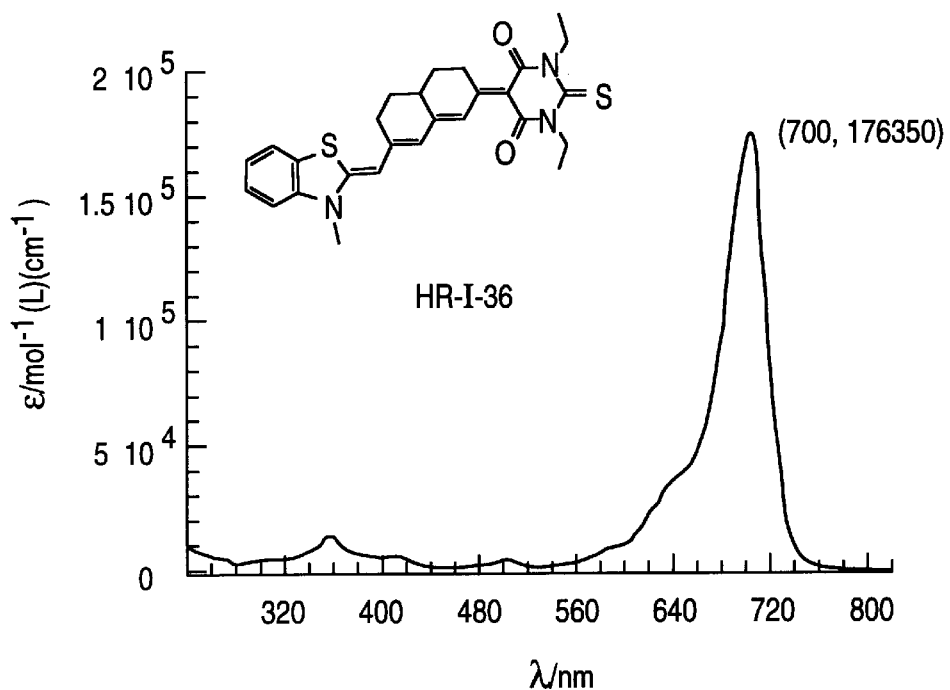
Figure 9D:
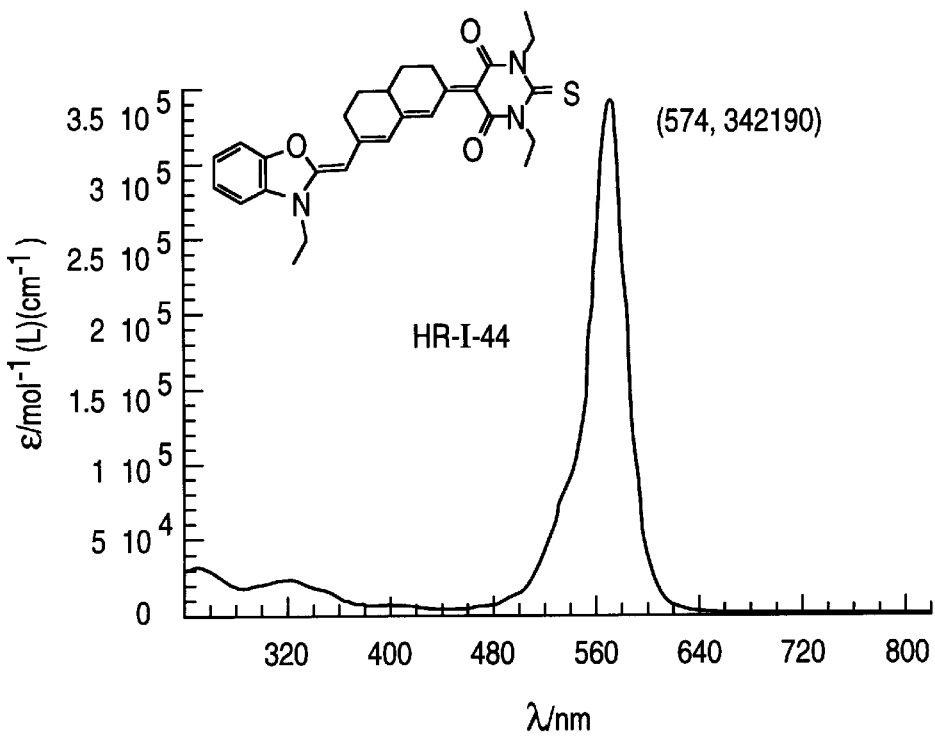
Figure 9E:
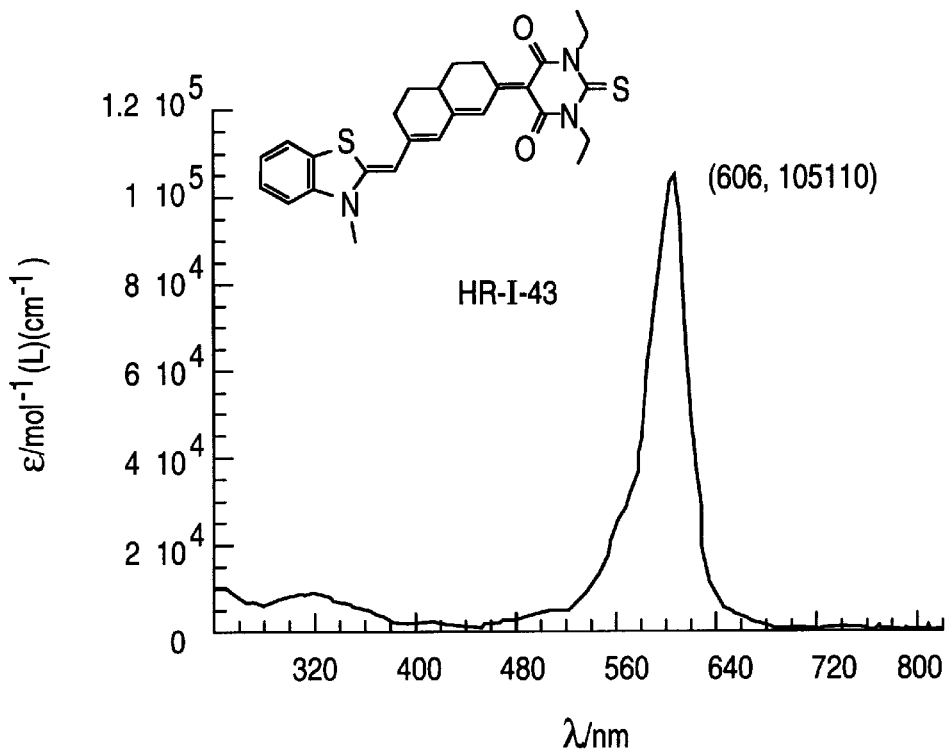
Figure 9F:
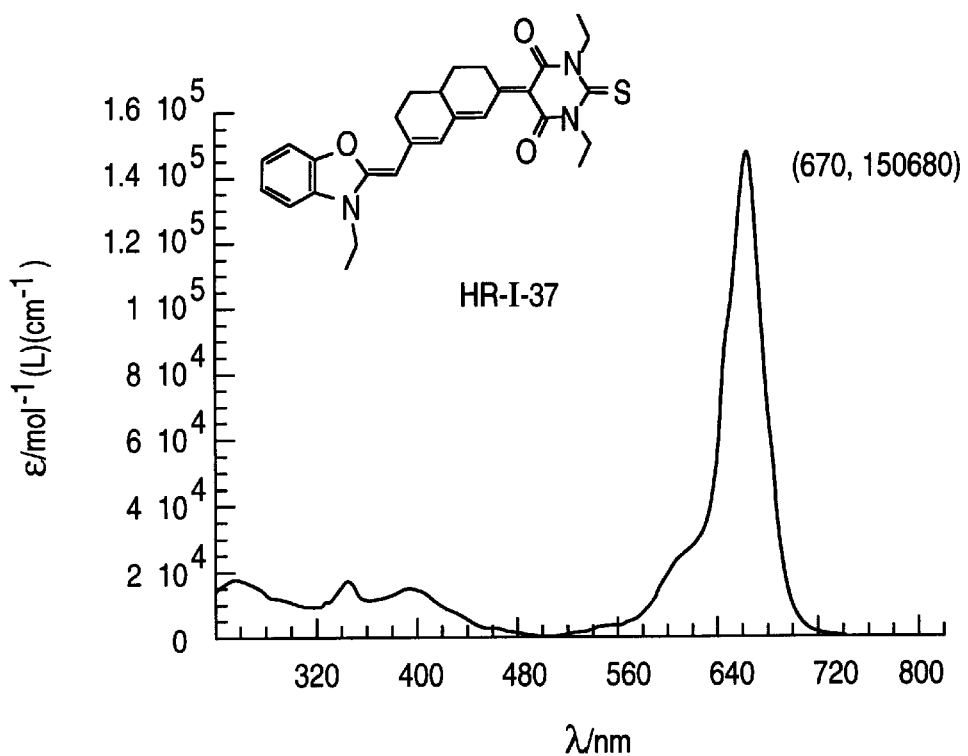

The molecular second-order optical nonlinearities, measured by EFISH (electric field induced second harmonic generation in $10^{-48}$ esu) at 1907 nm in $CHCl_3$, also confirm that the molecules illustrated in FIG. 4 exceed the cyanine limit (by virtue of the negative values of the product of the first electronic hyperpolarizability $\beta$ and molecular dipole moment $\mu$). Thus, although of no consequence for this invention, the negative second-order optical nonlinearities (shown in FIG. 8) nonetheless support our hypothesis of the utility of these molecules for photorefractive applications by providing evidence that the molecules have sufficient charge transfer to exhibit large orientational contributions to the index of refraction change in low glass transition temperature photorefractive polymers.

FIGS. 9a–9f illustrate UV-visible absorption spectra (numbers in parentheses giving absorption maximum (nm) and extinction coefficient ($mol^{-1}$ L $cm^{-1}$)) for various fused ring bridge, ring-locked dyes according to the invention. The narrow line width indicates nearness to the cyanine limit and that the molecule has a large polarizability anisotropy. (Characters below the compounds simply correspond to the initials of the person who synthesized the compounds followed by the notebook number and the page number on which the synthesis was reported.)

C. Electrochemical Stability

Figure 10:
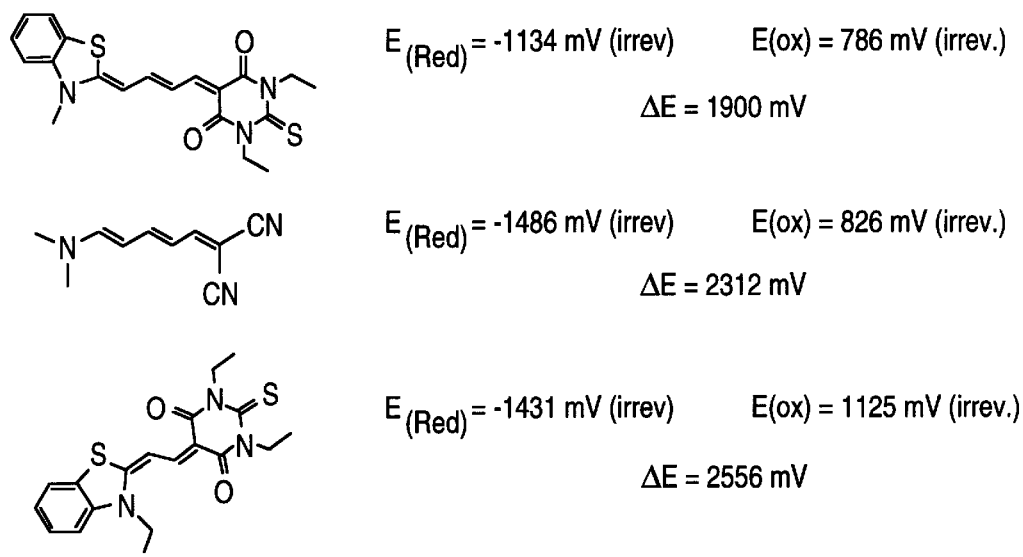
FIGS. 10 and 11 present oxidation and reduction potentials for donor-acceptor-substituted chromophores of the prior art and those according to the invention, respectively.
Figure 11:
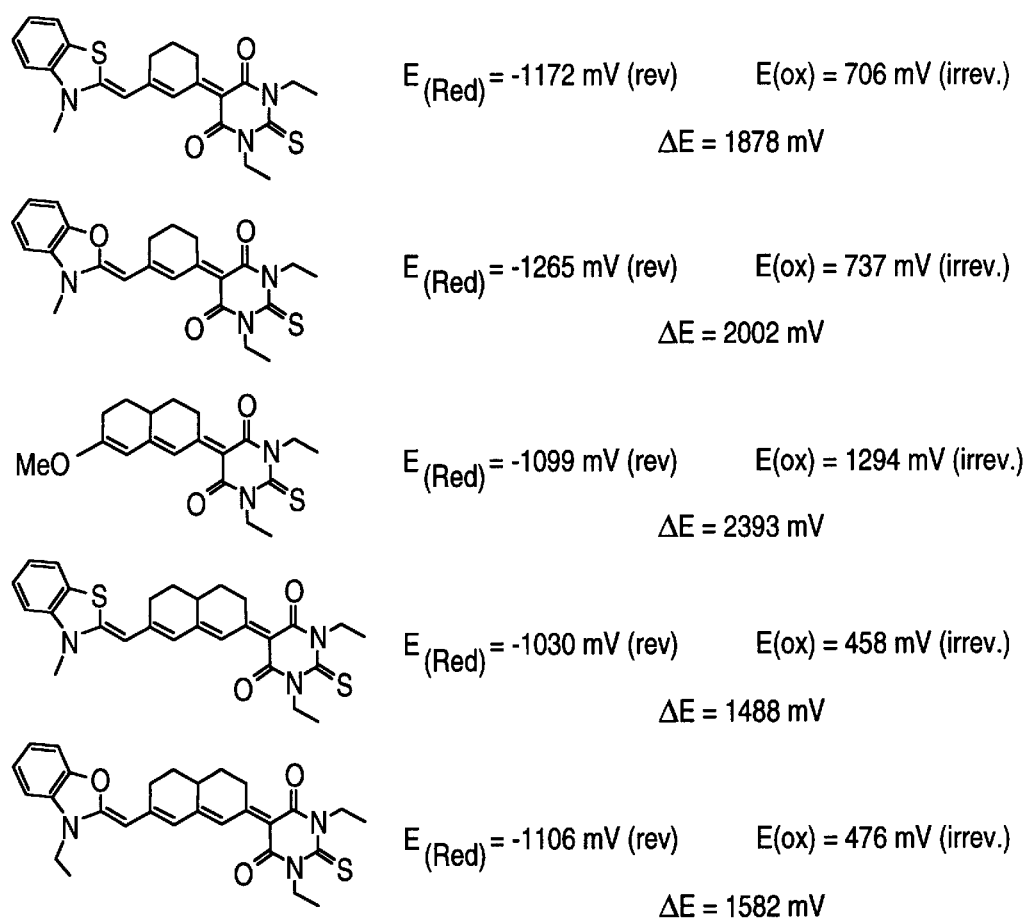

The oxidation and reduction potentials of donor-acceptor chromophores according to the invention were measured by cyclic voltammetry under an inert gas and using glassy carbon electrode in $CH_2Cl_2$/tetrabutyl ammonium hexafluorophosphate versus a Ag/AgCl reference electrode. Reduction and oxidation in simple polymethine bridged dyes are irreversible processes, as shown in FIG. 10. In contrast, the exemplified fused ring bridge, ring-locked dyes according to the invention under the same condition exhibit a reversible reduction peak, as shown in FIG. 11.

Figure 12:
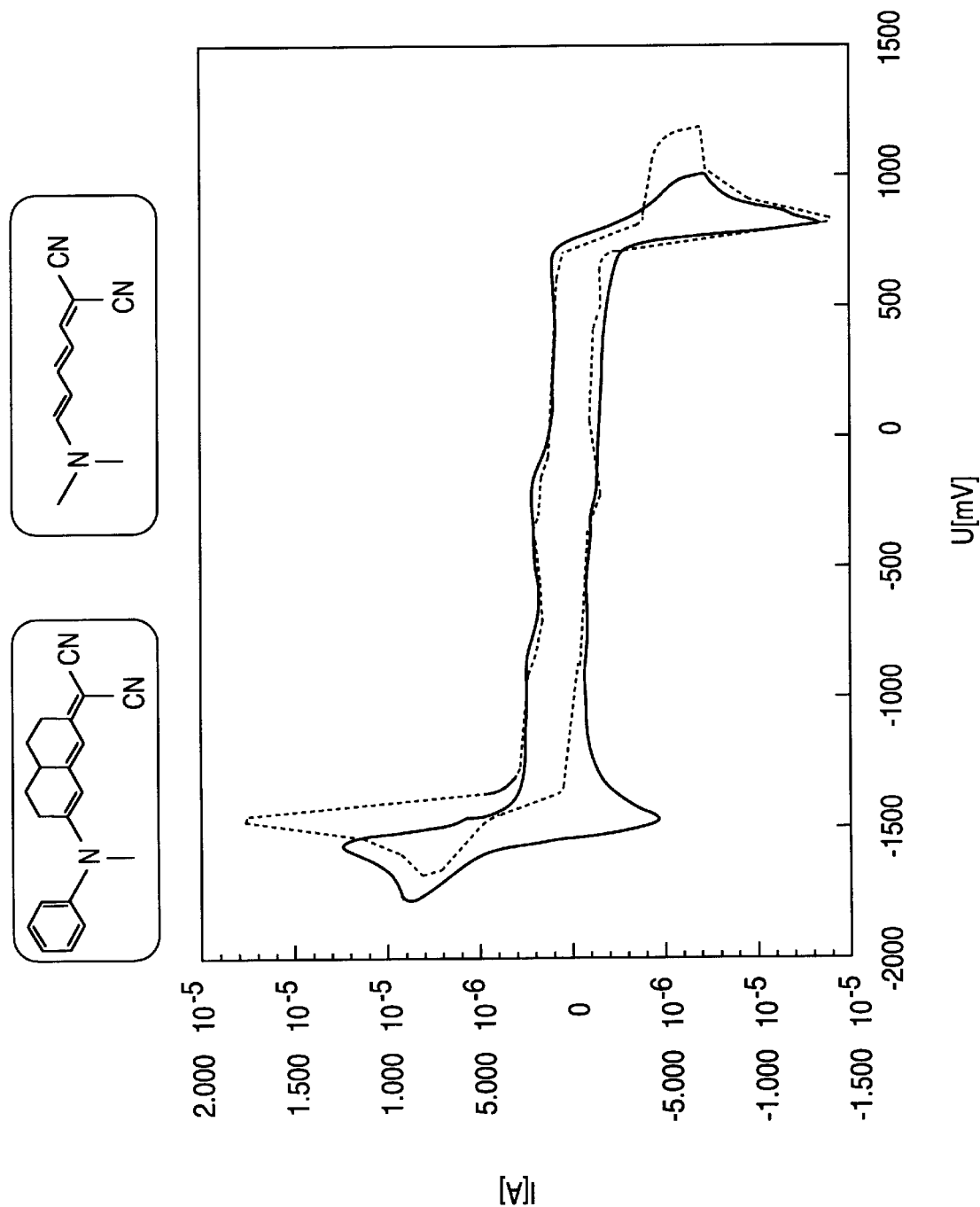
FIG. 12 presents cyclic voltammograms (CV) of fused ring bridge, ring-locked dyes according to the invention (solid line) and simple polyene (dashed line) dyes.

The reversible reduction peak and the irreversible oxidation peak can also be observed in the dyes with malononitrile acceptors, as shown in FIG. 12, suggesting this reversibility/irreversibility characteristic is a fundamental difference between the fused ring bridge, ring-locked dyes of the invention and the simple polymethine bridged dyes. Consequently, dyes of the invention appear to be better charge transport carriers than chromophores having the simple polymethine bridge and therefore capable of enhancing even more dramatic photorefractive effects.

D. Thermal Stability of Fused Ring Bridge, Ring-locked Dyes of the Invention The thermal stability of fused ring bridge, ring-locked dyes according to the invention was compared to that of the corresponding simple polymethine bridged dye according to the following procedure. The two dyes were heated in a sealed flask at 140° C. in diglyme. The extent of decomposition as function of time was monitored by the absence of absorbance at a given wavelength at which the dye is known to absorb. As can be seen in the Table 1, the fused ring bridge, ring-locked dye (left) has within experimental error the same absorbance after 45 hours that the simple polymethine bridged dye (right) has after only 1 hour. The results demonstrate that fused ring bridge, ring-blocked dyes according to the invention have at least one significant advantage over corresponding simple polymethine bridged dyes. The improved stability of fused ring bridge, ring-locked dyes according to the invention enhances both the shelf life of devices incorporating the dyes as well as their operating lifetime. Thus, the dyes according to the invention, in general, have greater utility in devices than analogous dyes containing simple polymethine bridge (i.e., $(CH)_n$ groups) between the donor and acceptor.

TABLE 1

Thermal stability of fused bridge, ring-locked and simple polymethine bridged dyes.

| time | UV absorbance |
|---|---|
| 0 | 100% |
| 1 h | 83% |
| 2 h | 66% |
| 3 h | 65% |
| 7 h | 65% |
| 18 h | 64% |
| 45 h | 45% |

| | |
|---|---|
| 0 | 100% |
| 1 h | 48% |
| 2 h | 46% |
| 3 h | 42% |
| 6 h | 34% |
| 22 h | 15% |

E. General Synthetic Methodology

The first step of synthesis of fused ring bridge, ring locked dyes according to the invention is the Birch reduction of 1,3-dimethoxybenzene, 2,7-dimethoxynaphthalene or 2,8-dimethoxyanthracene using ethanol, liquid ammonia and sodium. The reduced compounds are the starting materials for the synthesis of the dyes, as shown below.

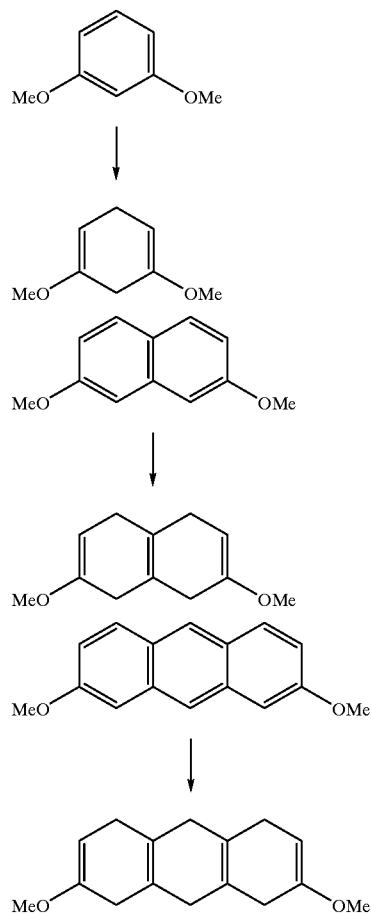

Figure 13:
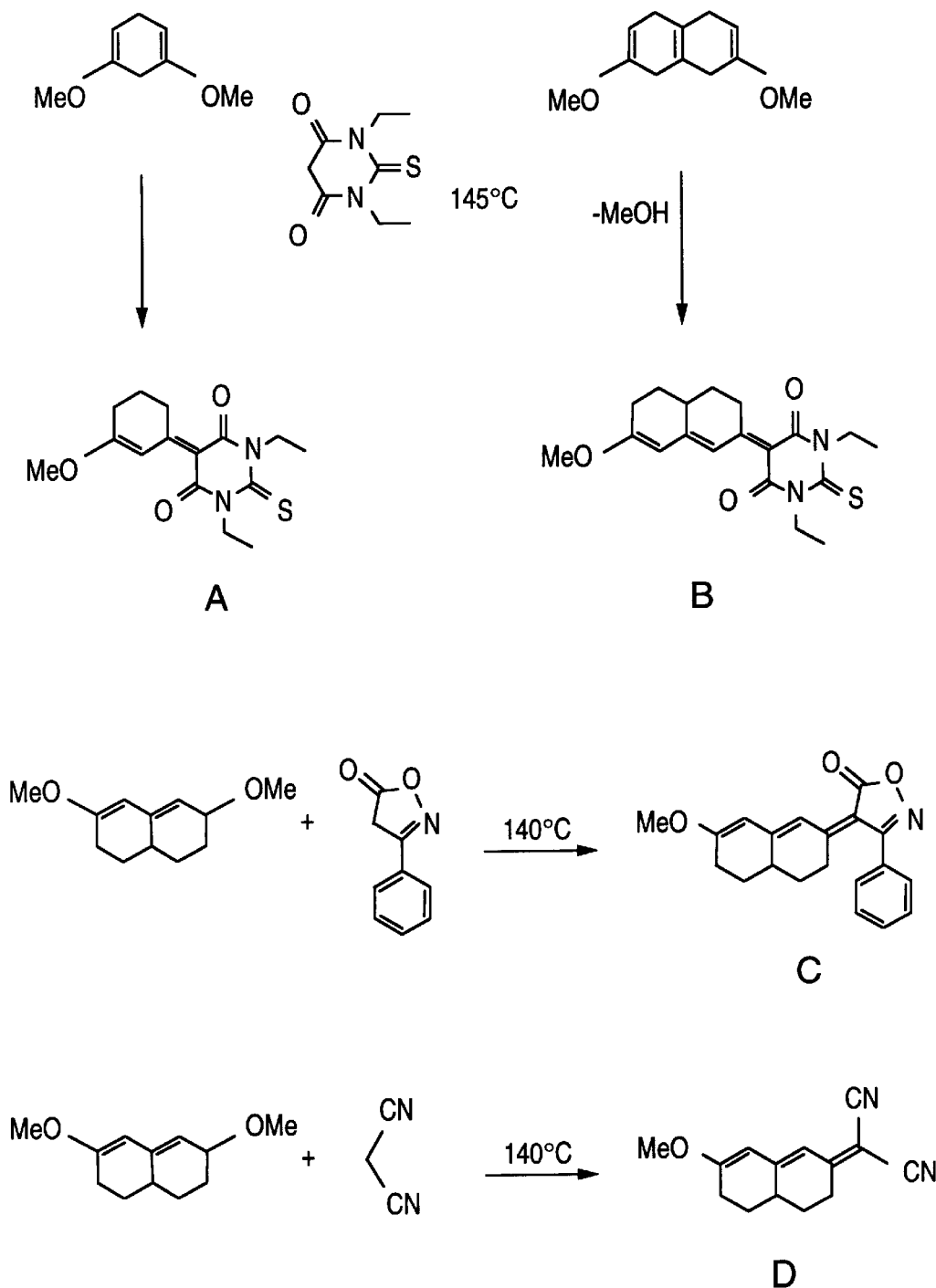
FIG. 13 shows a reaction scheme to form $\pi$-conjugated methoxy-thiobarbituric acid dyes according to the invention.

The Birch reduction products of 1,3-dimethoxybenzene and of 2,7-dimethoxynaphthalene each react with thiobarbituric acid to form the conjugated methoxy-thiobarbituric acid dyes as shown in FIG. 13. For this reaction, no solvent is used. The reactants were melted at 145° C. for 15 min. Methanol condensing at the walls of the flask showed successful reaction. Purification was carried out by simple filtration over a short column of $SiO_2$ with $CH_2Cl_2$. Yields were typically around 60%.

Molecules produced according to the reaction scheme of FIG. 13 (i.e., molecules A, B, C or D) can be reacted with amines to give polarized fused ring bridge, ring-locked dyes having large dipole moments and polarizability anisotropies, as exemplified in the reaction scheme shown in FIG. 6a.

Figure 14:
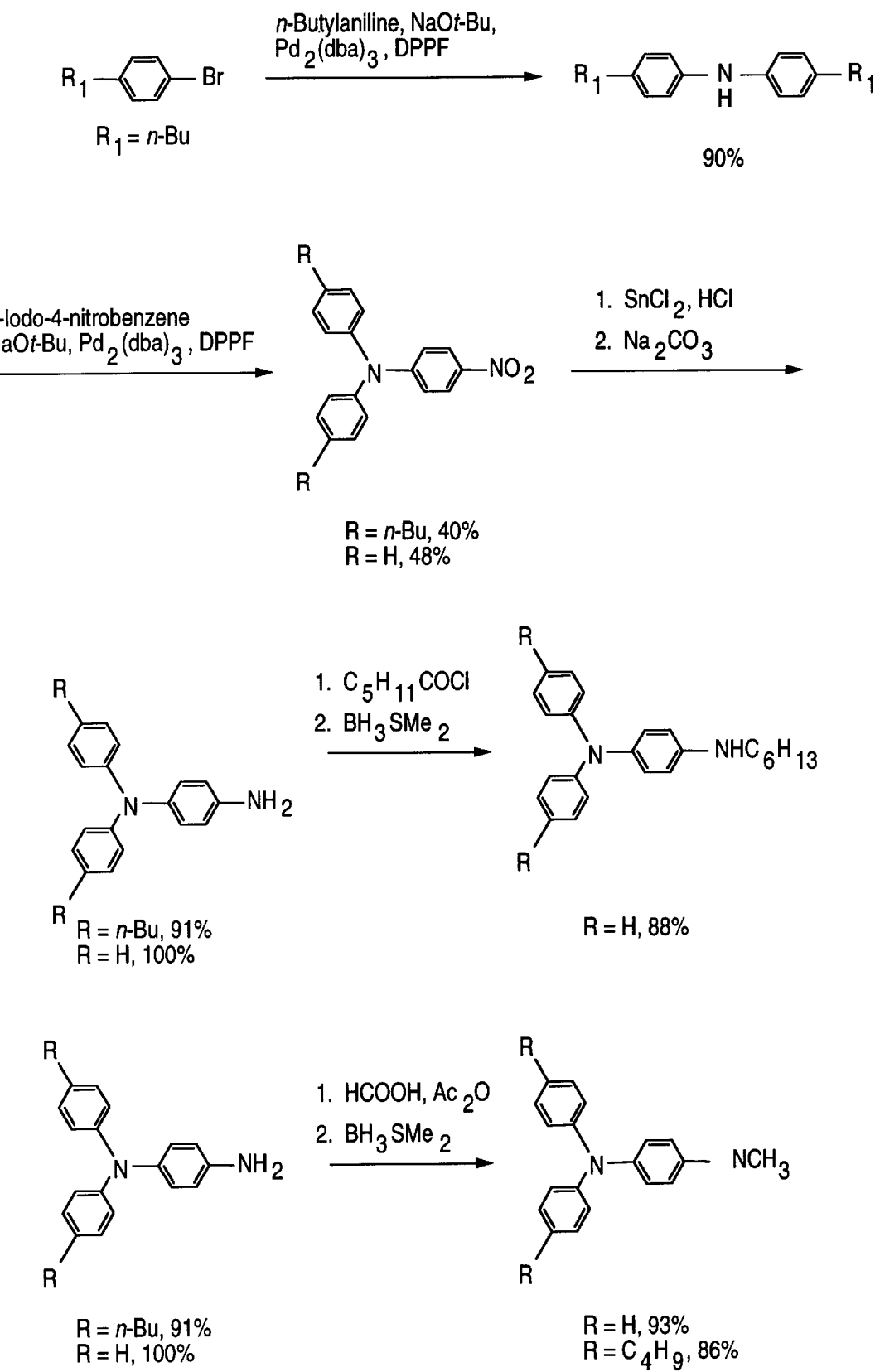
FIG. 14 shows a reaction scheme to form triphenylamine-substituted derivatives of dyes according to the invention.

Triphenylamine-substituted derivatives with improved transport properties were made in five-step synthesis with 40% overall yield, as exemplified in the reaction scheme illustrated in FIG. 14.

Figure 15:
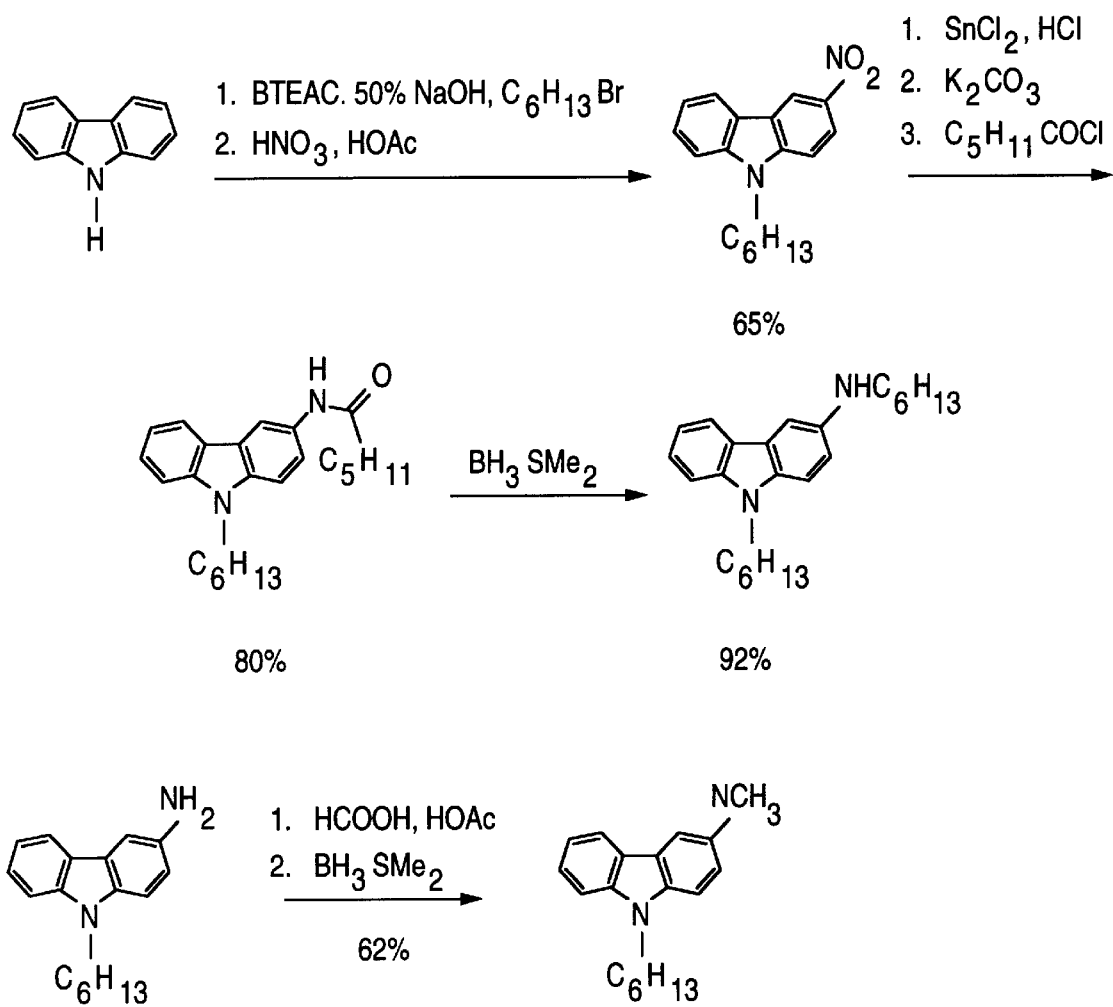
FIG. 15 shows a reaction scheme to form carbazole derivatives of dyes according to the invention.

Carbazole derivatives were also synthesized in five steps with overall 48% and 56% yield as illustrated in the reaction scheme of FIG. 15.

Figure 16:
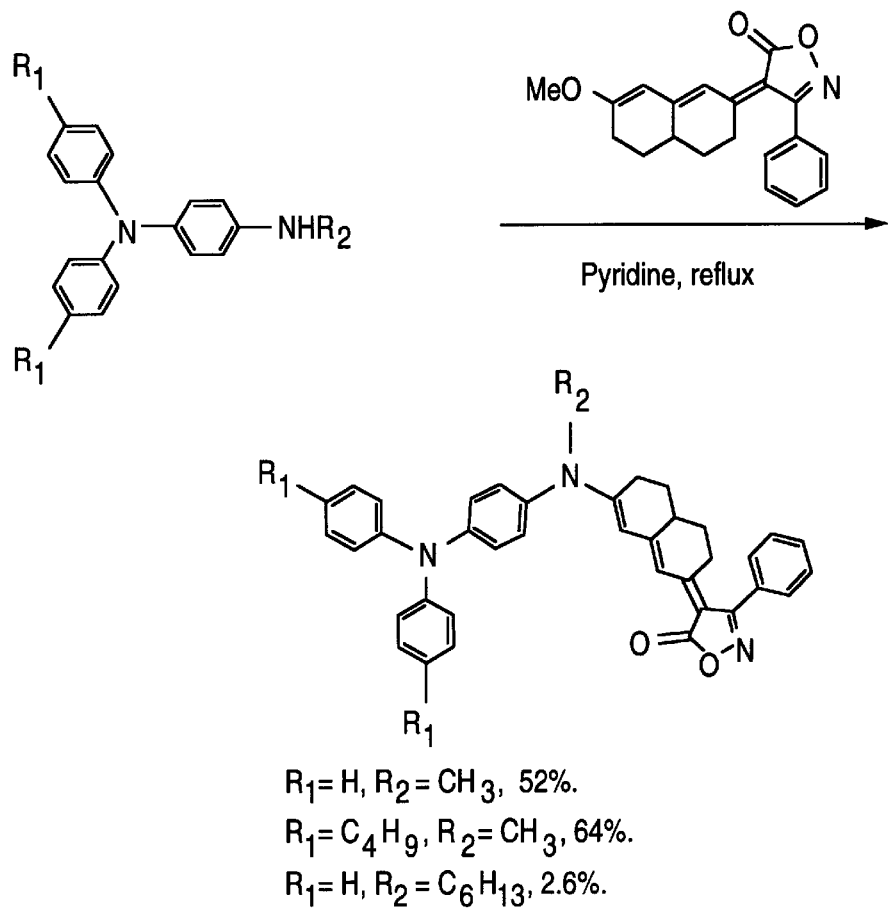
FIG. 16 shows a reaction scheme exemplifying the relative reactivities of triphenylamine and carbazole derivatives of dyes according to the invention.
Figure 16:
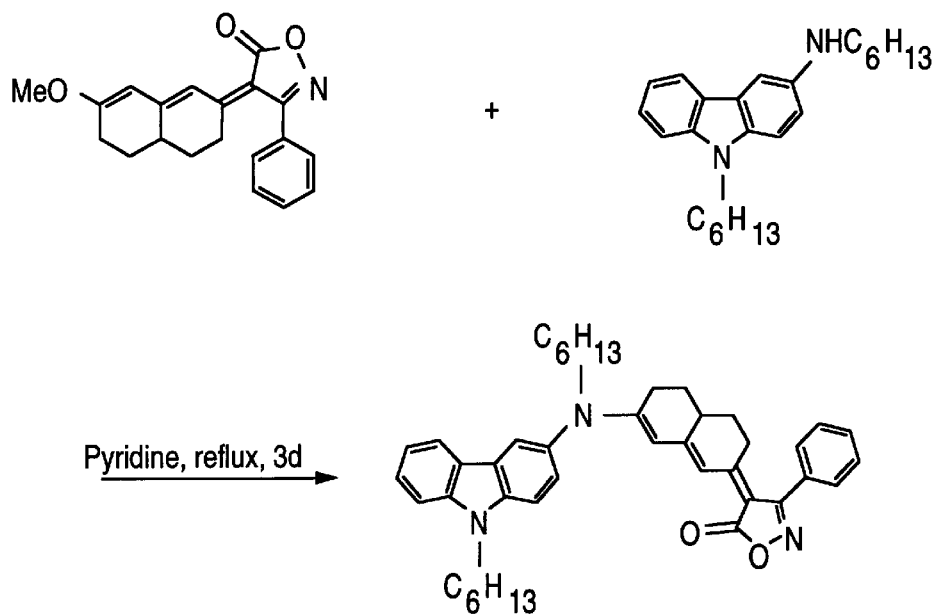

The reactivity of the triphenylamine derivatives and carbazole derivatives depends on the substitutions on the amino group. Large alkyl groups such as hexyl slowly react and yield relatively little product. Small groups such as methyl react relatively faster and with better yield, as illustrated in the reaction scheme of FIG. 16.

Figure 17A:
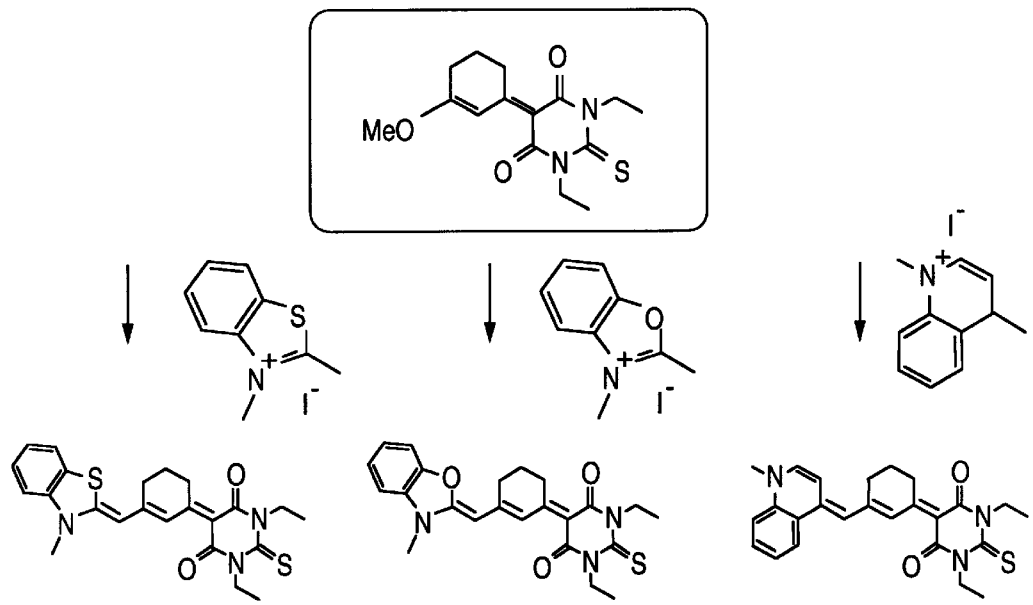
FIG. 17 shows a reaction scheme whereby selected fused ring bridge, ring-locked dyes according to the invention are formed.
Figure 17B:
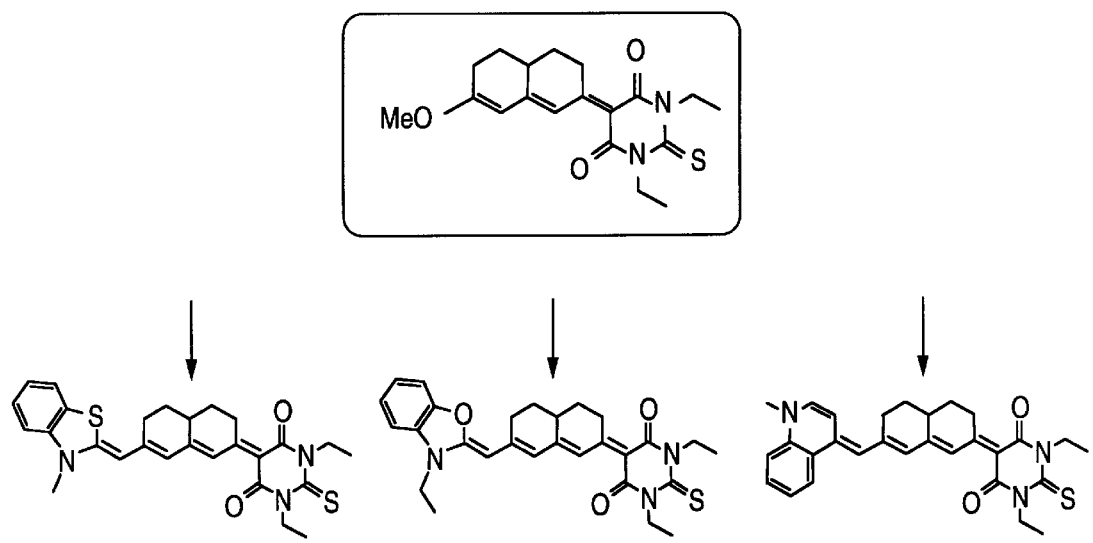

General Synthetic Method 1:

Each of compounds A and B is reacted further with an alkylated heterocyclic salt to form the corresponding fused ring bridge, ring locked dye according to the invention, as shown in FIG. 17. The reactions run typically in a 1 mmol scale in 10 mL dry pyridine and 1 mL triethylamine in a pressure tube. Each reaction is followed using UV spectra and stopped after complete reaction of the starting materials. Products are purified via column chromatography on silica gel with $CH_2Cl_2$ as eluant. Yields vary between 40% and 60%, as illustrated in the reaction scheme of FIG. 17.

In addition to the dyes with the thiobarbituric acid acceptor, we teach that this general synthetic method can be used with compound C instead of A or B.

The following examples illustrate, but are not intended to limit, dyes according to the invention.

Example 1

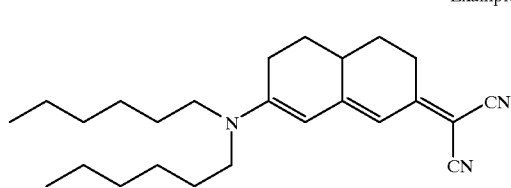

In a 200 mL 2-neck flask, malononitrile and tetrahydronaphthalene were melted at 140° C. for 1 h. The crude mixture was dissolved in $CH_2Cl_2$ and filtered over 3 cm silica gel. After evaporating the solvent, the brown oil was recrystallized from 100 mL MeOH. The yield was 66%. In the second step, 50 mL pyridine, 50 mL dihexylamine and 6 g compound D were heated at reflux for 15 h. The pyridine was evaporated and 50 mL MeOH were added to crystallize the product overnight at −30° C. as a red powder. Further crystallization from ethanol gave the clean title compound (DHADCMPN) in 81% yield. $^1$H NMR (CDCl$_3$) δ 6.21 (s, 1H), 5.37 (s, 1H), 3.32–3.19 (m, 4H), 2.93–2.87 (m, 1H), 2.59–2.30 (m, 6H), 2.00 (m, 2H), 1.58–1.31 (m, 16H), 0.91 (t, J=6.1 Hz, 6H); UV (CHCl$_3$) $\lambda_{max}$ 496 ($\epsilon_{496}$ 113500) nm; accurate FAB mass spectrum (m/z) for M$^+$ $C_{25}H_{37}N_3$, calcd 379.2987, found 379.2979; elemental analysis, calcd: C, 79.11, H, 9.82, N 11.07, found: C, 78.81, H, 10.01, N 10.97.

Example 2

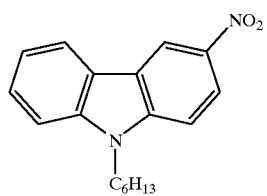

To a mixture of carbazole (10.03 g, 60.00 mmol), sodium hydroxide (35 mL, aqueous 50%), benzene (5 mL), and benzyltriethyl ammonium chloride [BTEAC] (0.410 g, 1.8 mmol), 1-bromohexane (12.63 mL, 90 mmol) were added dropwise while stirred. The reaction mixture was stirred at room temperature for 2 h then was poured into water and left overnight. The precipitated solid was collected, washed with water and dried to afford 12.22 g (80%) of 9-hexacarbazole.

To a solution of compound 9-hexacarbazole (12.22 g, 48.61 mmol) in acetic acid (200 mL), nitric acid (5.25 mL, 70%, 58.23 mmol) was added dropwise. After standing one hour at room temperature, the mixture was added slowly to a saturated solution of sodium carbonate (500 mL). The precipitated was collected and purified by flash chromatography using 10:100 (dichloromethane:hexane) to afford 11.52 g (80%) product. $^1$H NMR (300 MHz, CDCl$_3$): δ 8.95 (d, J=2.05 Hz, 1 H), 8.35 (dd, J=2.1, 9.3 Hz, 1 H), 8.11 (d, J=7.74 Hz, 1 H), 7.59–7.31 (m, 4 H), 4.30 (t, J=7.19 Hz, 2 H), 1.87 (p, J=7.10 Hz, 2 H), 1.31 (m, 6 H), 0.87 (t, J=6.77 Hz, 3 H). $^{13}$C NMR (75 MHz, CDCl$_3$): 144.01, 142.12, 141.02, 127.90, 123.33, 123.018, 122.09, 121.48, 121.24, 117.80, 110.23, 108.75.

Example 3

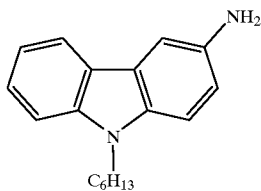

To a solution of the title compound in example 2 (2.20 g, 7.42 mmol) in methanol (50 mL) and hydrochloric acid (36%, 30 mL), tin(II) chloride dihydrate (9.20 g, 40.0 mmol) was added. The mixture was heated to reflux overnight. The methanol was removed under reduced pressure. The solid was collected by filtration then added to a saturated solution of sodium carbonate (50 mL). The mixture was extracted by dichloromethane 3 times. The combined organic layers were dried over magnesium sulfate. Solvent was evaporated under reduced pressure to afford product 1.78 g (91%). $^1$H NMR (300 MHz, CDCl$_3$): δ 8.09 (d, J=7.72 Hz, 1 H), 7.58–7.26 (m, 5 H), 6.96 (dd, J=8.53, 2.12 Hz, 1 H), 4.27 (t, J=7.14 Hz, 2H), 3.65 (s, 3 H), 1.90 (p,J =6.90 Hz, 2 H), 1.39 (br s, 6 H), 0.98 (t, J=6.60 Hz, 3 H). $^{13}$C NMR (75 MHz, CDCl$_3$): 141.58, 139.69, 126.07, 124.19, 123.03, 121.06, 118.63, 116.24, 109.89, 109.27, 106.89, 43.71, 32.30, 29.68, 27.66, 23.27, 14.78. HRMS calcd for $C_{18}H_{22}N_2$ 266.1783, found 266.1792.

Example 4

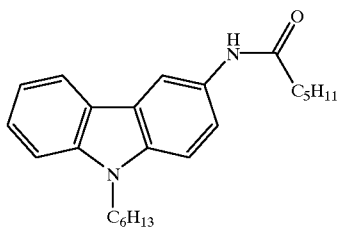

To a solution of the title compound in example 3 (1.78 g, 6.69 mmol) in THF (25 mL), hexanoyl chloride (1.24 mL, 8.90 mmol) was added. The mixture was stirred overnight. After removing the solvent, the residue was recrystallized in hexane. The product was collected by filtration then dried in vacuo to afford 2.16 g (89%) the title compound. $^1$H NMR (300 MHz, CDCl-$_3$): δ 8.34 (s, 1 H), 8.02 (d, J=7.59 Hz, 1 H), 7.86 (s, 1 H), 7.54–7.20 (m, 5 H), 4.21 (s, 2 H), 2.42 (t, J=7.60 Hz, 2H), 1.83–1.79 (m, 4 H), 1.40–1.33 (m, 12 H), 0.97–0.91 (m, 6 H). $^{13}$C NMR (75 MHz, CDCl$_3$): 172.33, 141.42, 138.18, 130.40, 126.26, 123.36, 123.24, 121.12, 120.18, 119.14, 113.42, 109.25, 109.12, 43.63, 38.71, 32.13, 29.49, 27.50, 26.15, 23.11, 14.59, 14.56.

Example 5

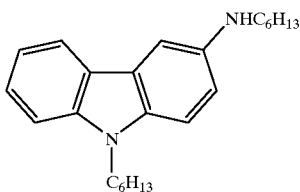

The title compound in example 4 (1.00 g, 2.74 mmol) was added to toluene (50 mL) under argon. Borane dimethylsulfide [$BH_3SMe_2$] (2.06 mL, 2.0 M in toluene, 4.11 mmol) was added dropwise at 0° C. to the mixture. The reaction mixture was stirred at 0° C. for 15 min. then was heated to reflux. After 2 h, the flask was cooled at room temperature, sodium carbonate (20 mL, 10% aqueous) was added and the reaction mixture was stirred at room temperature for 30 min. The toluene layer was separated and dried over magnesium sulfate, and the solvent was evaporated to afford 0.8846 g (92%) product. $^1$H NMR (300 MHz, $CDCl_3$): δ 8.23 (d, J=7.66 Hz, 1 H), 7.63–7.34 (m, 5 H), 7.02 (d, J=8.54 Hz, 1 H), 4.35 (t, J=7.00 Hz, 2 H), 3.56 (s, 1H), 3.40 (t, J=6.93 Hz, 2 H), 1.96 (t, J=6.73 Hz, 2 H), 1.82 (t, J=6.99 Hz, 2 H), 1.75–1.54 (m, 12 H), 1.48–1.06 (m, 6 H). $^{13}$C NMR (75 MHz, $CDCl_3$): 142.85, 141.51, 135.12, 125.88, 124.24, 123.32, 120.98, 118.51, 115.22, 110.00, 109.24, 103.77, 46.31, 43.72, 32.52, 32.37, 30.53, 29.78, 27.78, 27.71, 23.46, 23.32, 14.87, 14.80.

Example 6

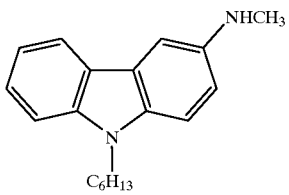

Formic acid (3.45 mL, 96%, 87.60 mmol) was added dropwise to acetic anhydride (7.03 mL, 74.36 mmol) in a dry 50 mL flask equipped with a reflux condenser under a stream of dry nitrogen. The mixture was maintained at 0° C. for 10 min, then heated at 50–60° C. for 2 h to form formic anhydride transiently. The mixture of formic anhydride was cooled to room temperature and THF (10 mL) was added. To a solution of the title compound in example 3], formic anhydride in THF (7.62 g, 28.60 mmol) was added, then the mixture was stirred for overnight. Sodium bicarbonate was added slowly to the mixture until the solution was basic. The mixture was extracted with dichloromethane 3 times. The combined organic layers were dried over magnesium sulfate and the solvent was evaporated to afford 7.15 g (85%) of product.

This formanilide (0.50 g, 1.70 mmol) was dissolved in dry THF (10 mL). The solution was cooled to 0° C., and borane methylsulfide complex (0.85 mL, 2.0 M in toluene, 1.70 mmol) was added dropwise. After vigorous reaction ceased, the resulting mixture was brought to gentle reflux for 2 h. The reaction mixture was cooled to 0° C., then methanol (10 mL) was added slowly, and the mixture was stirred for 1 h. Hydrochloric acid (2.5 mL) was added and the mixture was heated to reflux for 1 h. After cooling to room temperature, the mixture was made basic (sodium carbonate, water) and extracted with ether 3 times. The combined organic layers were dried over magnesium sulfate to remove solvent. The product was purified by flash chromatography with ethyl acetate: hexane (1:10) on silica gel to give 0.35 g (73%) the title compound. $^1$H NMR (300 MHz, $CDCl_3$): δ 8.29 (d, J=7.67 Hz, 1 H), 7.70–7.41 (m, 5 H), 7.02 (dd, J=8.57, 1.79 Hz, 1 H), 4.37 (t, J=7.03 Hz, 3 H), 3.67 (s, 1 H), 3.09 (s, 3 H), 2.00 (br t, J=6.50 Hz, 2 H), 1.51 (br s, 6 H), 1.11 (br s, 3 H). $^{13}$C NMR (75 MHz, $CDCl_3$): δ 143.86, 141.67, 135.28, 125.92, 124.39, 123.47, 121.00, 118.59, 114.84, 110.02, 109.29, 103.29, 43.77, 32.74, 32.31, 29.73, 27.66, 23.23, 14.66.

Example 7

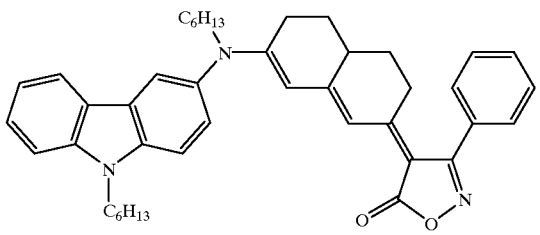

A solution of the title compound in example 5 (0.8846 g, 2.52 mmol) and compound C (0.8110 g, 2.52 mmol) in pyridine (15 mL) was heated to reflux for 24 h. The pyridine was evaporated in vacuo and the residue was purified by flash chromatography with hexane: acetone (4:1) on silica gel to give 0.10 g (6.2%) the title compound. IH NMR (300 MHz, $CDCl_3$): δ 8.09 (d, J=7.67 Hz, 1 H), 7.84 (br s, 1 H), 7.58–7.27 (m, 10 H), 4.38 (br, 2 H), 4.00–3.5 (br, 3 H), 2.75–2.15 (br, 4 H), 2.00–1.55 (br, 4 H), 1.60–1.10 (br, H), 0.91 (br, 6 H). MS cald for $C_{43}H_{49}N_3O_2$ 639, found 639.

Example 8

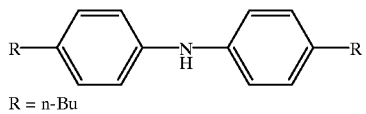

R = n-Bu

To a solution of tris(dibenzylideneacetone)dipalladium [$Pd_2(dba)_3$] (1.074 g, 1.17 mmol) and bis (diphenylphosphino) ferrocene [DPPF] (0.9754 g, 1.76 mmol) in toluene (300 mL) under nitrogen atmosphere was added 1-bromo-4-butylbenzene (25 mL, 117.30 mmol) at room temperature and the resultant mixture was stirred for 10 min. Sodium tert-butoxide (13.53 g, 140.77 mmol) and n-butylaniline (22.23 mL, 140.77 mmol) were added to the mixture and stirred at 90° C. for 12 h. Following the standard workup procedure, the reaction mixture was purified by flash column chromatography using 10:100 (dichloromethane:hexane) to afford 29.62 g (90%) of product. $^1$H NMR (300 MHz, $CDCl_3$): δ 7.20 (d, J=8.36 Hz, 4 H), 7.02 (d, J=8.36, 4 H), 5.58 (s, 1 H), 2.60 (t, J=7.67 Hz, 4 H), 1.63 (p, J=7.82 Hz, 4 H), 1.42 (sext, J=7.28 Hz, 4 H), 0.84 (t, J=7.30 Hz, 6H). $^{13}$C NMR (75 MHz, $CDCl_3$): 141.81, 135.88, 129.71, 118.34, 35.48, 34.45, 22.94, 14.58.

Example 9

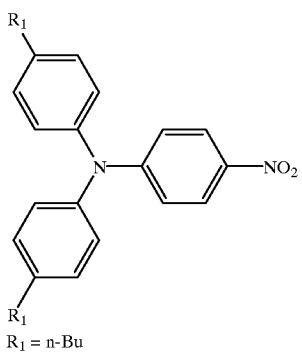

R₁ = n-Bu

To a solution of tris(dibenzylideneacetone)dipalladium (1.1564 g, 1.2629 mmol) and bis(diphenylphosphino) ferrocene (1.0502 g, 1.8944 mmol) in toluene (300 mL) under nitrogen atmosphere was added 1-iodo-4-nitrobenzene (31.45, 126.288 mmol) at room temperature and the resultant mixture was stirred for 10 min. Sodium tert-butoxide (12.14 g, 126.29 mmol) and the title compound in example 8 (29.62 g, 105.24 mmol) were added to the mixture and stirred at 90° C. for 12 h. Following the standard workup procedure, the reaction mixture was purified by flash column chromatography using 10:100 (ethyl acetate: hexane) to afford 17.0 g (40%) of product. $^1$H NMR (300 MHz, CDCl$_3$): δ 8.04 (d, J=9.16 Hz, 2 H), 7.22 (d, J=8.16 Hz, 4 H), 7.14 (d, J=8.14 Hz, 4 H), 6.90 (d, J=9.16 Hz, 2 H), 2.66 (t, J=7.90 Hz, 4 H), 1.64 (p, J=7.90 Hz, 4 H), 1.43 (sext, J=7.33 Hz, 4 H), 1.00 (t, J=7.24 Hz, 6 H). $^{13}$C NMR (75 MHz, CDCl$_3$): δ 154.37, 143.62, 141.29, 140.00, 130.39, 127.06, 126.02, 117.60, 35.75, 34.13, 23.00, 14.56. HRMS cald for C$_{26}$H$_{30}$N$_2$O$_2$ 402.2307, found 402.2294.

Example 10

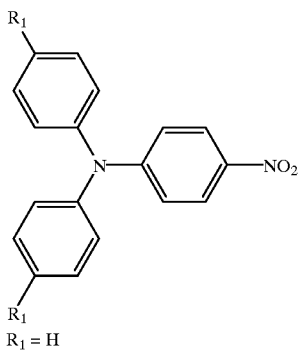

R₁ = H

To a solution of tris(dibenzylideneacetone)dipalladium (1.007 g, 0.11 mmol) and bis(diphenylphosphino) ferrocene (0.915 g, 0.165 mmol) in toluene (300 mL) under nitrogen atmosphere was added 1-iodo-4-nitrobenzene (27.39 g, 110.00 mmol) at room temperature and the resultant mixture was stirred for 10 min. Sodium tert-butoxide (12.00 g, 125.00 mmol) and diphenylamine (16.923 g, 100 mmol) were added to the mixture and stirred at 90° C. for 12 h. Following the standard workup procedure, the reaction mixture was purified by flash column chromatography using 10:100 (ethyl acetate:hexane) to afford 14.0 g (48%) of product. $^1$H NMR (300 MHz, CDCl$_3$): δ 8.08 (d, J=9.27 Hz, 2 H), 7.44–7.39 (m, 4 H), 7.39–7.24 (m, 6 H), 6.97 (d, J=9.28 Hz, 2 H) $^{13}$C NMR (75 MHz, CDCl$_3$): δ 154.03, 146.19, 140.68, 130.49, 127.08, 126.30, 126.02, 118.67.

Example 11

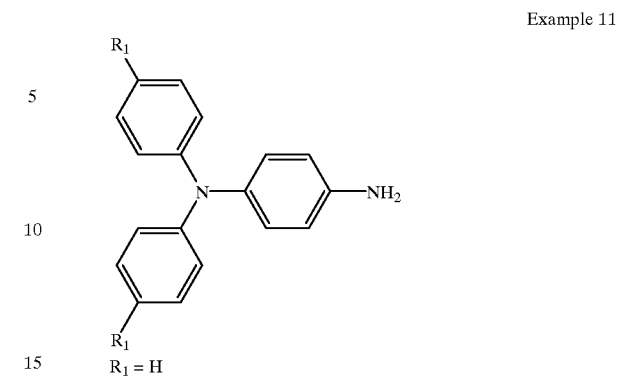

R₁ = H

To a solution of the title compound in example 10 (6.50 g, 16.15 mmol) in methanol (250 mL) and hydrochloric acid (36%, 100 mL), tin(II) chloride dihydrate (19.5 g, 86.42 mmol) was added. The mixture was heated to reflux overnight. The methanol was removed under reduced pressure. The solid was collected by filtration then added to a saturated solution of sodium carbonate (100 mL). The mixture was extracted by dichloromethane 3 times. The combined organic layers were dried over magnesium sulfate. The solvent was evaporated under reduced pressure. The crude products were purified by flash chromatography using 20:100 (ethyl acetate:hexane) to afford 5.50 g (91%) of product. $^1$H NMR (300 MHz, CDCl$_3$): δ 7.12–7.03 (m, 10 H), 6.69 (d, J=8.54 Hz, 2 H), 3.54 (br s, 2 H), 2.64 (t, J=7.83 Hz, 4 H), 1.69 (t, J=7.81 Hz, 4 H), 1.47 (sext, J=7.44 Hz, 4 H), 1.04 (t, J=7.27 Hz, 6 H). $^{13}$C NMR (75 MHz, CDCl$_3$): δ 146.77, 143.13, 140.05, 136.47, 129.47, 127.91, 123.08, 116.72, 35.60, 34.40, 23.08, 14.67.

Example 12

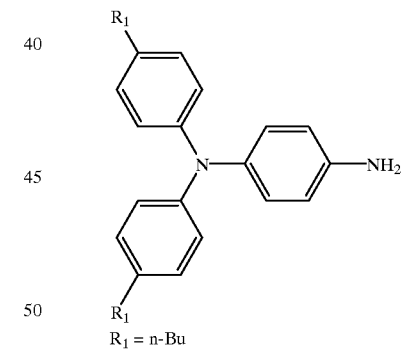

R₁ = n-Bu

To a solution of the title compound in example 8 (9.00 g, 31.00 mmol) in methanol (300 mL) and hydrochloric acid (36%, 100 mL), tin(II) chloride dihydrate (36 g, 160 mmol) was added. The mixture was heated to reflux overnight. The methanol was removed under reduced pressure. The solid was collected by filtration then added to a saturated solution of sodium carbonate (100 mL). The mixture was extracted by dichloromethane 3 times. The combined organic layers were dried over magnesium sulfate. The solvent was evaporated under reduced pressure to afford 8.10 g (100%) of product. $^1$H NMR (300 MHz, CDCl$_3$): δ 7.30–7.25 (m, 4 H), 7.14–6.97 (m, 8 H), 6.70 (d, J=8.58 Hz, 2 H), 3.63 (br s, 2 H). $^{13}$C NMR (75 MHz, CDCl$_3$): δ 148.58, 143.54, 139.53, 129.60, 128.42, 123.13, 122.08, 116.82.

Example 13

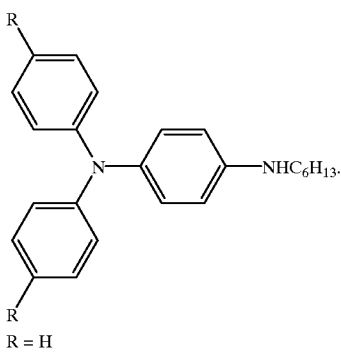

R = H

To a solution of the title compound in example 11 (3.00 g, 11.48 mmol) in THF (50 mL), hexanoyl chloride (1.92 mL, 13.77 mmol) was added. The mixture was stirred overnight. After removing the solvent, the residue was recrystallized in hexane. The product was collected by filtration then dried in vacuo. The dried product was added to toluene (50 mL) under argon. Borane-dimethylsulfide (6.11 mL, 2.0 M in toluene, 12.22 mmol) was added dropwise at 0° C. above mixture. The reaction mixture was stirred at 0° C. for 15 min. then was refluxed for 2 h. After mixture was cooled to room temperature, sodium carbonate (20 mL, 10% aqueous) was added and the reaction mixture was stirred at 20° C. for 30 min. The toluene layer was separated and dried over magnesium sulfate, and the solvent was evaporated to afford 3.08 g (78%) product. $^1$H NMR (300 MHz, CDCl$_3$): δ 7.52–7.00 (m, 10 H), 6.77 (d, J=8.24 Hz, 2 H), 3.74 (br s, 1 H), 3.33 (t, J=6.70 Hz, 2 H), 1.87–1.85 (br, 2 H), 1.63–1.21 (br, 6 H), 1.19 (br, 3 H). $^{13}$C NMR (75 MHz, CDCl$_3$): δ 149.19, 146.39, 138.16, 129.78, 128.92, 123.14, 122.07, 114.35, 45.06, 32.54, 30.44, 27.75, 23.54, 15.01.

Example 14

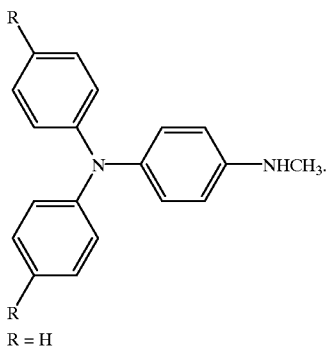

R = H

Formic acid (1.34 mL, 96%, 34.00 mmol) was added dropwise to acetic anhydride (2.74 mL, 28.94 mmol) in a dry 50 mL flask equipped with a reflux condenser under a stream of dry nitrogen. The mixture was maintained at 0° C. for 10 min, then heated at 50–60° C. for 2 h. The mixture was cooled to room temperature and THF (10 mL) was added. The title compound in example 11 (2.91 g, 11.13 mmol) was added, then the mixture was stirred for overnight. Sodium bicarbonate was added slowly to the mixture until the solution was basic. The mixture was extracted with dichloromethane 3 times. The combined organic layers were dried over magnesium sulfate and the solvent was evaporated to afford 3.19 g (99.4%) of product.

The formanilide (3.19 g, 11.06 mmol) was dissolved in dry THF (35 mL). The solution was cooled to 0° C., and boranemethylsulfide complex (11 mL, 2.0 M in toluene, 22.13 mmol) was added dropwise. After vigorous reaction ceased, the resulting mixture was brought to gentle reflux for 2 h. The reaction mixture was cooled to 0° C., then methanol (10 mL) was added slowly and the mixture was stirred for 1 h. Hydrochloric acid (2.5 mL) was added and the mixture was heated to reflux for 1 h. After cooling to room temperature, the mixture was made basic (sodium carbonate, water) and extracted with ether 3 times. The combined organic layers were dried over magnesium sulfate, removal of solvent gave 2.83 g (93.4%) of the product. $^1$H NMR (300 MHz, CDCl$_3$): δ 7.50–7.00 (m, 12 H), 6.68 (d, J=8.69 Hz, 2 H), 3.60 (br s, 1 H), 2.93 (s, 3 H). $^{13}$C NMR (75 MHz, CDCl$_3$): δ 149.04, 146.97, 138.31, 129.61, 128.71, 123.01, 121.96, 113.98, 31.64.

Example 15

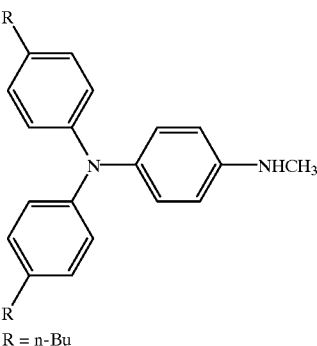

R = n-Bu

This compound was synthesized in the same manner as described for compound example 14. Yield is 86%. $^1$H NMR (300 MHz, CDCl$_3$): δ 7.40–7.00 (m, 10 H), 6.68 (d, J=8.60 Hz, 2 H), 3.67 (br s, 1 H), 2.94 (s, 3 H), 2.71 (t, J=7.83 Hz, 4 H), 1.75 (p, J=7.9 Hz, 4 H), 1.52 (sext, J=7.5 Hz, 4 H), 1.11 (t, J=7.3 Hz, 6 H). $^{13}$C NMR (75 MHz, CDCl$_3$): δ 147.05, 146.58, 138.97, 136.30, 129.45, 128.18, 123.03, 113.91, 35.61, 34.33, 31.62, 23.04, 14.57.

Example 16

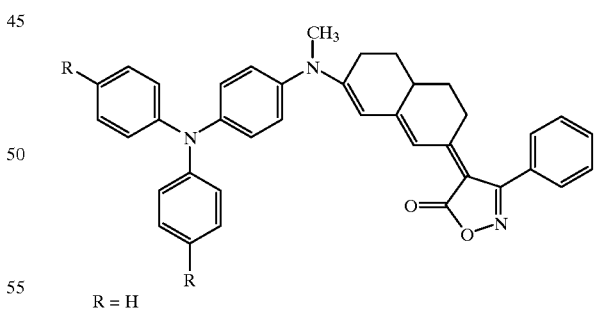

R = H

A solution of the title compound in example 14 (2.83 g, 10.33 mmol) and compound C (1.50 g, 4.67 mmol) in pyridine (10 mL) was heated to reflux overnight. The pyridine was evaporated itn vacuo and the residue was purified by flash chromatography with hexane: acetone (4:1) on silica gel to give 1.37 g (52%) the title compound. $^1$H NMR (300 MHz, CDCl$_3$): δ $^{13}$C NMR (75 MHz, CDCl$_3$): δ 7.84 (br, 1 H), 7.55 (br s, 5 H), 7.37–7.27 (m, 4 H), 7.21–7.11 (m, 5 H), 7.11–7.05 (m, 2 H), 7.02–7.92 (d, J=8.66 Hz, 2 H), 5.80 (br s, 1 H), 3.38 (br s, 3 H), 2.60–2.20

(br m, 5H), 2.02–1.60 (br m, 2 H), 1.60–1.30 (m br, 2 H). HRMS cald for $C_{38}H_{33}N_3O_2$ 564.2651, found 564.2631. Anal. calcd for $C_{38}H_{33}N_3O_2$: C, 80.96; H, 5.9; N, 7.45. Found; C, 80.46; H, 5.97; N, 7.14.

Example 17

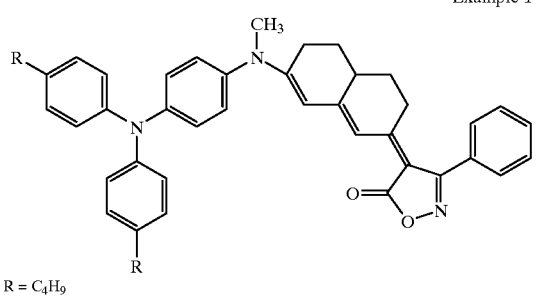

R = $C_4H_9$

A solution of the title compound in example 15 (2.67 g, 6.67 mmol) and compound C (1.61 g, 5.00 mmol) in pyridine (10 mL) was refluxed overnight. The pyridine was evaporated in vacuo and the residue was purified by flash chromatography with hexane: acetone (4:1) on silica gel to give 2.15 g (64%) the title compound. $^1$H NMR (300 MHz, CDCl$_3$): δ 7.38 (br, 5 H), 7.15 (d, J=8.25 Hz, 4 H), 7.08 (d, J=8.23 Hz, 4 H), 7.00 (d, J=8.70 Hz, 2 H), 6.92 (d, J=8.70 Hz, 2 H), 5.60 (br s, 1 H), 3.37 (s, 3 H), 2.62 (t, J=7.76 Hz, 4 H), 2.44–2.33 (m, 5 H), 1.92–1.81 (m, 3 H), 1.64 (p, J=7.67 Hz, 4 H), 1.41 (sext, J=7.04 Hz, 4 H), 0.98 (t, J=7.23 Hz, 6 H). $^{13}$C NMR (75 MHz, CDCl$_3$): δ 202.51, 185.73, 173,51, 167.37, 163.29, 163.00, 162.67, 148.69, 135.25, 139.30, 137.61, 133.75, 129.93, 129.51, 129.49, 128.76, 127.32, 125.84, 122.15, 115.99, 103.87, 100.56, 100.52, 41.96, 36.28, 35.57, 34.03, 30.08 29.88, 29.67, 22.87, 14.40, 14.34 $\lambda_{max}$=540 nm. HRMS cald for $C_{46}H_{50}N_3O_2$ 676.3903, found 676.3932. Anal. calcd for $C_{46}H_{50}N_3O_2$: C, 81.74; H, 7.30; N, 6.21. Found; C, 81.81; H, 7.27; N, 6.19.

Example 18

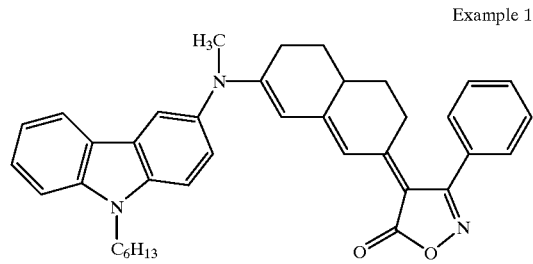

A solution of the title compound in example 6 (3.41 g, 12.17 mmol) and compound C (3.13 g, 9.74 mmol) in pyridine (5.0 mL) was heated to reflux overnight. The pyridine was evaporated in vacuo and the residue was purified by flash chromatography with hexane: acetone (4:1) on silica gel to give 4.00 g (72%) the title compound. $^1$H NMR (300 MHz, CDCl$_3$): δ 8.09 (d, J=7.74 Hz, 1 H), 7.88 (d, J=1.58 Hz, 1 H), 7.60–7.20 (m, 11 H), 5.65 (br s, 1 H), 4.35 (t, J=7.23 Hz, 2 H), 3.50 (s, 3 H), 2.60–2.20 (br m, 4 H), 2.00–1.70 (br m, 4 H), 1.60–1.20 (br m, 6 H), 0.91 (t, J=6.83 Hz, 3H). $^{13}$C NMR (75 MHz, CDCl$_3$): δ 173.60, 167.73, 163.92, 163.33, 162.57, 141.82, 140.00, 136.76, 133.81, 129.49, 129.42, 128.75, 127.17, 124.17, 124.14, 122.82, 121.06, 120.00, 118.69 110.16, 109.69, 103.84, 100.15, 43.94, 42.53, 36.26, 32.02, 30.05, 29.88, 29.85, 29.45 27.45, 22.99, 14.36 $\lambda_{max}$=540 nm. HRMS cald for $C_{38}H_{40}N_3O_2$ 570.3121, found 570.3127. Anal. calcd for $C_{38}H_{40}N_3O_2$: C, 80.10; H, 6.89; N, 7.32. Found; C, 79.92; H, 7.01; N, 7.32.

Example 19

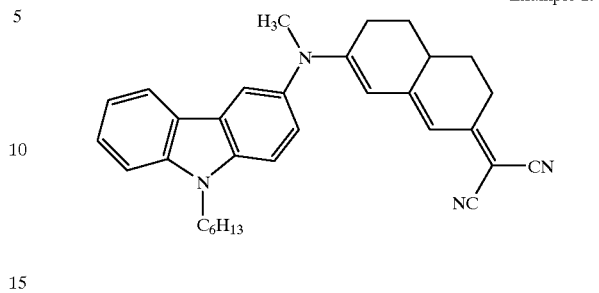

The title compound in example 6 (5.00 g, 17.84 mmol) and compound D (3.00 g, 13.20 mmol) was heated to 170° C. under argon for 2 days. The residue was purified by flash chromatography with hexane: acetone: dichloromethane (100:10:10) on silica gel to give 4.38 g (70%) the title compound. $^1$H NMR (300 MHz, CDCl$_3$): δ 8.10 (d, J=7.72 Hz, 1H), 7.88 (d, J=1.31 Hz, 1H), 7.58–7.46 (m, 3 H), 7.33–7.22 (m, 2 H), 6.29 (s, 1 H), 5.57 (s, 1 H), 4.36 (t, J=7.18 Hz, 2 H), 3.50 (s, 3 H), 2.95 (br, 1H), 2.57–2.37 (m, 4 H), 2.02–1.91 (m, 4 H), 1.58–1.30 (m, 8 H), 0.92 (t, J=6.8 Hz, 3 H). $^{13}$C NMR (75 MHz, CDCl$_3$): δ 68.86, 163.91, 162.34, 141.75, 139.86, 136.97, 127.13, 124.48, 124.08, 122.77, 121.03, 119.95, 118.94, 117.53, 116.83, 112.73, 110.14, 109.72, 101.16, 63.93, 43.93, 42.33, 36.17, 32.08, 30.02, 29.97, 29.66, 29.50, 29.45, 29.36, 27.51, 23.07, 14,51. $\lambda_{max}$=491 nm HRMS cald for $C_{32}H_{34}N_4$ 474.2783, found 474.2799.

Example 20

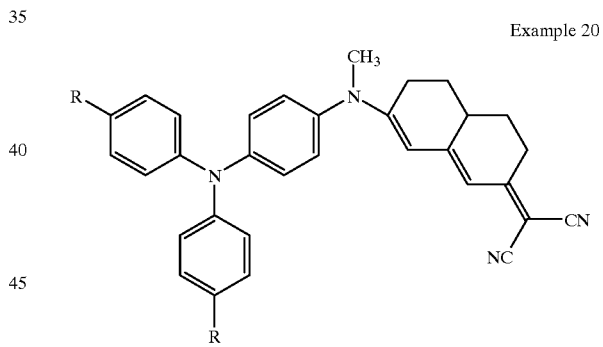

The title compound in example 15 (6.01 g, 15.00 mmol) and compound D (3.20 g, 14.08 mmol) was heated to 170° C. under Argon for 2 days. The residue was purified by flash chromatography with hexane:acetone:dichloromethane (100:10:30) on silica gel to give 4.08 g (50%) the title compound. $^1$H NMR (300 MHz, CDCl$_3$): δ 7.15 (d, J=8.34 Hz, 4H), 7.08 (d, J=8.34 Hz, 4 H), 7.03 (d, J=8.75 Hz, 2 H), 6.94 (d, J=8.75 Hz, 2 H), 6.29 (s, 1 H), 5.54 (s, 1 H), 3.37 (s, 3 H), 3.50 (s, 3 H), 2.95 (br, 1 H), 2.62 (t, J=7.53 Hz, 4 H), 2.56–2.36 (m, 5 H), 2.04–1.95 (m, 2 H), 1.64 (p, J=7.84Hz, 4 H), 1.55–1.35 (m, 5 H), 0.98 (t, J=7.26 Hz, 6 H). $^{13}$C NMR (75 MHz, CDCl$_3$): δ 168.87, 163.83, 161.65, 148.43, 145.30, 139.15, 137.98, 129,95, 127.56, 125.78, 122.27, 117.45, 116.79, 112.81, 101.28, 64.10, 41.81, 36.19, 35.62, 34.14, 30.04, 29.98, 29.54, 29.46, 22.95, 14,50. $\lambda_{max}$=490 nm. HRMS cald for $C_{40}H_{44}N_4$ 580.3566, found 580.3577.

Example 21

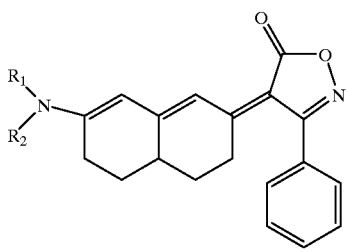

R₁ = Me, R₂ = phenyl

A solution of N-methyl aniline (1.156 g, 3.60 mmol) and compound C (1.54 g, 14.39 mmol) in pyridine (15 mL) was heated to reflux for 5 h. The pyridine was evaporated in vacuo and the residue was purified by flash chromatography with hexane: acetone (4:1) on silica gel to give 0.92 g (67%) the title compound. $^1$H NMR (300 MHz, CDCl$_3$): δ 7.8 (br s, 1H), 7.6–7.3 (m, 7 H), 7.2 (m, 2 H), 5.8 (br s, 1 H), 3.8 (br s, 3 H), 2.6–2.1 (m, 5 H), 1.8 (m, 2 H), 1.5–1.2 (m, 2 H). $^{13}$C NMR (75 MHz, CDCl$_3$): 164.1, 145.0, 133.6, 130.5, 129.6, 129.4, 128.9, 128.7, 127.0, 115.9, 42.1, 36.0, 29.0, 29.7.

Example 22

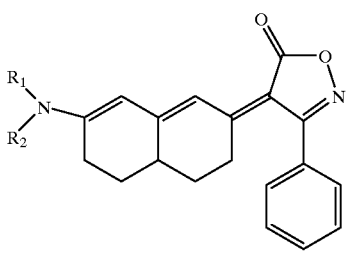

R₁ = R₂ = hexyl

This compound was synthesized in the same manner as described for the title compound in example 21. (m, 2 H), 2.6 (m, 2 H), 2.40–1.80 (m, 3 H), 1.7 (br s, 4 H), 1.4 (br s, 14 H), 0.80 (s, 6 H). UV-Vis $\lambda_{max}$=532 nm.

Example 23

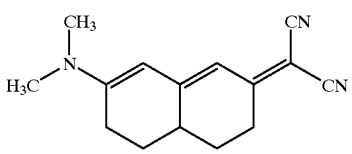

Dimethylamino hydrochloride (0.538 g, 6.60 mmol), triethylamine (5.0 mL), compound D and water (0.5 mL) was added to a screw cap tube at 0° C. The tube was capped, then was heated to 80° C. for 2 h. After cooling to room temperature, the mixture was purified by flash chromatography with hexane:acetone (10:3) on silica gel to give 0.33 g (62%) the title compound. $^1$H NMR (300 MHz, CDCl$_3$): δ 6.21 (s, 1 H), 5.42 (s, 1 H), 3.21 (s, 6 H), 2.92 (br, 1 H), 2.87 (br, 1H), 2.53–2.28 (m, 3 H), 2.08–1.98 (m, 2 H), 1.59–1.39 (m, 2 H). $^{13}$C NMR (75 MHz, CDCl$_3$): δ 170.92, 166.47, 164.69, 120.30, 119.59, 114.21, 102.34, 43.17, 38.07, 32.27, 32.10, 31.74, 30.70. $\lambda_{max}$=485 nm.

Example 24

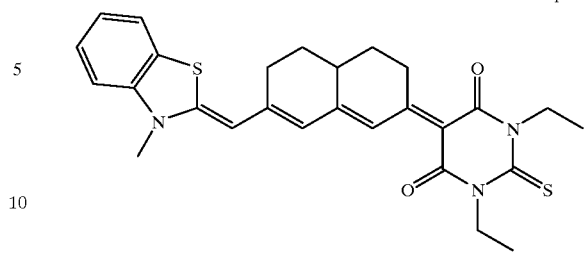

This compound was synthesized in the same manner as described in general synthetic method 1. $^1$H NMR (CDCl$_3$) δ 8.20 (s, 1H), 7.61 (d, J=7.7 Hz, 1H), 7.45 (t, J=7.7 Hz, 1H), 7.27–7.19 (m, 2H), 6.49 (s, 1H), 5.78 (s, 1H), 4.,62–4.50 (m, 4H), 3.64 (s, 3H), 3.60–3.50 (m, 1H), 3.00–2.10 (m, 4H), 2.00 (m, 2H), 1.57–1.47 (m, 2H), 1.31 (t, J=6.9 Hz, 6H); UV (CHCl$_3$) $\lambda_{max}$ 698 ($\epsilon_{698}$ 190000) nm; accurate FAB mass spectrum (m/z) for M$^+$ C$_{27}$H$_{29}$N$_3$O$_2$S$_2$, calcd 491.1701, found 434.1783.

Example 25

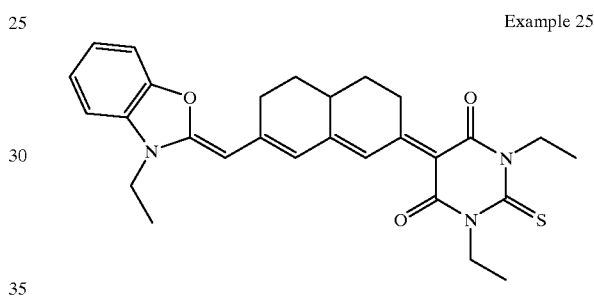

This compound was synthesized in the same manner as described in general synthetic method 1. $^1$H NMR (CDCl$_3$) δ 8.19 (s, 1H), 7.45 (d, J=7.5 Hz, 1H), 7.40–7.20 (m, 2H), 7.10 (d, J=7.6 Hz, 1H), 6.72 (s, broad, 1H), 5.04 (s, 1H), 4.61 (m, 4H), 3.99 (q, J=7.2 Hz), 2H), 3.60–3.43 (m, 1H), 2.95 (m, 2.95 (m, 2H), 2.75 (m, 2H), 2.45 (m, 2H), 2.00 (m, 2H), 1.45 (t, J=7.1 Hz, 3H), 1.32 (t, J=6.9 Hz, 6H), UV (CHCl$_3$) $\lambda_{max}$ 672 ($\epsilon_{672}$ 250000) nm; accurate FAB mass spectrum (m/z) for M$^+$ C$_{28}$H$_{31}$N$_3$O$_3$S, calcd 489.2086, found 489.2083; elemental analysis, calcd: C, 68.69, H, 6.38, N 8.58, found: C, 68.24, H, 6.93, N 8.23.

Example 26

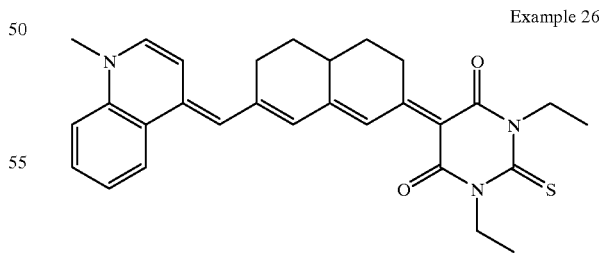

This compound was synthesized in the same manner as described in general synthetic method 1. $^1$H NMR (CDCl$_3$) δ 8.18 (d, J=8.2 Hz, 1H), 7.97 (s, 1H), 7.74 (t, J=7.7 Hz, 1H), 7.56–7.49 (m, 3H), 7.17 (d, 7.3 Hz, 1H), 6.66 (s, 1H), 6.47 (s, 1H), 4.62–4.55 (m, 4H), 3.92–3.42 (m, 1H), 3.00–2.60 (m, 4H), 2.46 (m, 2H), 1.97 (m, 2H), 1.56 (s, 3H), 1.32 (t, J=6.9 Hz, 6H); UV (CHCl$_3$) $\lambda_{max}$ 800 ($\epsilon_{800}$ 78500) nm.

Example 27

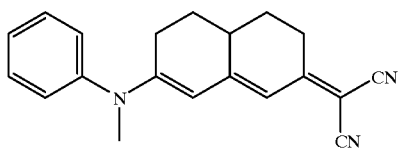

This compound was synthesized in the same manner as described for the title compound in example 1. $^1$H NMR (CDCl$_3$) δ 7.46–7.34 (m, 3H), 7.14–7.11 (m, 2H), 6.28 (s, 1H), 5.49 (s, 1H), 3.34 (s, 3H), 2.96–2.91 (m, 1H), 2.50–2.33 (m, 4H), 2.00–1.87 (m, 2H), 1.54–1.43 (m, 2H), accurate FAB mass spectrum (mn/z) for M$^+$ C$_{20}$H$_{19}$N$_3$, calcd 301.1579, found 301.1569; elemental analysis, calcd: C, 79.70, H, 6.35, N 13.94, found: C, 79.73, H, 6.32, N 14.62.

Example 28

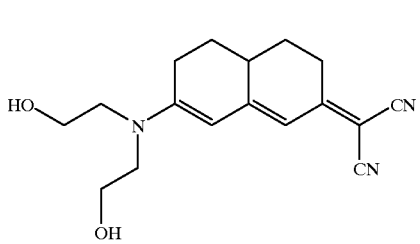

This compound was synthesized in the same manner as described for the title compound in example 1. $^1$H NMR (d$_6$-acetone) δ 6.05 (s, 1H), 5.73 (s, 1H), 4.17 (m, 2H), 3.82–3.65 (M, 8H), 3.00–2.94 (M, 1H), 2.78–2.37 (m, 6H), 1.47–1.36 (m, 2H), UV (CHCl$_3$) λ$_{max}$ 490 (ε$_{490}$ 80000) nm; accurate FAB mass spectrum (m/z) for M$^+$ C$_{17}$H$_{21}$N$_3$O$_2$, calcd 299.1634, found 299.1634; elemental analysis, calcd: C, 68.21, H, 7.07, N 14.04, found: C, 68.61, H, 7.05, N 14.49.

Example 29

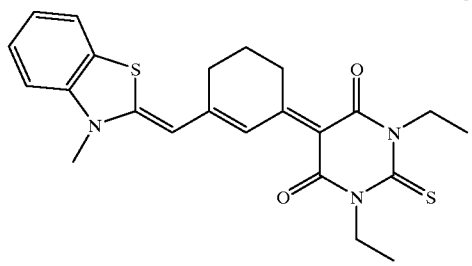

This compound was synthesized in the same manner as described in general synthetic method 1. $^1$H NMR (CDCl$_3$) δ 8.43 (s, 1H), 7.70 (d, J=7.7 Hz, 1H), 7.51 (t, J=7.7 Hz, 1H), 7.32 (t, J=8.4 Hz, 2H), 6.20 (s, broad, 1H), 4.60 (q, J=6.9 Hz, 4H), 3.73 (s, 3H), 3.18 (t, J=6.2 Hz, 2H), 2.72 (t, J=6.0 Hz), 2.05–1.94 (m, 2H), 1.32 (t, J=6.9 Hz; UV (CHCl$_3$) λ$_{max}$ 606 (ε$_{606}$ 110000) nm; accurate FAB mass spectrum (m/z) for M$^+$ C$_{23}$H$_{25}$N$_3$O$_2$S$_2$, calcd 439.1388, found 439.141 1; elemental analysis, calcd: C, 62.84, H, 5.73, N 9.56, found: C, 62.03, H, 6.16, N 9.12.

Example 30

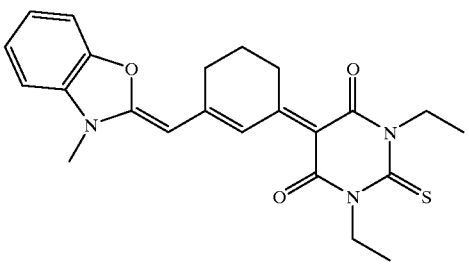

This compound was synthesized in the same manner as described in general synthetic method 1. $^1$H NMR (CDCl$_3$) δ 8.30 (s, broad, 1H), 7.47–7.27 (m, 3H), 7.18 (d, J=7.7 Hz, 1H), 5.60 (s, broad, 1H), 4.60 (q, J=6.9 Hz, 4H), 4.05 (q, J=7.2 Hz, 2H), 3.18 (t, J=6.1 Hz, 2H), 3.00 (s, broad, 2H), 2.00–1.90 (m, 2H), 1.45 (t, J=7.2 Hz, 3H), 1.33 (t, J=6.9 Hz, 6H); UV (CHCl$_3$) λ$_{max}$ 574 (ε$_{574}$ 182000) nm; accurate FAB mass spectrum (m/z) for M$^+$ C$_{24}$H$_{27}$N$_3$O$_3$S, calcd 438.1851, found 438.1876; elemental analysis, calcd: C, 65.88, H, 6.22, N 9.60, found: C, 65.88, H, 6.71, N 9.48.

Example 31

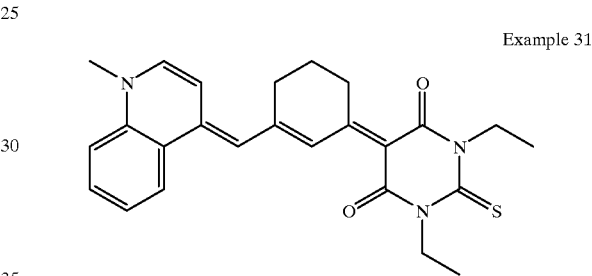

This compound was synthesized in the same manner as described in general synthetic method 1. $^1$H NMR (CDCl$_3$) δ 8.40–8.28 (m, 2H), 7.81(t, J=7.7 Hz, 1H), 7.71 (d, J=7.2 Hz, 1H), 7.62–7.55 (m, 2H), 7.46 (d, J=7.2 Hz, 1H), 6.71 (s, 1H), 4.60 (q, J=6.8 Hz, 4H), 4.02 (s, 3H), 3.12 (t, J=6.0 Hz, 2H), 2.75 (t, J=5.8 Hz, 2H), 1.91 (m, 2H), 1.33 (t, J=6.8 Hz, 6H); UV (CHCl$_3$) λ$_{max}$ 702 (ε$_{702}$ 104000) nm; accurate FAB mass spectrum (m/z) for M$^+$ C$_{25}$H$_{27}$N$_3$O$_2$S, calcd 433.1824, found 438.1814; elemental analysis, calcd: C, 69.26, H, 6.28, N 9.69, found: C, 68.94, H, 6.18, N 10.06.

Example 32

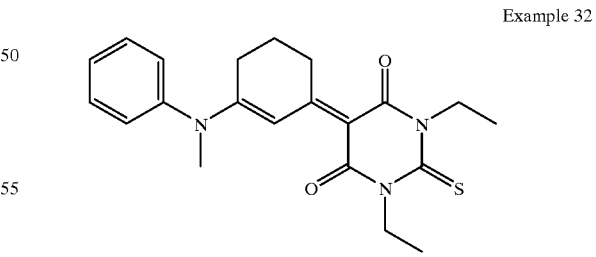

This compound was synthesized in the same manner as described in example 1 except that intermediate compound A was used instead of intermediate compound D. $^1$H NMR (CDCl$_3$) δ 8.27 (s, 1H), 7.56–7.38 (m, 3H), 7.18 (d, J=7.8 Hz, 2H), 4.58 (q, J=6.8 Hz, 4H), 3.61 (s, 3H), 3.20 (t, J=6.0 Hz, 2H), 2.28 (broad, 2H), 1.90–1.75(m, 2H), 1.32 (t, J=6.8 Hz, 6H), accurate FAB mass spectrum (m/z) for M$^+$ C$_{21}$H$_{25}$N$_3$O$_2$S, calcd 383.1667, found 383.1667.

Example 33

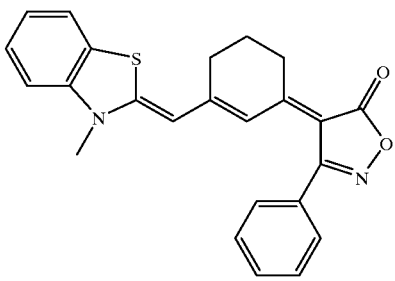

This compound was synthesized in the same manner as described in general synthetic method 1. The compound had broad peaks in proton NMR spectrum; UV (CHCl$_3$) $\lambda_{max}$ 588 ($\epsilon_{588}$ 92000) nm; accurate FAB mass spectrum (m/z) for M$^+$ C$_{24}$H$_{20}$N$_2$O$_2$S, calcd 400.1245, found 400.1247.

Example 34

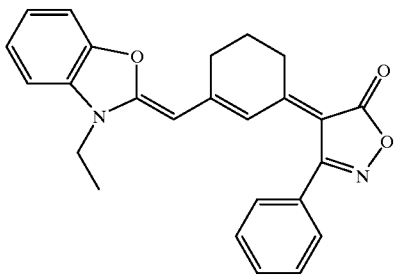

This compound was synthesized in the same manner as described in general synthetic method 1. The compound had broad peaks in proton NMR spectrum; UV (CHCl$_3$) $\lambda_{max}$ 562 ($\epsilon_{562}$ 115000) nm; accurate FAB mass spectrum (m/z) for M$^+$ C$_{25}$H$_{22}$N$_2$O$_3$, calcd 398.1630, found 398.1644.

Example 35

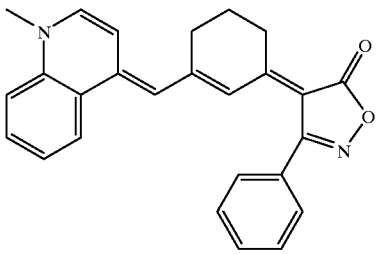

This compound was synthesized in the same manner as described in general synthetic method 1. The compound had broad peaks in proton NMR spectrum; UV (CHCl$_3$) $\lambda_{max}$ 696 ($\epsilon_{696}$ 51000) nm; accurate FAB mass spectrum (m/z) for MP$^+$ C$_{25}$H$_{22}$N$_2$O$_3$, calcd 398.1630, found 398.1644.

F. Exemplary Applications

Figure 18:
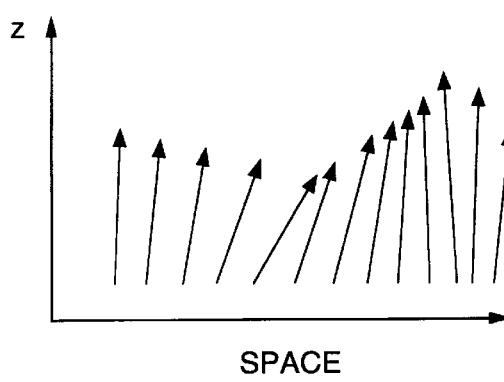
FIG. 18 illustrates spatially modulated orientation of molecules according to the invention after formation of a photorefractive hologram.

Polymer compositions containing molecules according to the present invention showed nearly 100% four-wave mixing diffraction efficiency in 105 μm thick and net gain coefficients in excess of Γ=200 cm$^{-1}$ at an applied field of 50 V/μm. In conventional photorefractive materials, the refractive index modulation arises solely from the space-charge field acting on the electrooptic (Pockels) effect of the material. Thus, the molecular figure of merit developed for high T$_g$ photorefractive polymers is related to βμ/M as for purely electrooptic polymers. In contrast, photorefractive polymers with a low T$_g$ exhibit an orientational contribution to the refractive index modulation. Accordingly, the figure of merit and the design criteria for the chromophores change. The so-called orientational enhancement effect is due to the ability of the chromophores to orient at room temperature under the influence of the total electric field which is the superposition of the internal modulated field and the externally applied field. As a result, in steady state, after photorefractive hologram formation, the molecules no longer have a uniform orientation but rather have an orientation that is spatially modulated both in magnitude and in direction as schematically illustrated shown in FIG. 18. The periodic orientation of the chromophores doubles the effect of the electrooptic contribution and, more importantly, leads to a modulated birefringence that significantly enhances the total refractive index modulation. This modulated birefringence can be easily understood by recalling that a macroscopic change in orientation of molecules with a polarizability anisotropy Δα leads to refractive index changes. In the frame of the oriented gas model the change in refractive index induced by a poling field applied along a z axis for an optical wave polarized along that axis is given by $$\Delta n_z^{(1)} = \frac{2\pi N F^{(1)}}{n} \Delta\alpha [\langle \cos^2\theta \rangle - 1/3] \approx \frac{4\pi N F^{(1)}}{45n} \Delta\alpha \left(\frac{\mu E}{kT}\right)^2 \quad (3)$$

where n is the refractive index, E the poling field, θ is the orientation angle, F$^{(1)}$=(n$^2$+2)/3 is the Lorentz-Lorenz local field correction factor, and N the density of chromophores. On a microscopic level, the new figure of merit for chromophores according to the invention leading to the orientational refractive index changes described by equation 3 is consequently Δαμ$^2$. When both the orientational birefringence and the electrooptic effects contribute to the total refractive index modulation amplitude, the new figure of merit F is defined by equation 1 above. For this study, the temperature was 300 K, a typical operating temperature for low T$_g$ photorefractive polymers.

Figure 19:
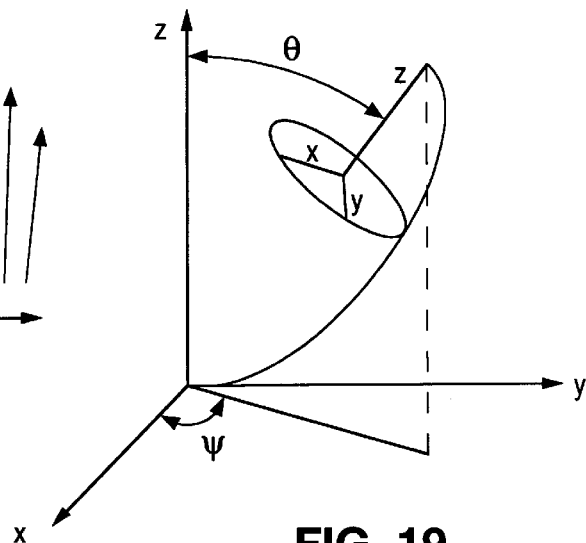
FIG. 19 is a schematic representation of the chromophore $(CH_3)_2N(CH=CH)_4CHO$ that defines the molecular frame xyz and the laboratory frame XYZ.
Figure 20A:
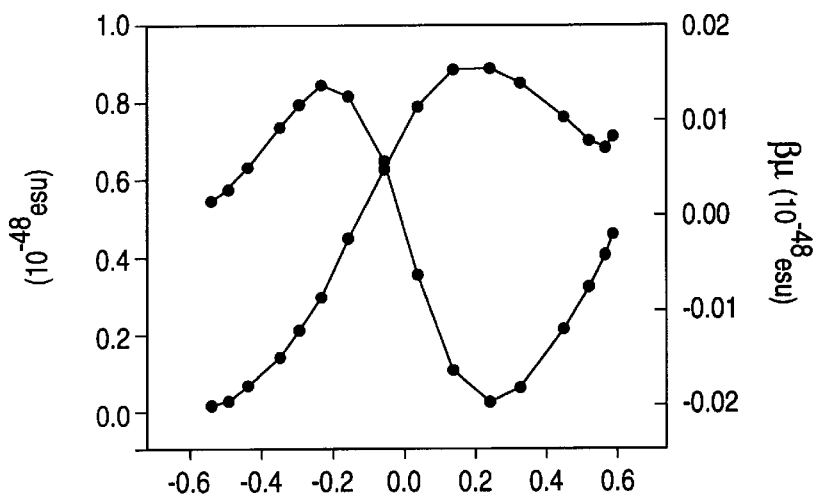
FIGS. 20a and 20b are graphs providing electrooptic ($\beta\mu$) and orientational ($A(T)\Delta\alpha\mu^2$) contributions and figure of merit, respectively, for $(CH_3)_2N(CH=CH)_4CHO$ as a function of bond order alternation.
Figure 20B:
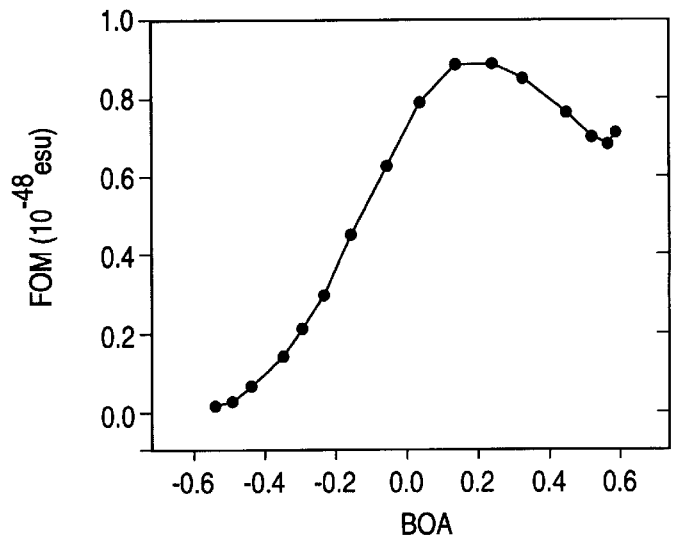

To probe how F varies as a function of the BOA (related to the extent of charge transfer or polarization in the ground state of the molecule), we analyzed the results of semiempirical INDO calculations performed on (CH$_3$)$_2$N(CH=CH)$_4$CHO in the presence of an external field applied along the long axis z of the molecule shown in FIG. 19. For a given field strength, the geometry was optimized and a value of BOA was determined. Electronic states were calculated using configuration interaction with full single and limited double configuration excitations. Then, Δα and β were evaluated using the Sum-Over-States (SOS) approach derived from perturbation theory, using the 30 lowest energy states to obtain converged values. As discussed previously, βμ exhibits two extrema with a negative maximum at a value of roughly 0.2 BOA, which corresponds to molecules that are somewhat polarized beyond the BOA=0, the cyanine limit (FIGS. 20a and 20b). The calculations indicate that α$_{zz}$>>α$_{xx}$, α$_{yy}$, thus Δα≈α$_{zz}$. Previously, we have shown that α$_{zz}$ exhibits a peak at BOA=0 for this molecule. In addition, we have demonstrated μ that essentially increases with BOA over the region considered in this study, and thus, μ$^2$ increases quadratically with BOA. As a consequence, Δαμ$^2$ has its peak shifted to greater polarization (higher BOA) than is observed at the cyanine limit and exhibits a peak at roughly the BOA where βμ peaks. However, it is important to note that the two contributions are opposite in sign. It is therefore necessary to consider their relative magnitudes. Such a comparison is shown in FIG. 20a where we have plotted A(T)Δαμ$^2$ and βμ as a function of BOA. As can be seen from FIG. 20a, in the region where $A(T)\Delta\alpha\mu^2$ and $\beta\mu$ peak, the magnitude of $A(T)\Delta\alpha\mu^2$ is over 80 times higher than that of $\beta\mu$. As a result, the contribution of the $\beta\mu$ term is almost negligible and $[A(T)\Delta\alpha\mu^2+\beta\mu]\approx A(T)\Delta\alpha\mu^2$ for this molecule.

In conclusion, our calculations support our molecular design rationale for linear polymethines of this length. Molecules which are somewhat polarized beyond the cyanine limit will lead to high refractive index changes due to orientational effects in low $T_g$ photorefractive polymers. One caveat of this analysis that will be important as the technology allows for the incorporation of longer molecules with significantly higher $\beta\mu$ values is the fact that $\beta\mu$ will scale more rapidly with length than will $A(T)\Delta\alpha\mu^2$. This will reduce the ratio of $A(T)\Delta\alpha\mu^2$ to $\beta\mu$ and consequently shift the peak of $[A(T)\Delta\alpha\mu^2+\beta\mu]$ to lower values of BOA. However, for molecules of the length that are currently being considered for visible and near-IR photorefractive applications, this effect should only be a minor perturbation.

Example 36

Photorefractive Effect in Dye-Doped Composites

In polymers with a low glass transition temperature ($T_g$), orientational effects were found to be mainly responsible for the high refractive index changes. DMNPAA-based polymers showed nearly 100% diffraction efficiency in 105 $\mu$m thick samples. However, these early materials suffered from several drawbacks: (i) required high electric fields (60 V/$\mu$m) for maximum diffraction; (ii) shelf lifetime at room temperature of heavily doped composites (50% wt. of chromophores) was limited to a few months; and (iii) spectral sensitivity limited to visible wavelengths. To exploit the field-induced orientational effects and to lower the value of the applied field, photorefractive nematic liquid crystals were proposed. High refractive index changes at very low fields were reported. However, these materials suffer from a poor resolution due to the coherence length associated with bulk liquid crystalline nematic phases. In amorphous materials doped with optically active molecules (the so-called chromophores), the applied field can be lowered by optimizing the refractive index modulation amplitude. One approach is to increase the chromophore concentration to nearly 100% without forming a crystalline material with poor optical quality. This could be achieved recently by developing glass-forming chromophores. Such materials show improved refractive index modulation amplitude at lower field compared with polymers, but exhibit a slow response time close to a minute. That drawback originates from the challenging task of developing glass-forming chromophores that exhibit simultaneously high polarizability and good transport properties.

The polymeric matrix of photorefractive compositions according to the present invention exhibits transport properties enabling sub-second response time, good photochemical and thermal stability and a higher polarizability anisotropy without crystallization.

Model calculations for the simple polyene molecule $(CH_3)_2 N(CH=CH)_4 CHO$ show that molecules with some what more than half of the charge transferred from the amine to the formyl group will lead to strong orientational effects when used as a dopant in photorefractive polymeric compositions according to the invention. In particular, linear molecules such as polyenes, as opposed to chromophores that contain benzene rings, exhibit a considerable charge transfer that is confined along the $\pi$-conjugated bridge providing large $\Delta\alpha$. Based on these results, we synthesized the polyene molecule DHADCMPN (also referred to herein as HR-2-54) shown in Example 1. Its structure differs from the simple polymethine dye to create a suitable photorefractive composition: (i) hexyl groups on the amine donor group for high solubility and low aggregation; (ii) fused ring bridge to prevent photoisomerization, reduce aggregation, and improve thermal and photochemical stability; (iii) stable CN groups to contribute to a large molecular dipole moment.

DHADCMPN was used to dope mixtures of poly(N-vinylcarbazole) (PVK) and ethylcarbazole (ECZ) which act as the photoconducting matrix. The photorefractive properties were tested by four-wave mixing and two-beam coupling experiments in the tilted geometry as known in the art. In four-wave mixing experiments, two interfering laser beams formed a phase grating in the polymer. The resulting refractive index modulation is measured by diffracting a third beam on the grating and by measuring the intensity of the diffracted beam. Two-beam coupling experiments are performed to check the photorefractive nature of the optical encoding. Energy exchange between the two interfering laser beams after propagation through the thick polymer is possible at steady-state only if the phase grating and the light interference pattern are phase shifted. These phase shifts are a signature of the photorefractive effect.

Figure 21:
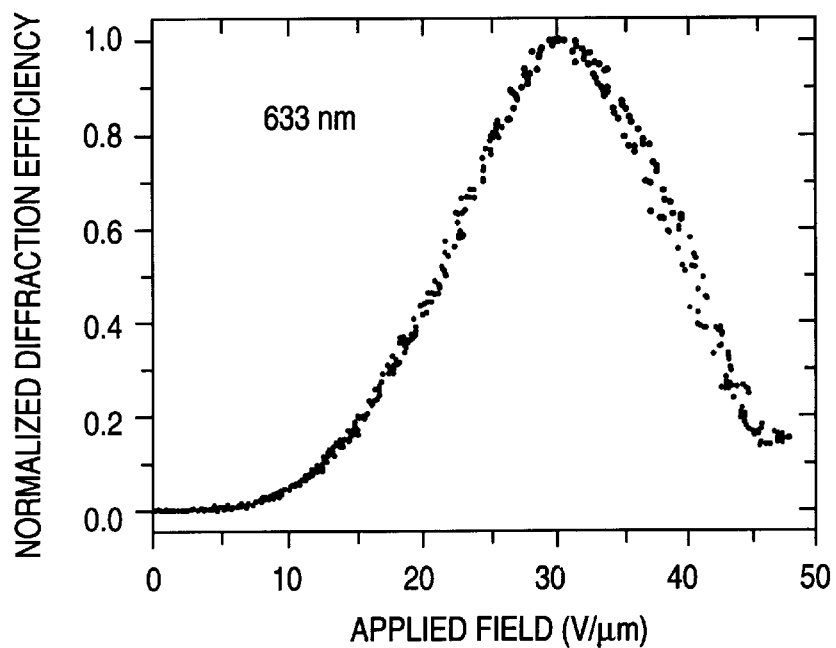
FIG. 21 is a graph of normalized diffraction efficiency of DHADCMPN:PVK:ECZ:TNF measured at 633 nm.

To compare the performance of DHADCMPN with that of other organic photorefractive materials, we prepared samples of DHADCMPN:PVK:ECZ with 2,4,7-trinitrofluorenone (TNF) as a sensitizer. The specific composition was 40:38:20:2% wt. The diffraction efficiency corrected for the absorption in the 105 $\mu$m sample (normalized diffraction efficiency) measured at 633 nm is shown in FIG. 21. Maximum diffraction was observed at an applied field of 30 V/$\mu$m instead of 60 V/$\mu$m as for DMNPAA-doped polymers with 50% wt. chromophore loading. Absorption was 220 cm$^{-1}$, leading to 10% transmission.

Absorption was mainly limited by the TNF concentration and by the charge transfer complex formed between TNF and the chromophore. Due to the quadratic dependence of $\Delta n$ in electric field, a reduction of the applied electric field by a factor of two to achieve complete diffraction compared with previous polymers indicates that $\Delta n$ has been improved by a factor of four. Similarly, $\Delta n$ of these new materials outperforms that of amorphous photorefractive glasses by a factor of three. The performance level of polymeric compositions according to the present invention is compared with other organic photorefractive materials in Table 2. The table shows that the response of polymeric compositions according to the invention was $\approx$2s. The photorefractive nature of the signal was confirmed by two-beam coupling experiments at 675 nm.

TABLE 2

Performance of polymeric photorefractive compositions at an applied field of 40 V/μm

| Composition (wt. %) | wavelength λ (nm) | change in index Δn ($10^{-3}$) | net gain coefficient Γ ($cm^{-1}$) | absorption coefficient A ($cm^{-1}$) | inverse response time $\tau^{-1}$ ($s^{-1}$) |
|---|---|---|---|---|---|
| DHADCMPN:PVK:ECZ: TNF(40:38:20:2) | 633 675 | 5.01 — | — 120 | 220 — | — — |
| DHADCMPN:PVK:ECZ: TNFDM (40:38:20:2) | 830 | 1.85 | — | 76 | .5 |
| 2BNCM:PMMA:TNF (90:9.7:9.3) | 676 | 1.87 | 69 | 4 | 0.012 |
| DMNPAA:PVK:ECZ:TNF (50:33:16:1) | 675 | 1.25 | 25 | 8 | 2 |

To enable new medical imaging applications with photorefractive compositions including fused ring bridge, ring-locked dyes of the invention, we extended the compositions' spectral sensitivity from the visible (<700 nm) to the near IR (>800 nm). The need for new real-time holographic materials with sensitivity in this spectral region is driven by compatibility with the emission of GaAs semiconductor laser diodes and commercial solid-state femtosecond lasers, such as Ti:Sapp lasers and good transparency region of biological tissues. These two factors suggest the great potential of dyes according to the invention for optical gating for imaging through scattering media such as tissues and for valuable new medical diagnosis tools.

Figure 22:
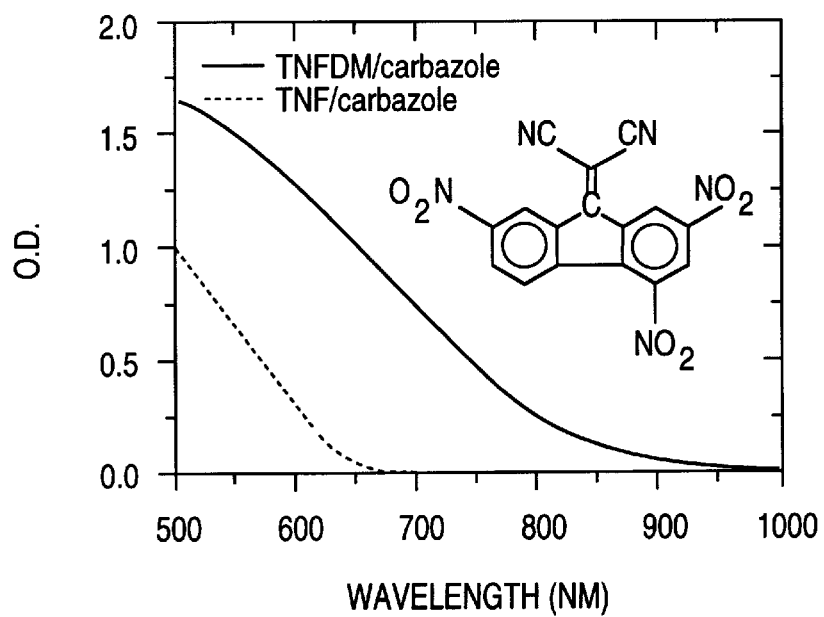
FIG. 22 is a graph comparing the linear absorption of intermolecular complex TNFDM:carbazole with that of TNF:carbazole.

To extend the spectral sensitivity of compositions according to the present invention to the near-IR, we replaced TNF in the DHADCMPN:PVK:ECZ:TNF composition with 2,4,7-trinitro-9-fluorenylidene malononitrile (TNFDM). FIG. 22 shows the linear absorption of the inter-molecular charge-transfer complex the latter forms with carbazole moieties and compares that of the TNF:carbazole complex. The spectral sensitivity is clearly extended up to 900 nm. DMN-PAA:PVK.ECZ:TNFDM (40:38:20:2% wt.) performed significantly worse compared to the TNF-based samples at 675 nm. Total diffraction could not be observed in four-wave mixing experiment at 830 nm even at applied field values up to 90 V/μm.

Figure 23:
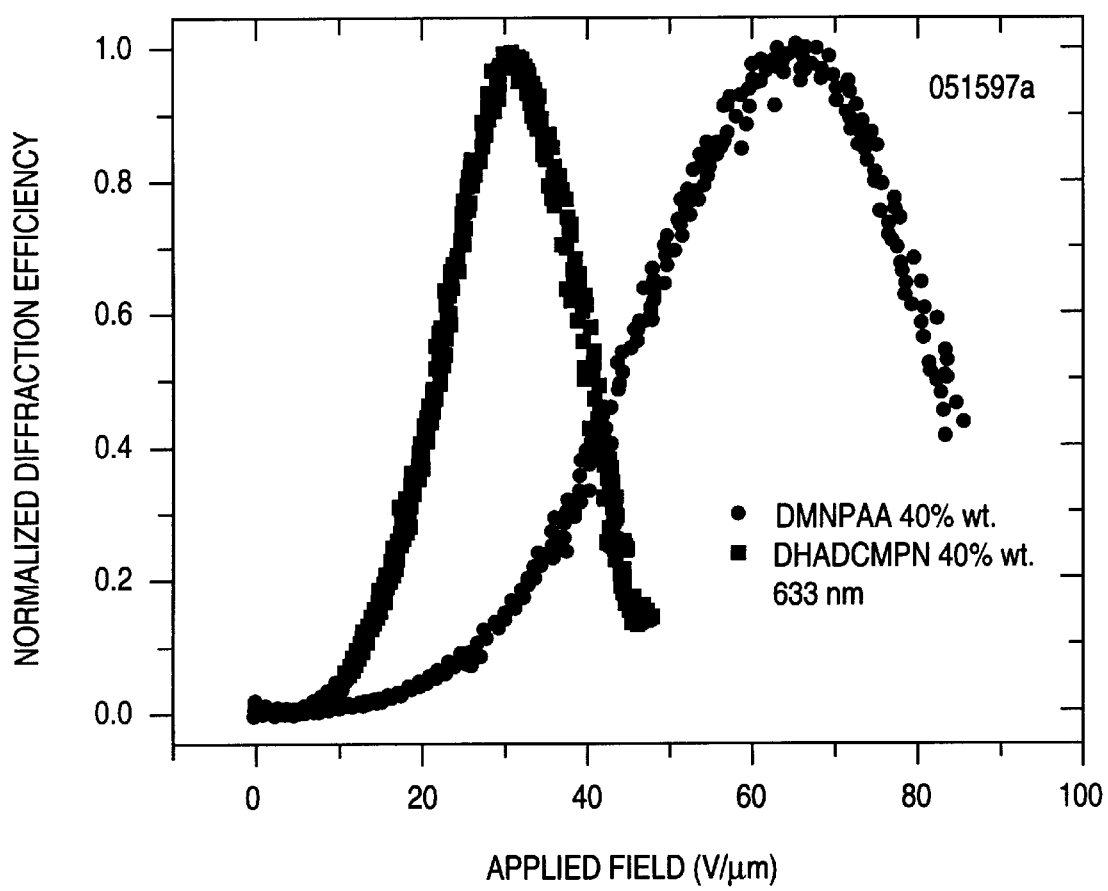
FIG. 23 graphically compares the diffraction efficiency of DHADCMPN:PVK:ECZ:TNFDM with DMN-PAA:PVK:ECZ:TNFDM as a function of the applied field.

In contrast, FIG. 23 illustrates the superior performance of DHADCMPN:PVK:ECZ:TNFDM samples (40:38:20:2% wt.) at 830 nm. The normalized diffraction efficiency shows a maximum at 50 V/μm, exceeding the performance of previous polymers at visible wavelengths. FIG. 23 also shows a theoretical fit using Kogelnik's couple-wave model for the diffraction efficiency and by using the standard Kukhtarev model for the amplitude of the space-charge field. The good agreement between theory and experiment shows that the internal space-charge field is saturated and equal to the component of the applied field along the grating vector for all the field values considered in the experiment. The linear absorption of the sample at 830 nm was 76 $cm^{-1}$, leading to 45% transmission. The response time was on the order of one second.

To validate the design rationale for chromophores according to the invention based on the optimization of the orientational contribution of Δn (i.e., A(T) $\Delta\alpha\mu^2$ on the molecular level), we performed independent frequency-dependent ellipsometry experiments as known in the art. In these experiments, electric-field induced refractive index changes were measured in a polymer when an AC electric field was superimposed on a DC field and applied to the sample. The refractive index changes were characterized in terms of the response function R and for different frequencies of the AC field. At high frequencies, the response is due to electrooptic (i.e., related to $\beta\mu$ on a molecular level) and higher-order effects that can be neglected for sake of simplicity. At low frequencies, the response is due to orientational effects (i.e., related to A(T))$\Delta\alpha\mu^2$ on a molecular level). The low frequency response was found to be 40 times higher than that at high frequency, demonstrating that the orientational effect is the dominant contribution in Δn as predicted by the design model calculations.

To investigate the long term stability of DHADCMPN: PVK samples, we performed optical scattering experiments as a function of time and temperature. Guest/host polymer composites exhibit a typical nucleation period followed by a crystallization phase. In order to observe crystallization during time periods that are easy to measure, we accelerated the degradation process by measuring the scattered light from non-encapsulated samples heated to 85° C. (below the melting point of the chromophores) in air. The lifetime of a given sample was defined as the onset of crystallization after the nucleation period. Samples with 40% wt. doping of the dye DMPNAA showed a lifetime of 1 min. In contrast, DHADCMPN-based samples with the same chromophore loading had a lifetime of 220 min, a two order of magnitude improvement over DMNPAA-based samples. From these data, room temperature shelf lifetimes of several decades can be extrapolated.

Example 37

Thermally Stable Composites

It is known that even highly efficient photorefractive composites, such as those reported in K. Meerholz, et al., Nature, 371, 497 (1994) have a limited shelf life (see C. Poga, et al., SPIE Proc., 2526, 82 (1995)) because of phase separation of the constituents, in particular the dipolar dopant molecule. In recent years, progress made in improving the shelf life of such composites (see Cox, et al., Appl. Phys. Lett. 68, 2801 (1996)) and A. Grunnet-Jepsen, et al., Appl. Phys. Lett., 70, 1515 (1997)) accompanied degraded performance, such as loss of dynamic range at identical applied field compared with the polymers reported in 1994. Recently, it was shown that by using eutectic mixtures of dopant molecules chromophores (E. Hendrickx, et al., Appl. Phys. Lett. 71, 1159 (1997)), materials with anticipated shelf lives of several years can be obtained without any loss in performance, compared with the photorefractive polymers reported in 1994 by K. Meerholz, et al. Despite long shelf lives at room temperature, E. Hendrickx, et al., *Appl. Phys. Lett.* 71, 1159 (1997) also showed that accelerated aging studies at temperatures greater than 45° C. and lower than the melting point of the dipolar dopant molecule, performed in composites based on a PVK matrix, do phase separate in time.

In contrast, we have prepared thermally stable composites using DHADCMPN at levels up to 40 wt % in copolymer poly(methyl methacrylate-co-tricyclodecyl methacrylate-co-N-cyclohexyl maleimide-co-benzyl methacrylate) (referred to herein as PTCB; structure shown below) that did not show any sign of degradation after 6 days at 70° C.

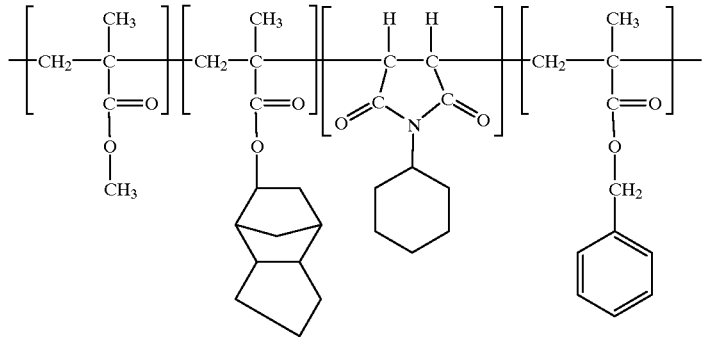

Several DHADCMPN:PTCB compositions tested under the same conditions showed no sign of degradation: DHADCMPN:PTCB:TNFDM (40:59:1 wt. %), DHADCMPN:PTCB:DIP:TNFDM (37.6:49.7:12.1:0.6 wt. %), DHADCMPN:PTCB:DIP:TNFDM (37.6:49.7:12.5:0.18 wt. %), DHADCMPN:PTCB:DIP (37.4:50.3:12.3 wt. %), where DIP is diphenylisophthalate. Furthermore, in addition to enhanced thermal stability, these compositions had superior performance compared with any previously reported photorefractive polymer composite of which we are aware. Therefore, the present invention relates also to the fabrication of thermally stable mixtures of DHADCMPN:PTCB having a high and reversible refractive index change for optical recording and optical processing applications.

The photorefractive properties for DHADCMPN:PTCB:DIP (37.4:50.3:12.3 wt. %) demonstrate that DHADCMPN simultaneously performs three different functions in the PTCB:DIP matrix: (i) as a photogenerator (or sensitizer); (ii) providing charge transport; and (iii) inducing large refractive index changes. As described herein, the association of other multifunctional dyes according to the invention when associated with the PTCB matrix will form thermally stable materials. Unlike other polymer binders (e.g., PMMA (polymethylmethacrylate), PS (polystyrene)) used conventionally for photorefractive composites, PTCB is a copolymer that contains four different monomeric units with differing polarities.

TABLE 3

Performance of PTCB-Based Composites

| Composition (wt %) | $A^1$ (cm$^{-1}$) | $E_{\pi/2}^2$ (v/μm) | $\eta_{max}^3$ | $\tau_{50}^4$ (s) | $\Gamma^5$ (cm$^{-1}$) |
|---|---|---|---|---|---|
| DHADCMPN:PTCB:TNFDM (40:59:1) | 84.6 | 39 | 40 | 24 | 86 (at 50 V/μm) |

TABLE 3-continued

Performance of PTCB-Based Composites

| Composition (wt %) | $A^1$ (cm$^{-1}$) | $E_{\pi/2}^2$ (v/μm) | $\eta_{max}^3$ | $\tau_{50}^4$ (s) | $\Gamma^5$ (cm$^{-1}$) |
|---|---|---|---|---|---|
| DHADCMPN:PTCB:DIP:TNFDM (37.6:49.7:12.1:0.6) | 60.5 | 31 | 47 | 9.9 | 227 (at 48 V/μm) |
| DHADCMPN:PTCB:DIP:TNFDM (37.6:49.7:12.5:0.18) | 22.6 | 28 | 71 | 14.3 | 225 (at 50 V/μm) |

TABLE 3-continued

Performance of PTCB-Based Composites

| Composition (wt %) | $A^1$ (cm$^{-1}$) | $E_{\pi/2}^2$ (v/μm) | $\eta_{max}^3$ | $\tau_{50}^4$ (s) | $\Gamma^5$ (cm$^{-1}$) |
|---|---|---|---|---|---|
| DHADCMPN:PTCB:DIP (37.4:50.3:12.3) | 1.5 | 36 | 78 | 47 | 198 (at 50 V/μm) |

$^1$A = absorption coefficient at 633 nm measured versus sample without dye.
$^2$E$_{\pi/2}$ = value of applied electric field at which the diffraction efficiency goes through its first maximum.
$^3\eta_{max}$ = external diffraction efficiency at E$_{\pi/2}$
$^4\tau_{50}$ = time needed to reach 50% of maximum diffraction efficiency.
$^5\Gamma$ = gain coefficient at specified applied field.

Although not wishing to be bound by theory, we believe that the local dipolar disorder around the dopant molecule created by the different monomeric units of the polymer stabilizes the composite to enable thermally stable polymer composites.

It is therefore a further object of this invention to fabricate a composite comprising a dopant molecule with a high dipole moment and large polarizability anisotropy and a co-polymer comprising several monomeric units with differing polarities. The glass transition temperature of the composite can be adjusted by adding a plasticizer at a level of 10 to 20% wt. or the absorption of the composite can be adjusted by adding a photosensitizer (e.g., TNF, TNFDM or fullerene) at low concentration, typically <5% wt.

Imaging through highly scattering media using optical radiation has received particular attention recently due to potential applications in medical diagnostics. More traditional medical imaging techniques, such as x-ray computed tomography, magnetic resonance imaging, single photon emission computed tomography, positron emission tomography and ultrasound, are capable of measuring different physical quantities and each have limitations. Imaging with optical radiation would provide a complementary and valuable tool for medical diagnostics. Using optical radiation, one can avoid the hazards of ionizing radiation, while obtaining high spatial resolution (potentially diffraction limited) images and enjoying distinct advantages over current clinical ultrasound techniques. Additionally, spectroscopic techniques may be employed to discern functional information. However, biological tissue, due to refractive index inhomogeneities, scatters optical, but not ionizing, radiation. As a result, light transmitted by biological tissues consists of photons that have experienced no scattering events (ballistic light), weakly scattered photons that emerge almost collinear with the incident radiation (so-called "snake-like" light) and highly scattered (or diffuse) photons. Ballistic and snake-like light provide useful information about absorption centers in the medium for shadowgram imaging. Conversely, the diffuse light emerges from the medium in any direction and usually significantly later than the first arriving (i.e., ballistic and snake-like) light. To use diffuse light for imaging, one is required to model photon transport and employ algorithms to reconstruct the image. The main challenge when transilluminating scattering media, therefore, is to selectively extract the information-bearing ballistic or snake-like light without imaging the diffuse light.

Several methods have been developed to extract the ballistic light from the background of scattered light, using spatial filtering techniques that take advantage of the different k-vectors associated with scattered and unscattered light or the spatial coherence properties of scattered light. These techniques include confocal microscopy, optical heterodyne detection and spatially incoherent techniques. Other methods rely on temporal stretching of a short pulse of light upon scattering. As mentioned above, the least-scattered light exits the medium earlier than more heavily scattered light, and several techniques have been developed to exploit this characteristic including incoherent time-gating techniques based on electronics, streak cameras, and optical non-linearities such as the Kerr effect. There are also coherent approaches to time-gating, including the "light-in-flight" or time-gated holography method, electronic holography, and optical coherence tomography.

We used photorefractive polymeric compositions according to the invention as the recording medium for time-gated holographic imaging through highly scattering media. This method offers the advantages of a fast acquisition time since an entire image can be acquired in a single shot, as opposed to point-by-point scanning of certain techniques that employ spatial filtering. Thus, the potential exists for real-time imaging based upon further optimization of near-infrared sensitive photorefractive polymers. Furthermore, this technique is straightforward in implementation and does not involve any computations.

In this method, a hologram of an object embedded in a scattering medium is formed in a photorefractive polymer by the temporal overlap of a reference pulse and the first arriving (i.e., least-scattered) light from the stretched image-bearing pulse. The filtering of the ballistic photons from the scattered photons is thus achieved in real-time without any need for digital processing. The image carried by the ballistic light can then be reconstructed real-time via diffraction of a probe beam (pulsed or continuous-wave).

Holographic time-gating was first proposed some time ago. It has been implemented in the past by using either photographic emulsions or electronic holography. In addition, photorefractive holographic time-gating was demonstrated previously with inorganic crystals such as $BaTiO_3$, and has important advantages associated with real-time erasable recording. Inorganic photorefractive crystals, however, are generally rather expensive, limited in size and can exhibit large beam fanning effects in longer crystals which are a source of noise in imaging. Holographic time-gating using photorefractive polymers of the invention, on the other hand, are low cost, able to form large area films, have high reconstruction efficiency in relatively thin layers, high angular bandwidth, structural flexibility.

Some photorefractive polymer compositions according to the invention absorb highly in the spectral region between 700 and 900 nm. This absorption is highly desirable for medical imaging since this is a region of particular transparency for biological tissue and can be generated by commercially available, broadly tunable, short-pulse Ti:sapphire lasers and efficient and inexpensive laser diodes. The photorefractive composition used was DHADCMPN-:PVK:ECZ:TNFDM (25:48:25:2 wt. %). The composition was sandwiched between two 1-mm thick glass slides coated with transparent ITO electrodes. The thickness of the material was 105 $\mu$m.

Figure 24:
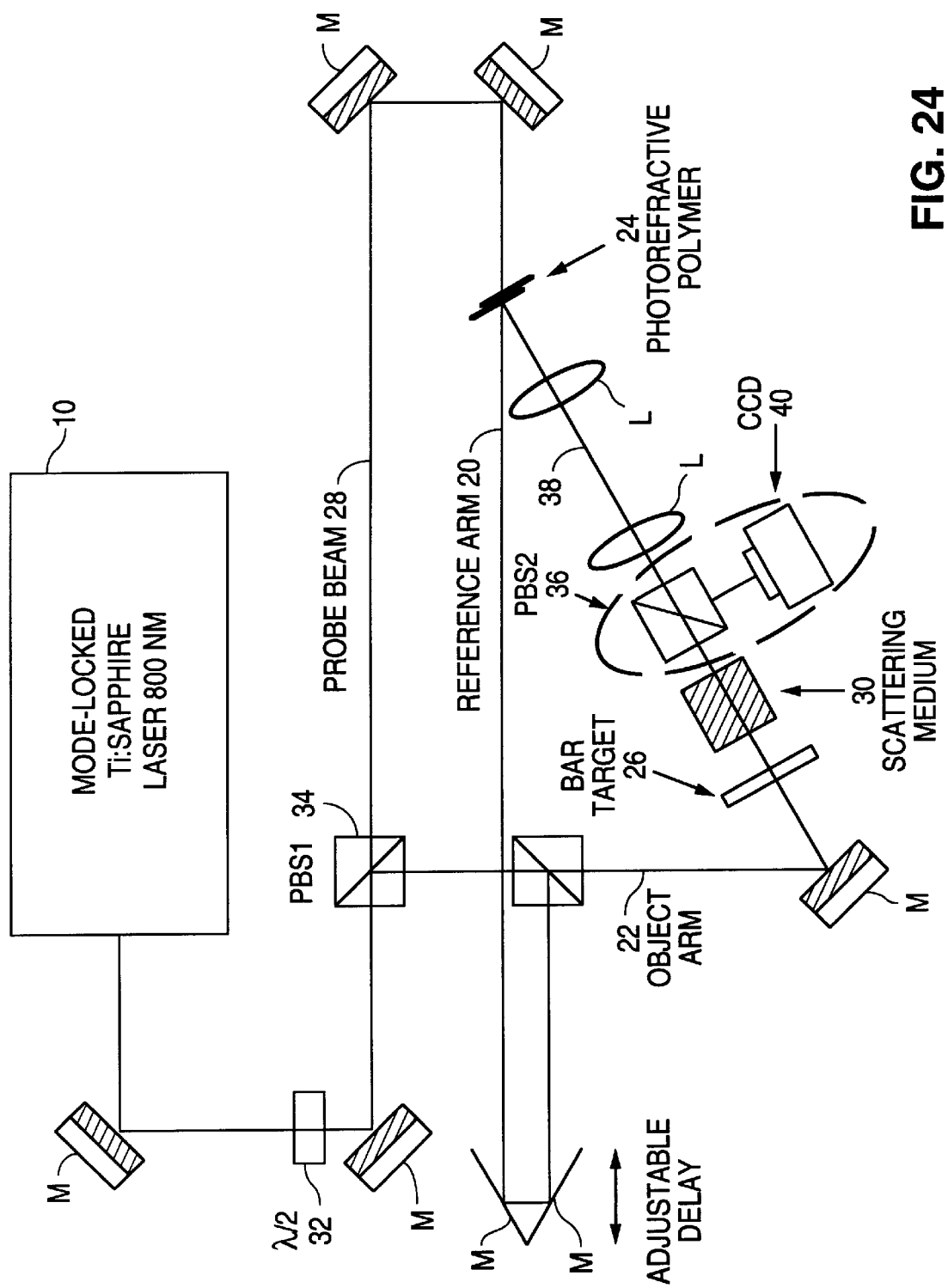
FIG. 24 schematically illustrates experimental setup for transillumination imaging with a photorefractive polymeric composition according to the invention.

FIG. 24 depicts the experimental setup. We used a Ti:sapphire laser 10 operating at 800 nm with a pulse duration of ~150 fs (full-width half-maximum), a repetition rate of ~90 MHz, and an average output power of ~250 mW. Imaging was performed in a degenerate four-wave mixing geometry, using two writing beams 20, 22 subtending an angle of 28° and interfering in a photorefractive polymeric composition 24 to generate a hologram. The composition was tilted 55° with respect to a bisector of writing beams 20, 22 and was subject to an applied voltage of 5.5 kV. A bar target 26 was placed in the path of the object (writing) beam 22 to provide a hologram that was reconstructed by a probe beam 28 counter-propagating with writing (reference) beam 20. Scattering medium 30 distorts the hologram by scattering. For the best efficiency, writing beams 20, 22 were s-polarized and probe (reading) beam 28 was p-polarized. The power ratio between probe beam 28 and writing beams 20, 22 was controlled by a half-wave plate 32 and a polarizing beam splitter 34. A second polarizing beam splitter 36 directed the diffracted beam 38 to a CCD camera 40 (Sony model XC-73). Various mirrors M and lenses L were also included in the experimental set up.

The hologram was reconstructed in real-time, underscoring the ability to create in vivo dynamic images of biological tissue.

The test object used in the imaging experiments was a standard Air Force resolution target positioned in front of the scattering cell. The influence of the size of the particles on the imaging results was demonstrated by using calibrated polystyrene spheres of three different diameters (0.548, 1.072 and 2.836 $\mu$m). The thicknesses of the cuvettes used were 1 mm and 10 mm. In all cases, similar results have been obtained, with the most important factor being the total attenuation of light. For this reason we show only the results obtained with water suspensions of 0.548-$\mu$m spheres in the 10-mm cuvette.

Figure 25A:
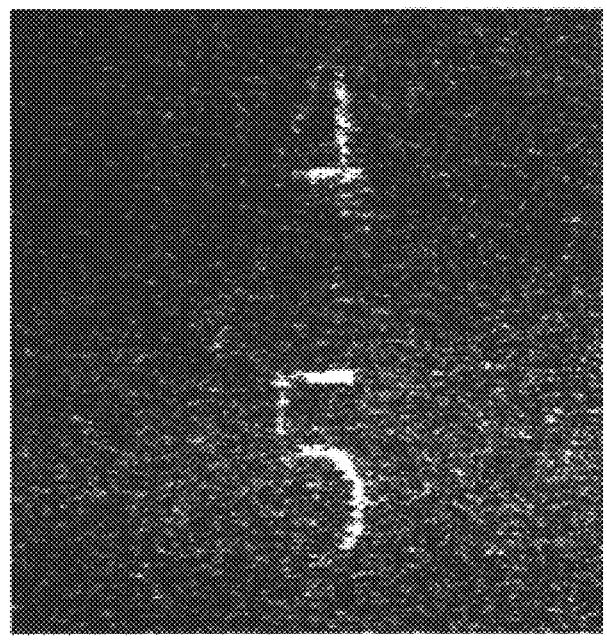
FIGS. 25a and 25b are images of the resolution target after passing through 1 cm of 0.06 wt % water suspension of 0.548 $\mu$m polystyrene spheres filtered with a 150 fs pulse and a cw Ti-sapphire laser, respectively.

FIG. 25a shows the time-gated image recorded with a mode-locked Ti:sapphire laser in the photorefractive polymeric composition after passing through 10 mm of a 0.06 vol. % microsphere suspension, corresponding to an effective optical density of ~4.0, as determined from the optical attenuation measurements described above. For comparison, 1 mm of whole milk has an effective optical density of ~5.0.

Figure 25B:
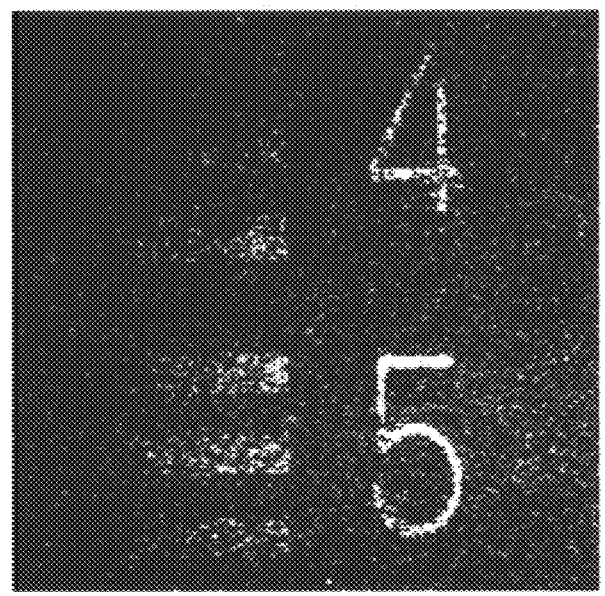

Due to the short coherence length of the Ti:sapphire laser in continuous-wave (cw) operation, it was also possible to filter scattered light while running the laser cw. FIG. 25b shows the image recorded using cw radiation after passing through 10 mm of the 0.06 vol. % microsphere suspension. In fact, the 1.5-mm coherence length of the laser is equivalent to a 5 ps time gate. For comparison, an 8 ps gate was successfully used by Wang, et al., *Opt. Lett.* 18, 241 (1993). In addition, the polarization sensitivity of the holographic recording and the spatial filtering provided by the imaging telescope improve the rejection of the scattered light. Moreover, it is known that scattered light quickly loses its coherence after several scattering events, especially in a scattering medium with moving particles (Brownian motion in the case of liquid suspensions). Ultimately, using cw light is advantageous, since it facilitates use of short coherence length laser diodes and allows dramatic cost reduction for a hypothetical practical system based on this technique.

Holographic imaging with photorefractive polymeric compositions according to the invention offers a number of advantages over other imaging techniques. Diffraction efficiency achievable with 100-μm thick films of photorefractive polymeric compositions according to the invention is comparable to or exceeds what is typically achieved with near IR-sensitive, several millimeter thick rhodium-doped photorefractive $BaTiO_3$ crystals. However, response time of the polymers (close to a second) is considerably faster than that of the crystals (approximately 10 seconds). Using thin layers is also particularly important for holographic imaging since the angular bandwidth of the imaging system is inversely proportional to the interaction length. Therefore, a thin material assures the widest possible angular bandwidth and thus the highest image resolution. In addition to the material advantages mentioned earlier, photorefractive polymeric compositions according to the invention possess structural flexibility that can lead to significantly improved efficiency via molecular engineering. Altogether, photorefractive polymeric compositions according to the invention offer greater technological potential than their inorganic counterparts.

We claim:

1. A method, comprising the steps of:

providing a low viscosity, optically transparent composite containing a polymer and a molecule at a selected temperature, wherein the molecule is electrically neutral, has a formula D-Π-A and a molecular dipole moment $\mu_M$, D is an electron donor group and has a group dipole moment $\mu_D$, A is an electron acceptor group and has a group dipole moment $\mu_A$ and Π is a carbocyclic fused ring bridge of rotationally locked conjugated π bonds connecting D to A and has a bond length alternation L, wherein –0.08 Å<L≦0.06 Å, in which at least one of $\mu_D$ or $\mu_A$≧2 Debye and the vectorial sum of $\mu_D+\mu_A$ is within an angle of 0±60 degrees with respect to $\mu_M$ and also within an angle of 0±60 degrees of a charge transfer vector $c_T$ wherein $c_T$ is $\mu_M-(\mu_d+\mu_A)$; and applying an electric field E to the composite, whereby birefringence induced in the composite is ≧$10^{-5}$ in a period of less than 60 seconds and the molecule in the composite aligns itself in accordance with the applied electric field at the selected temperature.

2. A method according to claim 1, wherein the molecule is further defined by a formula

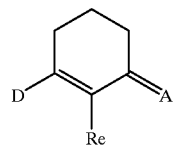

(1) where D is a member selected from the group consisting of: $NR_aR_b$, $OR_a$, $SR_a$, $PR_aR_b$,

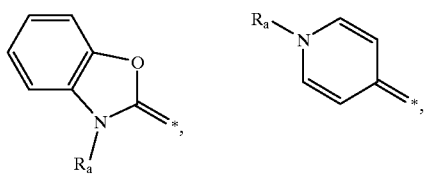

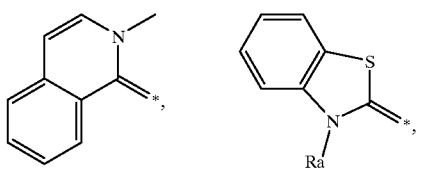

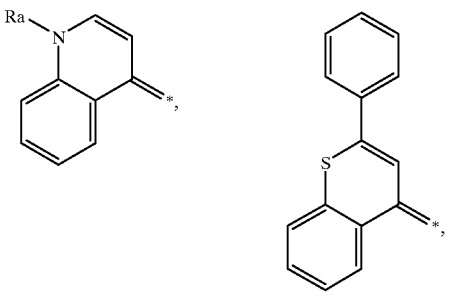

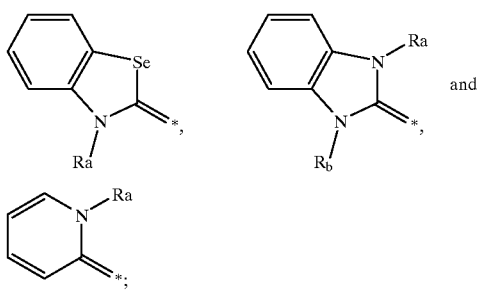

and (2) A is a member selected from the group consisting of:

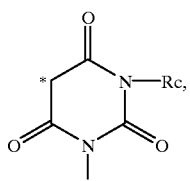 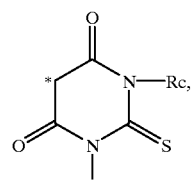

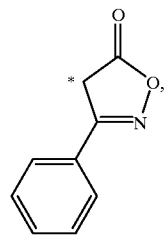 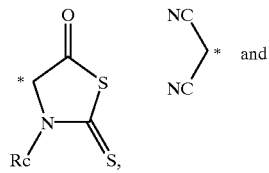

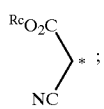

wherein (2.1) $R_a$, $R_b$, $R_c$ and $R_d$ are independently selected from the group consisting of: H, a linear or branched alkyl group with up to 25 carbons, —(CH$_2$CH$_2$O)$_x$(CH)$_y$OR$_{a1}$, —(CH$_2$CH$_2$O)$_x$(CH)$_y$NR$_{a2}$R$_{a3}$, —(CH$_2$CH$_2$O)$_x$(CH)$_y$CONR$_{a2}$R$_{a3}$, where (2.1.1) $R_{a1}$, $R_{a2}$, and $R_{a3}$ are independently selected from the group consisting of: H, a linear or branched alkyl group with up to 25 carbons, and a carbazole attached to the nitrogen of —(CH$_2$CH$_2$O)$_x$(CH)$_y$NR$_{a2}$R$_{a3}$ or —(CH$_2$CH$_2$O)$_x$(CH)$_y$CONR$_{a2}$R$_{a3}$, except that $R_a$, $R_b$, $R_c$, and $R_d$ are not any substituent where A is a divalent element;

—(CH$_2$CH$_2$O)$_x$(CH)$_y$CN, —(CH$_2$CH$_2$O)$_x$(CH)$_y$Cl, —(CH$_2$CH$_2$O)$_x$(CH)$_y$Br, —(CH$_2$CH$_2$O)$_x$(CH)$_y$I, —(CH$_2$CH$_2$O)$_x$(CH)$_y$Phenyl, —(CH$_2$CH$_2$O)$_x$(CH)$_y$Benzyl,

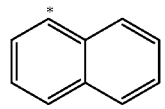 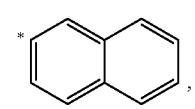

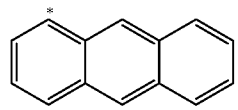 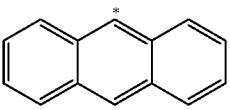

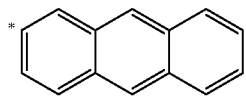 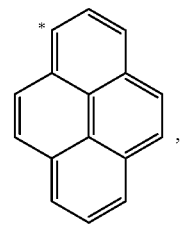

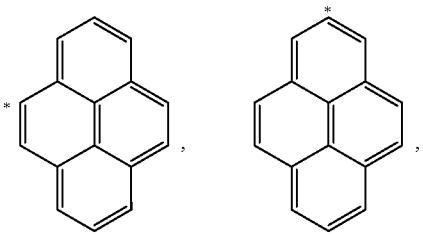

and an aromatic ring system of up to 20 carbons (excluding substituents); wherein (2.1.2) the ring system is selected from the group consisting of:

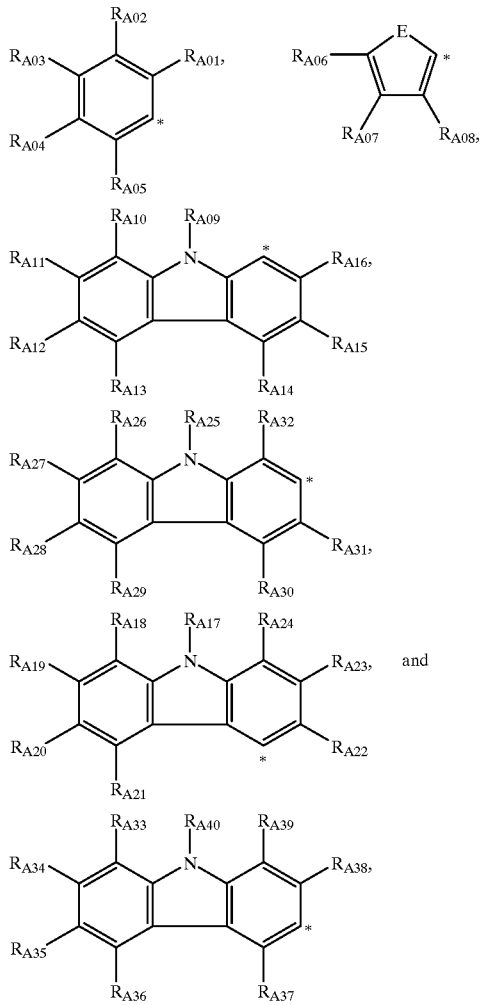

where A# corresponds to a three digit symbol in the subscript of $R_{A\#}$ in which $R_{A01} \leq R_{A\#} \leq R_{A40}$, $1 \leq \# \leq 40$ but for $1 \leq \# \leq 9$, # is preceded by the digit 0;

(2.1.2.1) $R_{A\#}$ are independently selected from the group consisting of: H, a linear or branched alkyl group with up to 25 carbons, NR$_{A\#1}$R$_{A\#2}$, OR$_{A\#3}$, and phenyl; where (2.1.2.1.1) $R_{A\#1}$, $R_{A\#2}$ and $R_{A\#3}$ are independently selected from the group consisting of: H, a linear or branched alkyl group with up to 25 carbons, phenyl, an aryl group, and a carbazole group; wherein
(2.1.2.1.1.1) the aryl group or the carbazole group have aromatic ring frameworks of up to 20 carbons (excluding substituents) selected from the group consisting of:

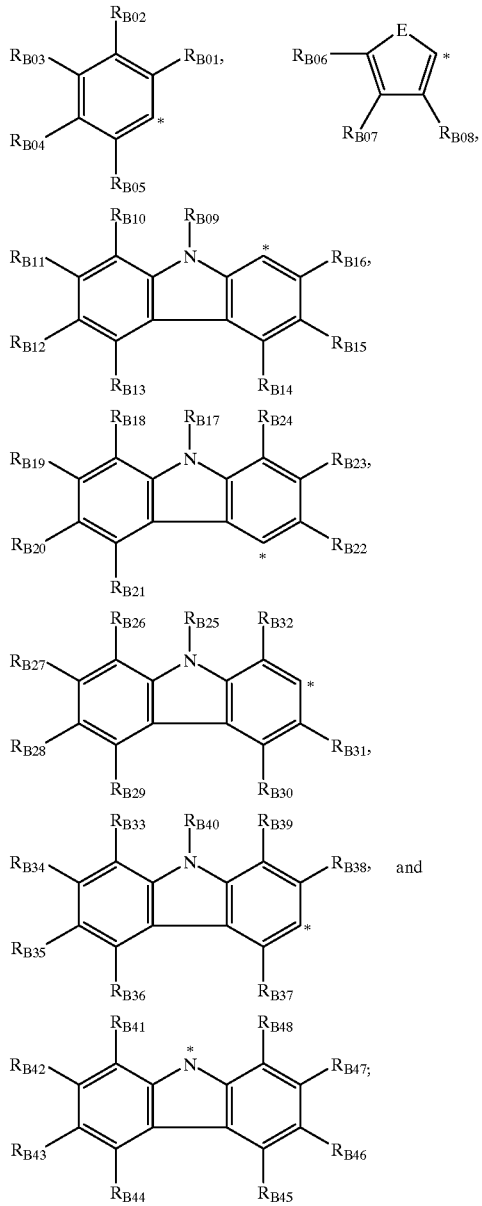

where
(2.1.2.1.1.1.1) E is selected from the group consisting of S and O and B# corresponds to a three digit symbol in the subscript in $R_{B\#}$, $1 \leq \# \leq 49$ but for $1 \leq \#'9$, # is preceded by the digit 0;
(2.1.2.1.1.1.2) $R_{B\#}$ are independently selected from the group consisting of: H, linear or branched alkyl group with up to 25 carbons, and phenyl; and
(3) $R_e$ is independently selected from the group consisting of: H, a linear or branched alkyl group with up to 25 carbons, —(CH$_2$CH$_2$O)$_x$(CH)$_y$OR$_{a1}$, —(CH$_2$CH$_2$O)$_x$(CH)$_y$NR$_{a2}$R$_{a3}$, —(CH$_2$CH$_2$O)$_x$(CH)$_y$CONR$_{a2}$R$_{a3}$,
(3.1) where $R_{a1}$, $R_{a2}$, and $R_{a3}$ are independently selected from the group consisting of: H, a linear or branched alkyl group with up to 25 carbons, and a carbazole attached to the nitrogen of —(CH$_2$CH$_2$O)$_x$(CH)$_y$NR$_{a2}$R$_{a3}$ and (CH$_2$CH$_2$O)$_x$(CH)$_y$CONR$_{a2}$R$_{a3}$;
—(CH$_2$CH$_2$O)$_x$(CH)$_y$CN, —(CH$_2$CH$_2$O)$_x$(CH)$_y$Cl, —(CH$_2$CH$_2$O)$_x$(CH)$_y$Br, —(CH$_2$CH$_2$O)$_x$(CH)$_y$I, —(CH$_2$CH$_2$O)$_x$(CH)$_y$Phenyl, and —(CH$_2$CH$_2$O)$_x$(CH)$_y$Benzyl, where 0<x<10 and 0<y<25.

3. A method according to claim 1, wherein the molecule is further defined by a formula

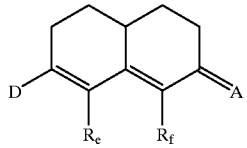

(1) where D is a member selected from the group consisting of:
NR$_a$R$_b$, OR$_a$, SR$_a$, PR$_a$R$_b$,

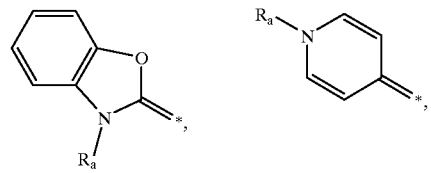

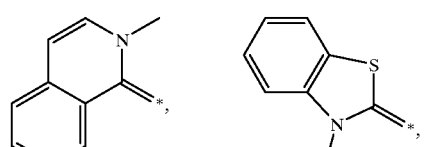

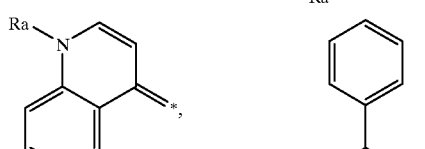

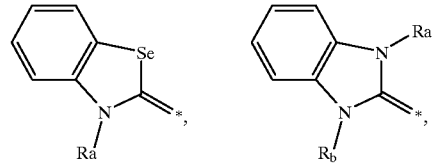

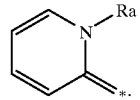

(2) A is a member selected from the group consisting of

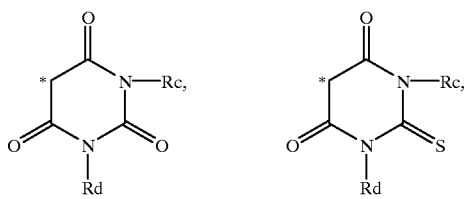

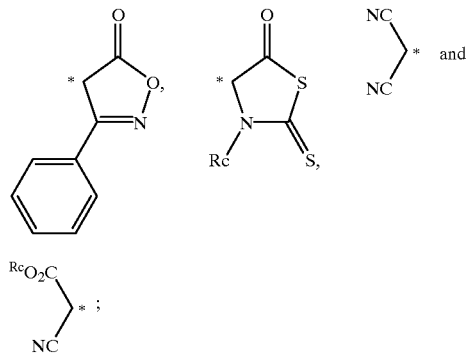

wherein (2.1) $R_a$, $R_b$, $R_c$ and $R_d$ are independently selected from the group consisting of: H, a linear or branched alkyl group with up to 25 carbons, —(CH$_2$CH$_2$O)$_x$(CH)$_y$OR$_{a1}$, —(CH$_2$CH$_2$O)$_x$(CH)$_y$NR$_{a2}$R$_{a3}$, —(CH$_2$CH$_2$O)$_x$(CH)$_y$CONR$_{a2}$R$_{a3}$, where (2.1.1) $R_{a1}$, $R_{a2}$, and $R_{a3}$ are independently selected from the group consisting of: H. a linear or branched alkyl group with up to 25 carbons, a carbazole attached to the nitrogen of —(CH$_2$CH$_2$O)$_x$(CH)$_y$NR$_{a2}$R$_{a3}$ or —(CH$_2$CH$_2$O)$_x$(CH)$_y$CONR$_{a2}$R$_{a3}$, except that $R_a$, $R_b$, $R_c$, and $R_d$ are not any substituent where A is a divalent element;

—(CH$_2$CH$_2$O)$_x$(CH)$_y$CN, —(CH$_2$CH$_2$O)$_x$(CH)$_y$Cl, —(CH$_2$CH$_2$O)$_x$(CH)$_y$Br, —(CH$_2$CH$_2$O)$_x$(CH)$_y$I, —(CH$_2$CH$_2$O)$_x$(CH)$_y$Phenyl, —(CH$_2$CH$_2$O)$_x$(CH)$_y$Benzyl,

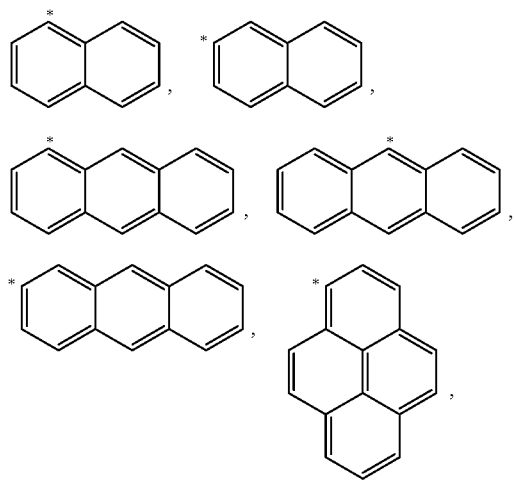

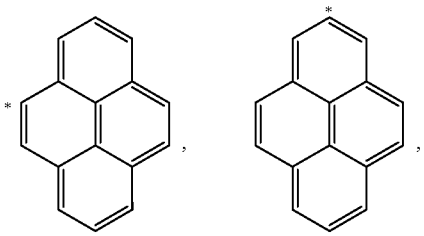

and an aromatic ring system of up to 20 carbons (excluding substituents); wherein (2.1.2) the ring system is selected from the group consisting of:

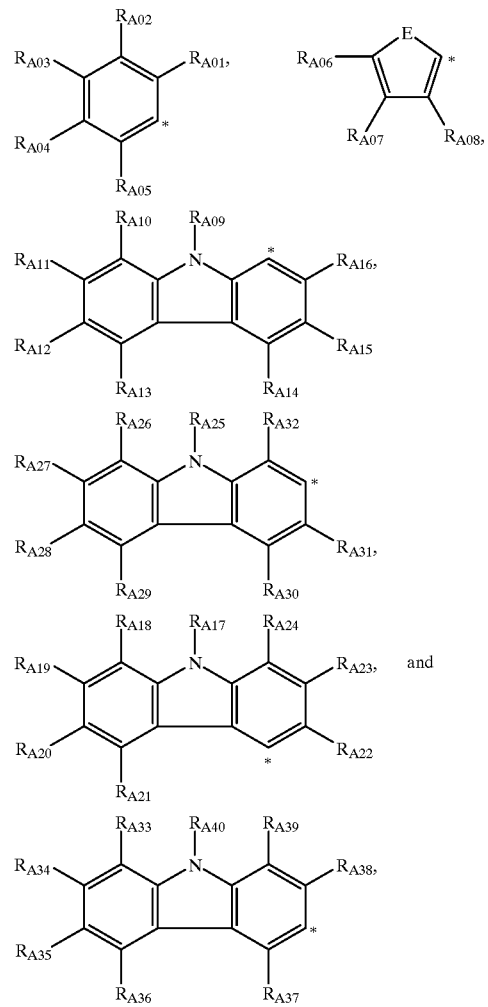

where A# corresponds to a three digit symbol in the subscript of $R_{A\#}$ in which $R_{A01} \leq R_{A\#} \leq R_{A40}$, $1 \leq \# \leq 40$ but for $1 \leq \# \leq 9$, # is preceded by the digit 0;

(2.1.2.1) $R_{A\#}$ are independently selected from the group consisting of: H, a linear or branched alkyl group with up to 25 carbons, NR$_{A\#1}$R$_{A\#2}$, OR$_{A\#3}$, and phenyl; where (2.1.2.1.1) $R_{A\#1}$, $R_{A\#2}$ and $R_{A\#3}$ are independently selected from the group consisting of: H, a linear or branched alkyl group with up to 25 carbons, phenyl, an aryl group and a carbazole group, wherein
(2.1.2.1.1.1) the aryl group or the carbazole group have aromatic ring frameworks of up to 20 carbons (excluding substituents) selected from the group consisting of:

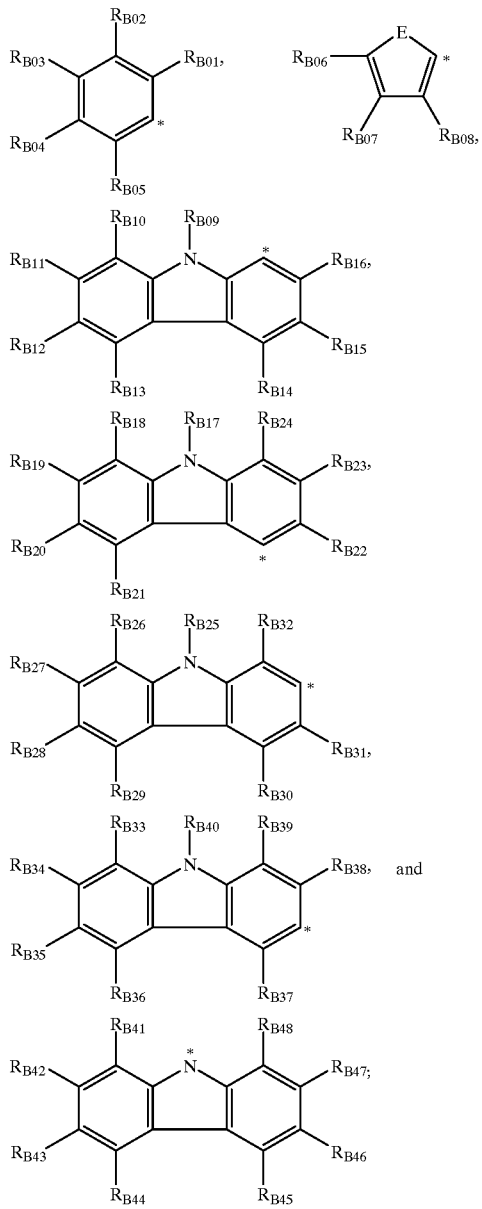

where
(2.1.2.1.1.1.1) E is selected from the group consisting of S and O, and B# corresponds to a three digit symbol in the subscript in $R_{B\#}$, $1 \leq \# \leq 49$ but for $1 \leq \# \leq 9$, # is preceded by the digit 0;
(2.1.2.1.1.1.2) $R_{B\#}$ are independently selected from the group consisting of: H, a linear or branched alkyl group with up to 25 carbons, and phenyl; and
(3) $R_e$ and $R_f$ are independently selected from the group consisting of: H, a linear or branched alkyl group with up to 25 carbons $-(CH_2CH_2O)_x(CH)_yOR_{a1}$, $-(CH_2CH_2O)_x(CH)_yNR_{a2}R_{a3}$, $-(CH_2CH_2O)_x(CH)_yCONR_{a2}R_{a3}$; where
(3.1) $R_{a1}$, $R_{a2}$, and $R_{a3}$ are independently selected from the group consisting of: H, a linear or branched alkyl group with up to 25 carbons, a carbazole attached to the nitrogen of $-(CH_2CH_2O)_x(CH)_yNR_{a2}R_{a3}$ and $-(CH_2CH_2O)_x(CH)_yCONR_{a2}R_{a3}$,
$-(CH_2CH_2O)_x(CH)_yCN$, $-(CH_2CH_2O)_x(CH)_yCl$,
$-(CH_2CH_2O)_x(CH)_yBr$, $-(CH_2CH_2O)_x(CH)_yI$,
$-(CH_2CH_2O)_x(CH)_yPhenyl$, and $-(CH_2CH_2O)_x(CH)_yBenzyl$, where $0<x<10$ and $0<y<25$.

4. A method according to claim 1 wherein the molecule is further defined by a formula

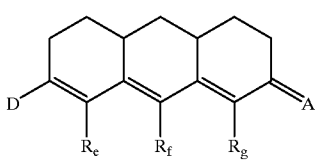

(1) where D is a member selected from the group consisting of:
$NR_aR_b$, $OR_a$, $SR_a$, $PR_aR_b$,

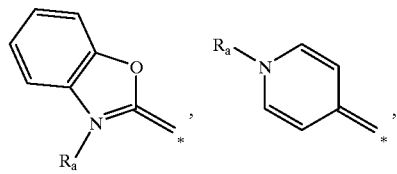

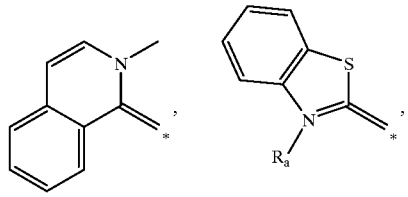

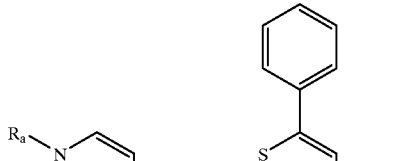

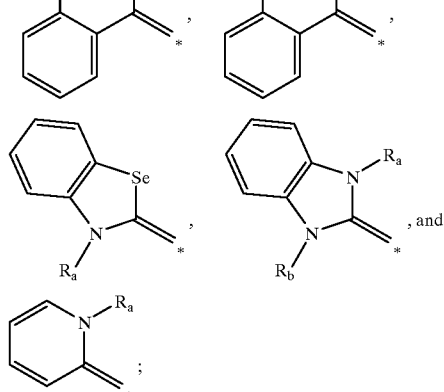

(2) A is a member selected from the group consisting of:

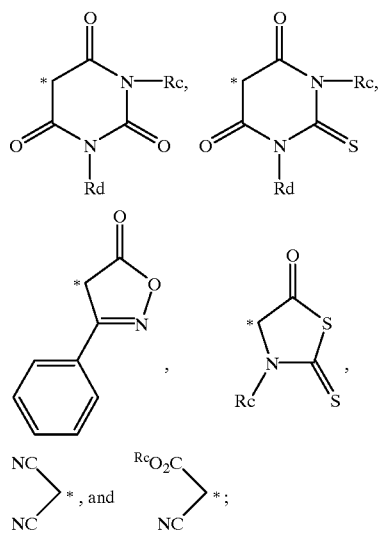

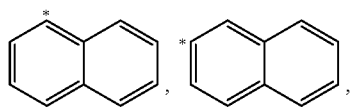

wherein (2.1) $R_a$, $R_b$, $R_c$ and $R_d$ are independently selected from the group consisting of: H, a linear or branched alkyl group with up to 25 carbons, —$(CH_2CH_2O)_x(CH)_y$ $OR_{a1}$,

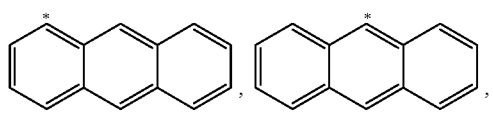

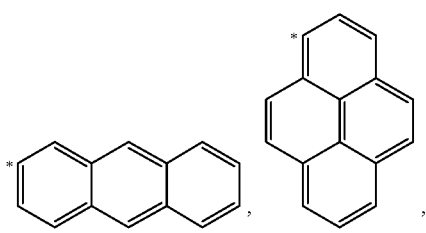

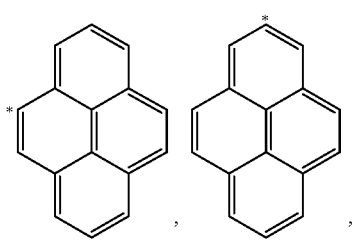

and an aromatic ring system of up to 20 carbons (excluding substituents); wherein (2.1.2) the ring system is selected from the group consisting of:

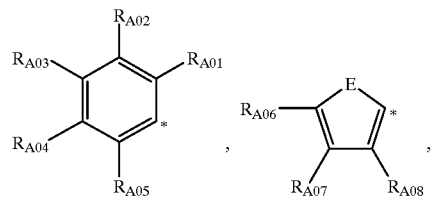

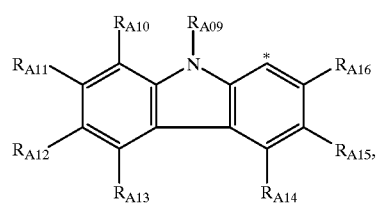

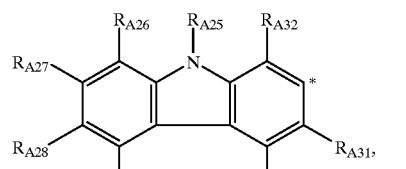

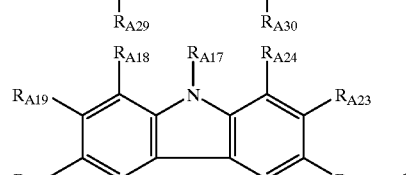

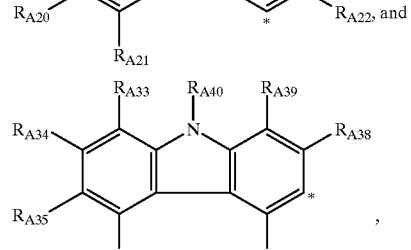

where A# corresponds to a three digit symbol in the subscript of $R_{A\#}$ in which $R_{A01} \leq R_{A\#} \leq R_{A40}$, $1 \leq \# \leq 40$ but for $1 \leq \# \leq 9$, # is preceded by the digit 0;

(2.1.2.1) $R_{A\#}$ are independently selected from the group consisting of: H, a linear or branched alkyl group with up to 25 carbons, $NR_{A\#1}R_{A\#2}$, $OR_{A\#3}$, and phenyl; where (2.1.2.1.1) $R_{A\#1}R_{A\#2}$ and $R_{A\#3}$ are independently selected from the group consisting of: H, a linear or branched alkyl group with up to 25 carbons, phenyl, an aryl group and a carbazole group; wherein (2.1.2.1.1.1) the aryl group or the carbazole group have aromatic ring frameworks of up to 20 carbons (excluding substituents) selected from the group consisting of:

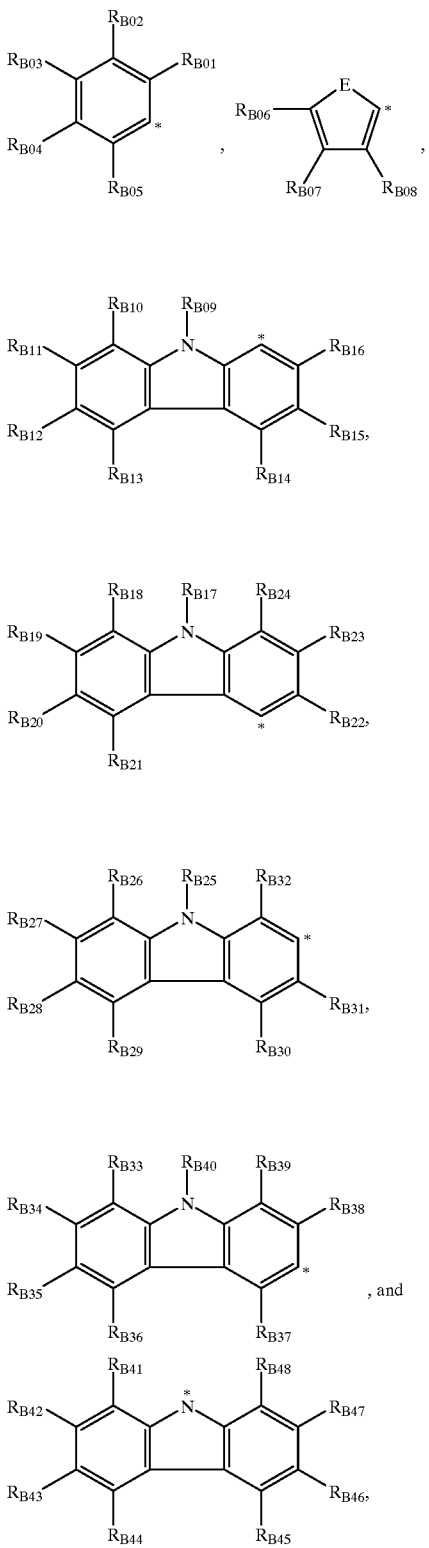

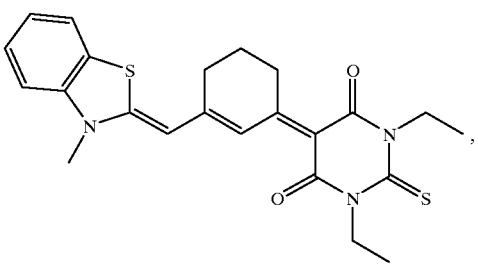

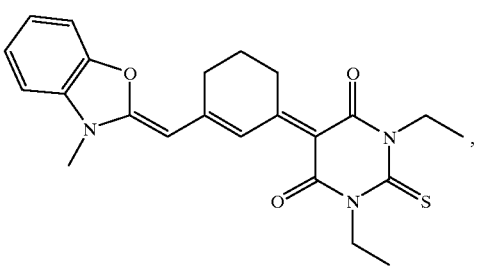

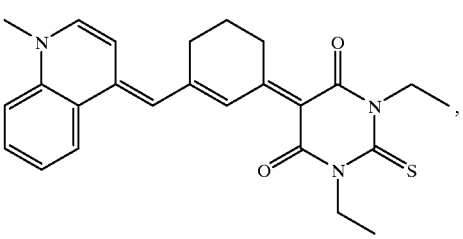

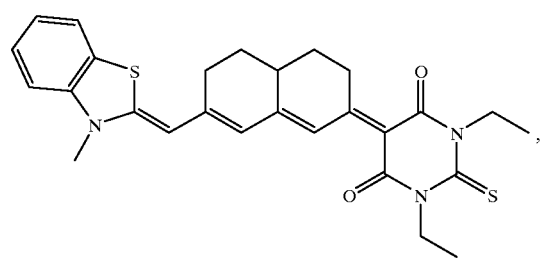

where (2.1.2.1.1.1.1) E is selected from the group consisting of S and O and B# corresponds to a three digit symbol in the subscript in $R_{B\#}$, $1 \leq \# \leq 49$ but for $1 \leq \# \leq 9$, # is preceded by the digit 0;

(2.1.2.1.1.1.2) $R_{B\#}$ are independently selected from the group consisting of: H, a linear or branched alkyl group with up to 25 carbons, and phenyl; and (3) $R_e$, $R_f$ and $R_g$ are independently selected from the group consisting of: H; a linear or branched alkyl group with up to 25 carbons; $-(CH_2CH_2O)_x(CH)_yOR_{a1}$, $-(CH_2CH_2O)_x(CH)_yNR_{a2}R_{a3}$, $-(CH_2CH_2O)_x(CH)_yCONR_{a2}R_{a3}$, where (3.1) $R_{a1}$, $R_{a2}$, and $R_{a3}$ are independently selected from the group consisting of: H, a linear or branched alkyl group with up to 25 carbons, and a carbazole attached to the nitrogen of $-(CH_2CH_2O)_x(CH)_y NR_{a2}R_{a3}$ and $-(CH_2CH_2O)_x(CH)_yCONR_{a2}R_{a3}$, $-(CH_2CH_2O)_x(CH)_yCN$, $-(CH_2CH_2O)_x(CH)_yCl$, $-(CH_2CH_2O)_x(CH)_yBr$, $-(CH_2CH_2O)_x(CH)_yI$, $-(CH_2CH_2O)_x(CH)_y$Phenyl, and $-(CH_2CH_2O)_x(CH)_y$Benzyl, where $0 < x < 10$ and $0 < y < 25$.

5. A method according to claim 3 wherein the molecule is selected from the group consisting of:

61
-continued
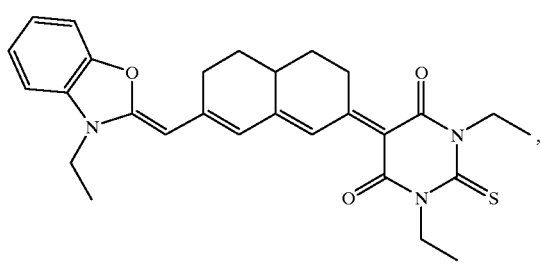
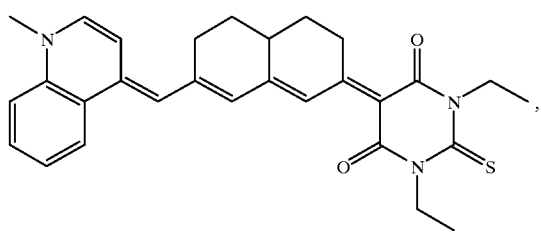
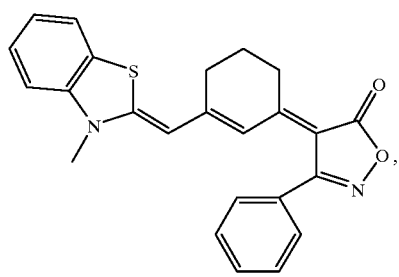
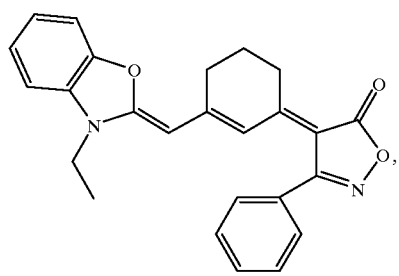
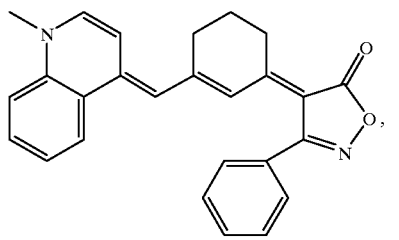
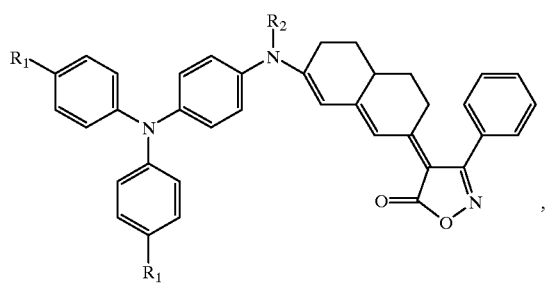
R₁ = H, R₂ = CH₃,
R₁ = C₄H₉, R₂ = CH₃,
R₁ = H, R₂ = C₆H₁₃,
62
-continued
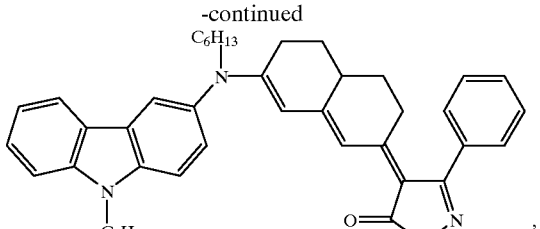
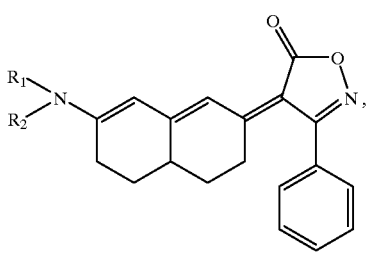
R₁ = Me, R₂ = phenyl
R₁ = R₂ = Hexyl
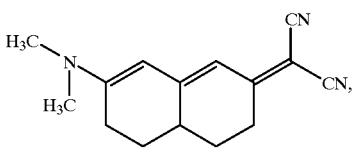
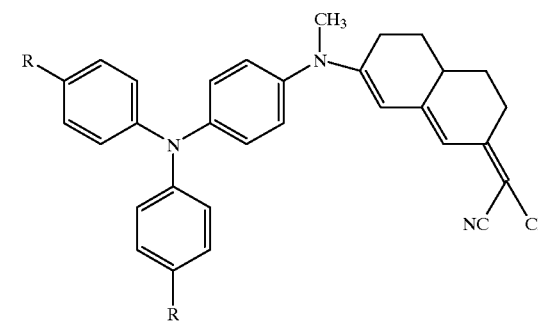
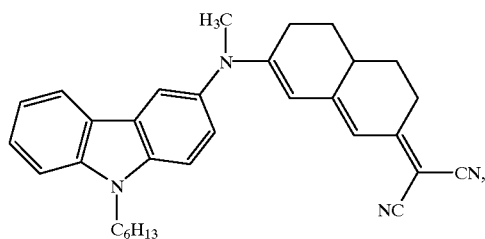
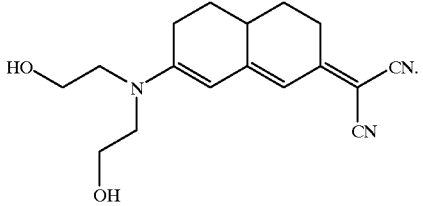
* * * * *